United States Patent
Takeshima et al.

(10) Patent No.: US 9,290,691 B2
(45) Date of Patent: Mar. 22, 2016

(54) ORGANIC EL MATERIAL-CONTAINING SOLUTION, METHOD FOR FORMING ORGANIC EL THIN FILM, ORGANIC EL DEVICE COMPRISING ORGANIC EL THIN FILM, AND METHOD FOR MANUFACTURING ORGANIC EL DISPLAY PANEL

(75) Inventors: Motohiro Takeshima, Sodegaura (JP); Tetsuya Inoue, Sodegaura (JP); Makoto Ando, Tokyo (JP)

(73) Assignees: IDEMITSU KOSAN CO., LTD., Tokyo (JP); SONY CORPORATION, Tokyo (JP)

( * ) Notice: Subject to any disclaimer, the term of this patent is extended or adjusted under 35 U.S.C. 154(b) by 1363 days.

(21) Appl. No.: 12/529,077

(22) PCT Filed: Feb. 27, 2008

(86) PCT No.: PCT/JP2008/053436
§ 371 (c)(1),
(2), (4) Date: Sep. 16, 2009

(87) PCT Pub. No.: WO2008/105472
PCT Pub. Date: Sep. 4, 2008

(65) Prior Publication Data
US 2010/0117028 A1 May 13, 2010

(30) Foreign Application Priority Data
Feb. 28, 2007 (JP) ................. 2007-050859

(51) Int. Cl.
| | | |
|---|---|---|
| C09K 11/06 | (2006.01) | |
| C09B 1/00 | (2006.01) | |
| H01L 51/00 | (2006.01) | |
| H05B 33/14 | (2006.01) | |
| C09B 6/00 | (2006.01) | |
| C09B 23/01 | (2006.01) | |
| C09B 23/14 | (2006.01) | |
| C09B 57/00 | (2006.01) | |
| C09B 3/78 | (2006.01) | |
| H01L 51/50 | (2006.01) | |

(52) U.S. Cl.
CPC . *C09K 11/06* (2013.01); *C09B 1/00* (2013.01); *C09B 3/78* (2013.01); *C09B 6/00* (2013.01); *C09B 23/0066* (2013.01); *C09B 23/148* (2013.01); *C09B 57/001* (2013.01); *C09B 57/008* (2013.01); *H01L 51/0007* (2013.01); *H05B 33/14* (2013.01); *C09K 2211/1011* (2013.01); *H01L 51/004* (2013.01); *H01L 51/006* (2013.01); *H01L 51/0043* (2013.01); *H01L 51/0052* (2013.01); *H01L 51/0054* (2013.01); *H01L 51/0058* (2013.01); *H01L 51/0059* (2013.01); *H01L 51/5012* (2013.01)

(58) Field of Classification Search
CPC ........... C09K 11/06; C09K 2211/1011; C09K 2211/1007; C09B 1/00; C09B 1/002; C09B 1/005; C09B 1/007; C09B 1/02; C09B 1/16; C09B 1/50; C09B 1/56
See application file for complete search history.

(56) References Cited

U.S. PATENT DOCUMENTS

| | | | |
|---|---|---|---|
| 7,049,011 B2 * | 5/2006 | Ebisawa et al. | 428/690 |
| 2002/0096995 A1 | 7/2002 | Mishima et al. | |
| 2005/0089715 A1 | 4/2005 | Cosimbescu et al. | |
| 2006/0055305 A1 | 3/2006 | Funahashi et al. | |
| 2008/0001123 A1 * | 1/2008 | Inoue et al. | 252/301.16 |
| 2008/0124570 A1 * | 5/2008 | Kondo et al. | 428/690 |

FOREIGN PATENT DOCUMENTS

| | | |
|---|---|---|
| EP | 1 148 109 A2 | 10/2001 |
| EP | 1 553 154 A1 | 7/2005 |
| EP | 1 690 912 A1 | 8/2006 |
| JP | 10012377 A | 1/1998 |
| JP | 2002158091 A | 5/2002 |
| JP | 2002313561 A | 10/2002 |
| JP | 2003229256 A | 8/2003 |
| JP | 2003338377 A | 11/2003 |
| JP | 2004119351 A | 4/2004 |
| JP | 2004171828 A | 6/2004 |
| JP | 2005216757 A | 8/2005 |
| JP | 2006-176699 A | 7/2006 |
| JP | 2006190759 A | 7/2006 |
| WO | WO-2004018587 A1 | 3/2004 |
| WO | WO-2005042667 A1 | 5/2005 |
| WO | WO-2005059267 A1 | 6/2005 |
| WO | WO-2006/070712 A1 | 7/2006 |
| WO | WO 2006/073072 * | 7/2006 |

OTHER PUBLICATIONS

EP Communication in EP Appln No. 08712058.0 dated Jul. 8, 2010.
First Notification of Examiner's Opinion for Taiwanese Patent Application No. 097106859 dated Oct. 24, 2013 with English translation.

* cited by examiner

*Primary Examiner* — Matthew E Hoban
(74) *Attorney, Agent, or Firm* — Foley & Lardner LLP

(57) ABSTRACT

An organic luminescent material-containing solution contains an organic electroluminescent material and a solvent. The organic electroluminescent material at least contains a host and a dopant. The host is an anthracene derivative and is dissolved in the solvent with a content of 0.5 mass percent or more. The solvent is preferably a cyclic ketone. The solvent preferably contains a cyclohexanone derivative as the cyclic ketone.

12 Claims, No Drawings

ORGANIC EL MATERIAL-CONTAINING SOLUTION, METHOD FOR FORMING ORGANIC EL THIN FILM, ORGANIC EL DEVICE COMPRISING ORGANIC EL THIN FILM, AND METHOD FOR MANUFACTURING ORGANIC EL DISPLAY PANEL

CROSS REFERENCE TO RELATED APPLICATION

This is a U.S. national phase application under 35 U.S.C. §371 of International Patent Application No. PCT/JP2008/053436, filed Feb. 27, 2008 and claims the benefit of Japanese Application No. 2007-050859, filed Feb. 28, 2007. The International Application was published on Sep. 4, 2008 as International Publication No. WO/2008/105472 under PCT Article 21(2) the contents of these applications are incorporated herein in their entirety.

TECHNICAL FIELD

The prevent invention relates to an organic electroluminescent material-containing solution, a method of forming an organic electroluminescence thin film, an organic electroluminescence device including an organic electroluminescence thin film, and a method for manufacturing an organic electroluminescence display panel. More specifically, the present invention relates to an organic electroluminescent material-containing solution which is used in forming an organic thin film for use in the organic electroluminescence device by coating method, a method of forming an organic electroluminescence thin film with use of the solution, and a method of manufacturing an organic electroluminescence display panel.

BACKGROUND ART

A low-molecular organic electroluminescent material has been known as a material for forming such a known organic electroluminescence device.

Known examples of the low-molecular organic electroluminescent material are light emitting materials such as a chelate complex (e.g. a tris(8-quinolinol)aluminum complex), a coumarin complex, a tetraphenyl butadiene derivative, a bisstyrylarylene derivative and an oxadiazole derivative, all of which are reported to emit light of blue to red in visible region. Thus, such a material is expected to be applied to a color display device.

Vacuum deposition is employed for forming thin films using the low-molecular electroluminescence organic material, where the low-molecular electroluminescence organic material is sublimated with good thermal stability to vapor-deposit the thin films on a substrate, thereby providing a high-performance organic electroluminescence device (for instance, Patent Document 1 and the like).

However, the deposition method requires high-vacuum facilities and complicated manufacturing processes. In addition, it has been difficult to partition the film(s) into each color section of red, green and blue by using the deposition method. Another problem of the deposition method is that a material-use efficiency is low.

As another method of forming an organic electroluminescent material into films, a coating method has been known.

According to the coating method, which is generally used for forming films from a polymer organic electroluminescent material, an organic electroluminescent material dissolved in a solvent is used for forming thin films of the organic electroluminescent material (for instance, Patent Document 2 and the like). Exemplary advantages of the coating method are that thin films can be favorably formed from the organic electroluminescent material in a simplified manner with low cost, and that partition of the film(s) into color sections can be performed in a facilitated manner.

However, synthetic pathway of the polymer organic electroluminescent material is complex, and high purification of the polymer organic electroluminescent material is difficult. Moreover, properties such as luminous efficiency, lifetime, chromatic purity of the polymer organic electroluminescent material are inferior to those of the low-molecular organic electroluminescent material. Particularly, a blue-emitting polymer organic electroluminescent material having a high luminous efficiency, a long lifetime and a high chromatic purity has not been known in a practical application.

In view of the above, it has been proposed to form films of the low-molecular organic electroluminescent material by coating method.

However, a coating composition with the low-molecular organic electroluminescent material dissolved therein has been problematic in terms of its solubility, viscosity and the like.

In forming thin films of the organic electroluminescent material by coating method, the organic electroluminescent material needs to be dissolved in a solvent.

When the polymer organic electroluminescent material is employed, a coating composition with the polymer organic electroluminescent material dissolved in a solvent such as toluene, xylene or tetralin is typically known (for instance, Patent Documents 3, 4, 5 and the like).

However, a low-molecular organic electroluminescent material, which is an insoluble material, is not favorably dissolved in such a solvent as described above in forming films from the low-molecular organic electroluminescent material.

While the coating method is only applicable to materials whose solubility is more than a predetermined value (e.g. 0.5 mass % or more), the low-molecular organic electroluminescent material generally exhibits solubility of 0.1 mass % to 0.2 mass %. Accordingly, such a low solubility of the low-molecular material has prevented the low-molecular organic electroluminescent material from being formed into a film by coating method.

Although the coating method has been recently found applicable to forming films of the low-molecular materials (for instance, Patent Document 6 and the like), the solubility of the low-molecular material according to Patent Document 6 is still insufficient. Moreover, in the invention disclosed in Patent Document 6, an organic electroluminescent material to be used is limited to a predetermined compound that is soluble in a solvent such as toluene. Accordingly, an insoluble compound serving as a high-performance organic electroluminescent material cannot be used. Consequently, when an organic electroluminescence device is actually manufactured by using the coating composition disclosed in Patent Document 6, the obtained organic electroluminescence device does not exhibit sufficient performance (luminous efficiency, lifetime, chromatic purity and the like).

Patent Document 1: WO2004/018587
Patent Document 2: JP-A-2003-229256
Patent Document 3: WO2005/059267
Patent Document 4: JP-A-2002-313561
Patent Document 5: JP-A-2004-119351
Patent Document 6: JP-A-2006-190759

DISCLOSURE OF THE INVENTION

Problems to Be Solved by the Invention

The above-described problems have prevented application of coating method (i.e., a method capable of forming films in a simplified manner at low cost) to a low-molecular organic electroluminescent material (i.e., a material that is favorably excellent in luminous efficiency, lifetime and chromatic purity), thereby extremely hampering a full-scale practical realization of an organic electroluminescent display.

An object of the present invention is to solve the above problem(s) and to provide an organic electroluminescent material-containing solution applicable to forming film(s) of a high-performance organic electroluminescent material by coating method. Another object of the present invention is to provide a method of forming an organic electroluminescent thin film with use of the organic electroluminescent material-containing solution, an organic electroluminescence device including the organic electroluminescent thin film, and a method of manufacturing an organic electroluminescent display panel.

Means for Solving the Problems

An organic electroluminescent material-containing solution includes an organic electroluminescent material; and a solvent, in which the organic electroluminescent material at least includes a host and a dopant, the host is an anthracene derivative having a molecular weight of 4000 or less, and the solvent is a cyclic ketone compound represented by a formula (1) as follows, the host of 0.5 mass % or more being soluble in the solvent.

[Chemical Formula 1]

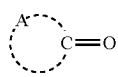

(1)

In the formula (1), A represents a substituted or unsubstituted cyclic hydrocarbon group having 5 to 10 members or a substituted or unsubstituted group for forming a heterocycle having 5 to 10 members.

According to the organic electroluminescent material-containing solution of the above aspect of the invention, the organic electroluminescent thin film(s) can be formed with various organic electroluminescent materials by coating method, i.e., a method applicable to forming thin film(s) in a simplified manner at low cost.

The host and the dopant will be described below.

An organic electroluminescence device is provided by laminating functional layers such as a hole injecting layer, a hole transporting layer, an emitting layer, an electron transporting layer and an electron injecting layer. The emitting layer contains the host and the dopant, where an energy transmission or the like is generated from the host to the dopant and light is emitted by the dopant.

The dopant is added (doped) to the host with, for instance, a content of the dopant in host being 0.01 to 20 mass %. Since the host occupies a major portion (e.g. 80% or more) of the emitting layer of 30 nm to 100 nm thickness, the host is required to be dissolved in the organic electroluminescent material-containing solution by a predetermined amount in order to form a film as the emitting layer by coating method.

Since the major portion of the emitting layer, which contains the host and the dopant, is occupied by the host, low solubility of the host prevent formation of the emitting layer of a predetermined film-thickness.

According to the aspect of the invention, the emitting layer of a sufficient film-thickness can be formed by coating method because the host, which occupies the major portion of the film as the emitting layer, exhibits solubility of 0.5 mass % or more.

The anthracene derivative used as the host exhibits a high performance as the organic electroluminescent material. Accordingly, the organic electroluminescent thin film(s) formed by coating method using the organic electroluminescent material-containing solution according to the aspect of the invention is excellent in performance such as luminous efficiency, lifetime and chromatic purity.

According to the aspect of the invention, the solvent is preferably a cyclic ketone compound.

In the formula (1), A preferably represents a cyclic hydrocarbon group having 5 to 10 members or a group for forming a nitrogen-containing heterocycle having 5 to 10 members.

In the formula (1), A preferably represents a cyclic hydrocarbon group having 5 to 10 members, more preferably an unsaturated cyclic hydrocarbon group having 5 to 10 members.

Examples of the cyclic ketones include cyclic alkyl ketones such as a cyclohexanone derivative, a cyclopentanone derivative, cycloheptanone derivative and cyclooctanone derivative. As the cyclic ketones, one of the above examples may be singularly used, or a mixture of plurality thereof may be used.

Particularly, the solvent preferably contains the cyclohexanone derivative as the cyclic ketones. Preferable examples of the cyclohexanone derivative include: cyclohexanone, methyl cyclohexanone, dimethyl cyclohexanone, trimethyl cyclohexanone, ethyl cyclohexanone, n-propyl cyclohexanone, isopropyl cyclohexanone, n-butyl cyclohexanone, isobutyl cyclohexanone, cyclohexyl cyclohexanone, 2-acetyl cyclohexanone, 2-methyl cyclohexanone, 3-methyl cyclohexanone, 4-methyl cyclohexanone, 2-cyclohexyl cyclohexanone, 2-(1-cyclohexenyl)cyclohexanone, 2,5-dimethyl cyclohexanone, 3,4-dimethyl cyclohexanone, 3,5-dimethyl cyclohexanone, 4-ethyl cyclohexanone, pulegone, menthone, 4-pentyl cyclohexanone, 2-propyl cyclohexanone, 3,3,5-trimethyl cyclohexanone, and thujone. Cyclohexanone is preferable among these.

Examples of the cyclopentanone derivative include cyclopentanone, methyl cyclopentanone, dimethyl cyclopentanone, trimethyl cyclopentanone, ethyl cyclopentanone, n-propyl cyclopentanone, isopropyl cyclopentanone, n-butyl cyclopentanone, isobutyl cyclopentanone, and cyclohexyl cyclopentanone. Cyclopentanone is preferable among these.

Examples of the cycloheptanone derivative include: cycloheptanone, methyl cycloheptanone, dimethyl cycloheptanone, trimethyl cycloheptanone, ethyl cycloheptanone, n-propyl cycloheptanone, isopropyl cycloheptanone, n-butyl cycloheptanone, isobutyl cycloheptanone, and cyclohexyl cycloheptanone. Cycloheptanone is preferable among these.

Further, it is also preferable that as the cyclic ketones, A in the formula (1) contains nitrogen-containing ring.

Examples of such cyclic ketones include caprolactam, N-methyl caprolactam, 1,3-dimethyl-2-imidazolidine, 2-pyrrolidone, 1-acetyl-2-pyrrolidone, 1-butyl-2-pyrrolidone, 2-piperidone, and 1,5-dimethyl-2-piperidone.

In the aspect of the invention, the cyclic ketone compound is preferably selected from the group consisting of cyclohexanone, cyclopentanone, cycloheptanone, N-methyl pyrrolidone and respective derivatives thereof.

As a result of various studies, inventors have found out that low-molecular organic electroluminescent materials are soluble in derivatives of cyclic ketone compounds at a higher concentration than other solvents, further that compounds soluble in the derivatives of cyclic ketone compounds are not limited to a narrow range, and therefore that an organic electroluminescent material-containing solution can be prepared with use of various low-molecular organic electroluminescent materials.

The inventors have found out that the organic electroluminescent material-containing solution containing a sufficient amount of a low-molecular organic electroluminescent material exhibiting high-performance, which could not been used due to low solubility in typical solvents, can be prepared by using the cyclic ketone derivatives as a solvent, and thus, the inventors have achieved the present invention.

By using the cyclic ketone derivatives as the solvent, an anthracene derivative exhibiting high performance as an organic electroluminescent material can be dissolved therein at a high concentration that is enough to form a thin film by coating method, thereby providing an organic electroluminescent material-containing solution for forming a film with an organic electroluminescent material exhibiting high performance by coating method.

Moreover, the cyclic ketone derivatives are suitable to a coating process such as an ink-jet method because the cyclic ketone derivatives have a high boiling point (156 degrees C.: cyclohexanone) and a high viscosity (2cP: cyclohexanone). Since the cyclic ketone derivatives are favorably blended in an alcohol solvent as viscosity control reagent, particularly in diol solvent, a solution obtained by viscosity control can be of high viscosity, which is another advantage as a solvent for a low-molecular organic electroluminescent material whose viscosity is not changed only by being dissolved.

According to the aspect of the invention, the host is preferably represented by a formula (2) as follows.

[Chemical Formula 2]

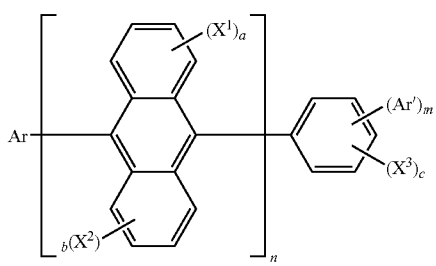

(2)

In the formula (2), Ar is a substituted or unsubstituted fused aromatic group having 10 to 50 carbon atoms forming the aromatic ring;

Ar' represents a substituted or unsubstituted aromatic group having 6 to 50 carbon atoms forming the aromatic ring;

$X^1$ to $X^3$ each represent a substituted or unsubstituted aromatic group having 6 to 50 carbon atoms forming the aromatic ring, a substituted or unsubstituted aromatic heterocyclic group having 5 to 50 carbon atoms forming the aromatic ring, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 carbon atoms, a substituted or unsubstituted arylthio group having 5 to 50 carbon atoms, a substituted or unsubstituted alkoxycarbonyl group having 1 to 50 carbon atoms, a carboxyl group, a halogen group, a cyano group, a nitro group or a hydroxyl group;

a, b and c are each an integer of 0 to 4, a plurality of $X^1$ being allowed to be mutually the same or different when a is 2 or more, a plurality of $X^2$ being allowed to be mutually the same or different when b is 2 or more, and a plurality of $X^3$ being allowed to be mutually the same or different when c is 2 or more; n is an integer of 1 to 3; and m is an integer of 0 and 1; and a plurality of such structures shown in the brackets 11 as represented by a formula (3) below being mutually the same or different when n is 2 or more.

[Chemical Formula 3]

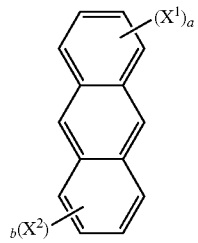

(3)

As described above, a compound having an asymmetry specific structure represented by the above formula (2) is used as the host. A compound having such a structure has a high emitting performance and a favorably long lifetime.

Consequently, an emitting device obtained from the organic electroluminescent material-containing solution according to the aspect of the invention is enhanced in luminous efficiency and lifetime.

Among the anthracene compounds represented by the above formula (2), the anthracene compound represented by the formula (2) in which n is 1. Further, anthracene compounds represented by the following formulae are more preferable.

[Chemical Formula 4]

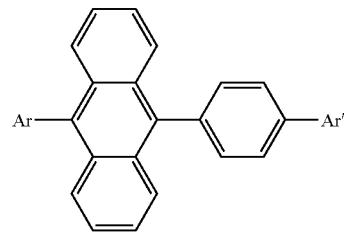

(2a)

[Chemical Formula 5]

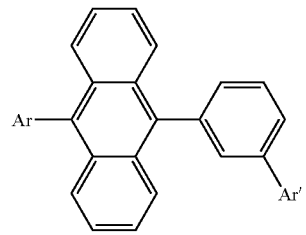

(2b)

-continued

[Chemical Formula 6]

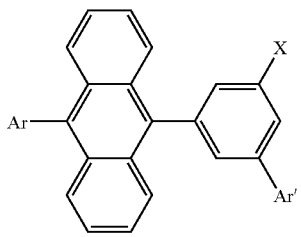
(2c)

In the above formulae, Ar, Ar' and X are the same as described above.

According to the aspect of the invention, the anthracene derivative is an asymmetric monoanthracene derivative represented by a formula (4) as follows.

[Chemical Formula 7]

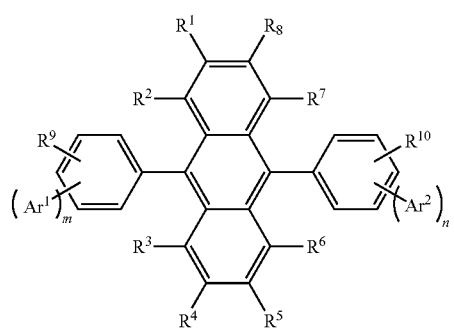
(4)

In the formula (4), $Ar^1$ and $Ar^2$ each independently represent a substituted or unsubstituted aromatic ring group having 6 to 50 carbon atoms forming the aromatic ring; m and n are each an integer of 1 to 4, $Ar^1$ and $Ar^2$ being mutually different when: m and n are both equal to 1; and positions at which $Ar^1$ and $Ar^2$ are respectively bonded to benzene rings are symmetric, m and n being mutually different when m or n is an integer of 2 to 4;

$R^1$ to $R^2$ each independently represent hydrogen atom, a substituted or unsubstituted aromatic group having 6 to 50 carbon atoms forming the aromatic ring, a substituted or unsubstituted aromatic heterocyclic group having 5 to 50 carbon atoms forming the aromatic ring, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 atoms forming the ring, a substituted or unsubstituted arylthio group having 5 to 50 atoms forming the ring, a substituted or unsubstituted alkoxycarbonyl group having 1 to 50 carbon atoms, a substituted or unsubstituted silyl group, a carboxyl group, a halogen group, a cyano group, a nitro group or a hydroxyl group.

Among the asymmetric anthracene derivatives, anthracene derivatives represented by a formula below is preferable.

[Chemical Formula 8]

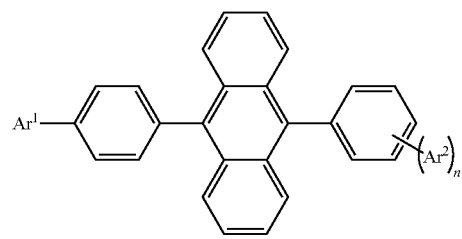
(4a)

[Chemical Formula 9]

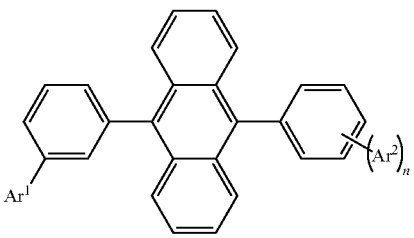
(4b)

[Chemical Formula 10]

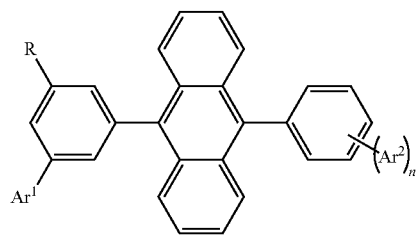
(4c)

In the above formulae, $Ar^1$, $Ar^2$ and n are the same as above and R represents a substituted or unsubstituted aromatic ring group having 5 to 50 carbon atoms forming the ring, a substituted or unsubstituted aromatic heterocyclic group having 5 to 50 carbon atoms forming the aromatic ring, a substituted or unsubstituted alkyl group having 1 to 50 carbon atoms, or a substituted or unsubstituted cycloalkyl group.

According to the aspect of the invention, a naphthacene derivative represented by a formula (5) as follows is used as the host in place of the anthracene derivative.

[Chemical Formula 11]

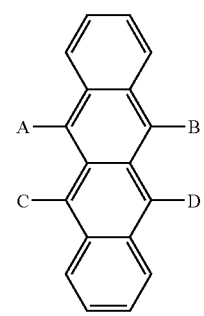
(5)

In the formula (5), A, B, C and D each represent a substituted or unsubstituted aromatic group having 6 to 20 carbon atoms or a substituted or unsubstituted fused aromatic group having 10 to 20 carbon atoms, A, B, C and D being allowed to be mutually the same or different.)

According to the aspect of the invention, at least one of A, B, C and D preferably has a structure represented by a formula (6) as follows.

[Chemical Formula 12]

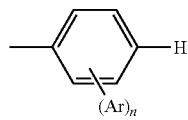

(6)

In the formula (6), Ar represents a substituted or unsubstituted aromatic group having 6 to 20 carbon atoms or a substituted or unsubstituted fused aromatic group having 10 to 20 carbon atoms; and n is an integer of 0 to 4.

According to such a structure as above, the host exhibits solvent solubility of a predetermined degree or more.

For instance, when an aromatic group as a substituent is bonded to a naphthacene skeleton in para position, the solubility is lowered. An exemplary compound below exhibits extremely low solubility of 0.1 mass % or less.

[Chemical Formula 13]

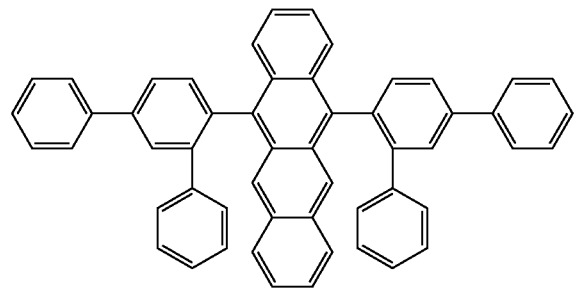

(5a)

According to the aspect of the invention, by employing the structure represented by the above formula (6) for the substituent of the naphthacene skeleton, the host can exhibit solvent solubility of a predetermined degree or more. With this arrangement, a compound that exhibits high performance as the organic electroluminescent material and high solubility can be selected, thereby providing an organic electroluminescent material-containing solution preferably applicable to coating method.

When n is 0, the formula (6) represents an unsubstituted phenyl group. While it is important that the compound represented by the formula (6) does not contain two substituents in para positions, n may be 0. It is preferable that n in the formula (6) is an integer of 0 to 2.

According to the aspect of the invention, the dopant is preferably a styrylamine derivative represented by a formula (7) as follows.

[Chemical Formula 14]

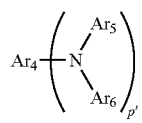

(7)

In the formula (7), at least one of $Ar_4$ to $Ar_6$ has a substituted or unsubstituted styryl group. Preferably, $Ar_4$ is selected from a group consisting of a phenyl group, a biphenyl group, a terphenyl group, a stilbene group and a distyryl-aryl group while $Ar_5$ and $Ar_6$ are either one of hydrogen and an aromatic group having 6 to 20 carbon atoms. P' represents an integer of 1 to 4.

The aromatic group having 6 to 20 carbon atoms is preferably a phenyl group, a naphthyl group, an anthracenyl group, a phenanthryl group, a terphenyl group and the like.

According to the aspect of the invention, it is preferable that a substituted derivative of arylamine represented by a formula (8) as follows is used as the dopant in place of the styrylamine derivative represented by the formula (7).

[Chemical Formula 15]

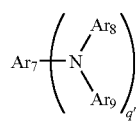

(8)

In the formula (8), $Ar_7$ to $Ar_9$ each represent a substituted or unsubstituted aryl group having 5 to 40 carbon atoms forming the aromatic ring; and q' is an integer of 1 to 4.

In the formula above, the aryl group having 5 to 40 atoms forming the ring is preferably phenyl, naphthyl, anthracenyl, phenanthryl, pyrenyl, chrysenyl, coronyl, biphenyl, terphenyl, pyrrolyl, furanyl, thiophenyl, benzothiophenyl, oxadiazolyl, diphenyl anthracenyl, indolyl, carbazolyl, pyridyl, benzoquinolyl, fluorenyl, fluoranthenyl, acenaphthofluoranthenyl, stilbene, a group represented by a formula (A) or (B) below or the like.

In the formula (A) below, r is an integer of 1 to 3.

[Chemical Formula 16]

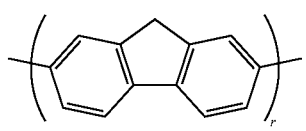

(A)

[Chemical Formula 17]

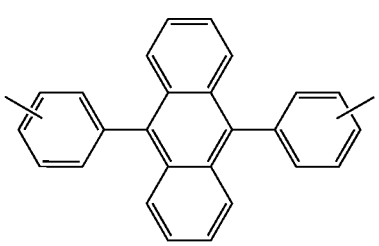

(B)

The aryl group having 5 to 40 atoms forming the ring may be further substituted by a substituent. Preferable examples of the substituent are alkyl groups having 1 to 6 carbon atoms (e.g., an ethyl group, a methyl group, an isopropyl group, an n-propyl group, an s-butyl group, a t-butyl group, a pentyl group, a hexyl group, a cyclopentyl group and a cyclohexyl group).

According to the aspect of the invention, the dopant is preferably an indenoperylene derivative represented by a formula (9) as follows.

[Chemical Formula 18]

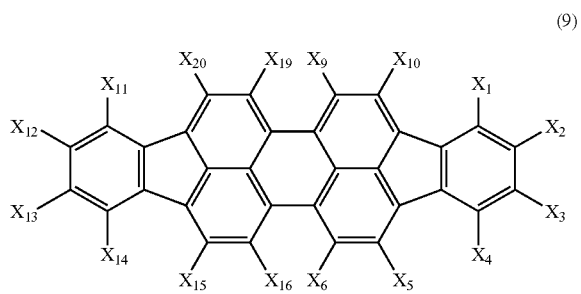

(9)

In the formula (9), $X_1$ to $X_6$, $X_9$, $X_{10}$, $X_{11}$ to $X_{16}$, $X_{19}$ and $X_{20}$ each independently represent hydrogen, halogen, an alkyl group, an alkoxy group, an alkylthio group, an alkenyl group, an alkenyloxy group, an alkenylthio group, an aromatic ring-containing alkyl group, an aromatic ring-containing alkyloxy group, an aromatic ring-containing alkylthio group, an aromatic ring group, an aromatic heterocyclic group, an aromatic-ring oxy group, an aromatic-ring thio group, an aromatic-ring alkenyl group, an alkenyl aromatic ring group, an amino group, a carbazolyl group, a cyano group, a hydroxyl group, —COOR$^{1'}$ (R$^{1'}$ represents hydrogen, an alkyl group, an alkenyl group, an aromatic ring-containing alkyl group or an aromatic ring group), —COR$^{2'}$ (R$^{2'}$ represents hydrogen, an alkyl group, an alkenyl group, an aromatic ring-containing alkyl group, an aromatic ring group or an amino group), or —OCOR$^{3'}$ (R$^{3'}$ represents an alkyl group, an alkenyl group, an aromatic ring-containing alkyl group or an aromatic ring group); an adjacent set of $X_1$ to $X_6$, $X_9$, $X_{10}$, $X_{11}$ to $X_{16}$, $X_{19}$ and $X_{20}$ is allowed to be mutually bonded to form a cyclic structure or is allowed to form a cyclic structure together with substituting carbon atoms; and at least one of $X_1$ to $X_6$, $X_9$, $X_{10}$, $X_{11}$ to $X_{16}$, $X_{19}$ and $X_{20}$ is not hydrogen.

According to the aspect of the invention, the indenoperylene derivative is preferably represented by a formula (10) as follows.

[Chemical Formula 19]

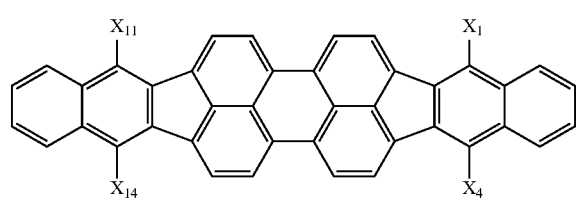

(10)

In the formula (10), $X_1$, $X_4$, $X_{11}$, $X_{14}$ each represent an aromatic ring group.

The aromatic ring group is preferably a phenyl group, an ortho biphenyl group, a meta biphenyl group or a naphthyl group, more preferably a phenyl group or an ortho biphenyl group.

According to the aspect of the invention, the organic electroluminescent material-containing solution preferably contains a viscosity control reagent.

The viscosity of the organic electroluminescent material-containing solution can be controlled by blending the viscosity control reagent, thereby more reliably providing a solution having viscosity suitable for forming a film by coating method.

Control of the viscosity means not only enhancing the viscosity but also lowering viscosity.

A method of forming organic electroluminescent thin film(s) according to another aspect of the invention includes forming film(s) of the organic electroluminescent material using the above-described organic electroluminescent material-containing solution.

The method of forming organic electroluminescent thin film(s) according to another aspect of the invention preferably includes ejecting the organic electroluminescent material-containing solution by inkjet method; and forming film(s) of the organic electroluminescent material by volatilizing the solvent from the ejected organic electroluminescent material-containing solution.

According to such an arrangement, a low-molecular organic electroluminescent material highly excellent in luminous efficiency, lifetime, chromatic purity and the like can be formed into films by coating method, i.e., a method applicable to forming a film in a simplified manner with low cost.

An organic electroluminescence device according to the aspect of the invention includes organic electroluminescent thin film(s) formed by the above-described method.

A method of manufacturing an organic electroluminescence display panel according to still another aspect of the invention, which is provided with a first pixel emitting light of a first color and a second pixel emitting light of a second color, includes preparing the organic electroluminescent material-containing solution for use as a first solution containing the anthracene derivative for forming an emitting layer of the first pixel; and preparing the organic electroluminescent material-containing solution for use as a second solution containing the naphthacene derivative for forming an emitting layer of the second pixel, in which a solvent of the first solution and a solvent of the second solution are the same.

With this arrangement, a solvent in which both the anthracene derivative and the naphthacene derivative are soluble is used in order to separately coat the pixel of the first emitting color and the pixel of the second emitting color, so that the common solvent is usable. Accordingly, manufacture of, for instance, a full-color display can be simplified.

When different solvents are used, it takes time and labor to prepare a plurality of solutions using different solvents and film-forming processes require to be separately managed and controlled due to different features of the solutions such as viscosity, a boiling point and the like. For instance, adjusting of a film thickness and evaporation time of the solvents become different.

In view of this point, the aspect of the invention provides an advantage that a full-color display can be manufactured in a simplified manner by using a common solvent.

As the method of forming organic electroluminescent thin films through coating processes, not only the above-described inkjet method but also coating method such as spin coating, casting, micro-gravure coating, gravure coating, bar coating, roll coating, wire-bar coating, dip-coating, spray coating, screen printing, flexo printing and offset printing may be used. Such a printing method as screen printing, flexo printing, offset printing and ink-jet printing is preferable in that it is easy to perform pattern forming and multi-color coating.

BEST MODE FOR CARRYING OUT THE INVENTION

Exemplary embodiments according to an aspect of the invention will be described below.

An organic electroluminescent material-containing solution of the above aspect of the invention is prepared by dissolving an organic electroluminescent material in a solvent.

The organic electroluminescent material-containing solution contains a host and a dopant.

The host is preferably an anthracene derivative having a molecular weight of 4000 or less represented by the above formula (2), and is specifically exemplified by the following anthracene derivatives of AN1 to AN60 listed in WO2004-18587.

[Chemical Formula 20]

AN1
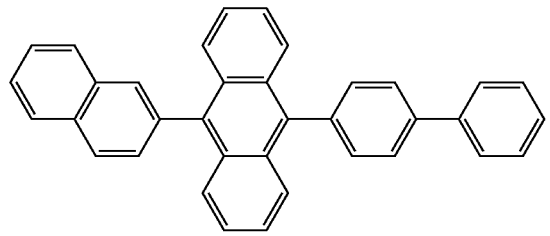

AN2
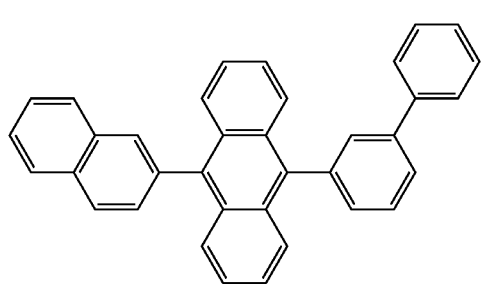

AN3
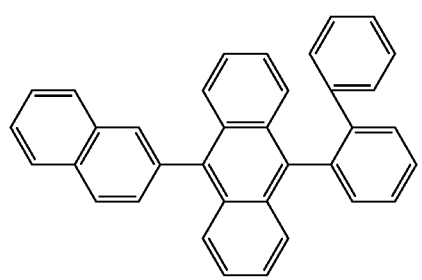

AN4
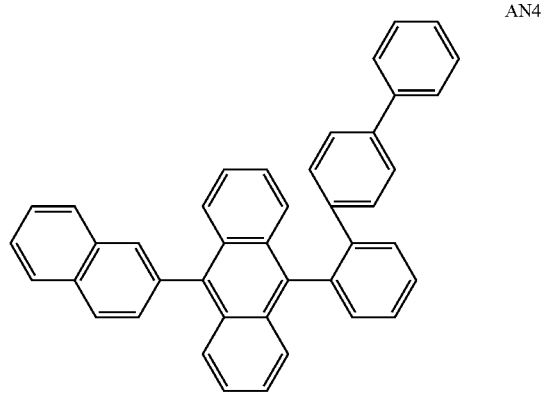

AN5
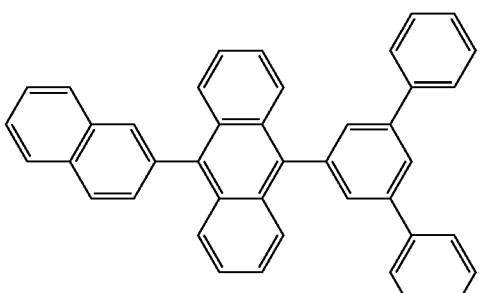

AN6
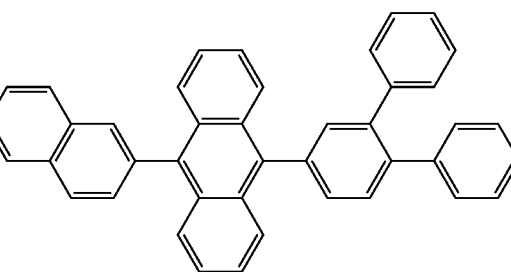

AN7
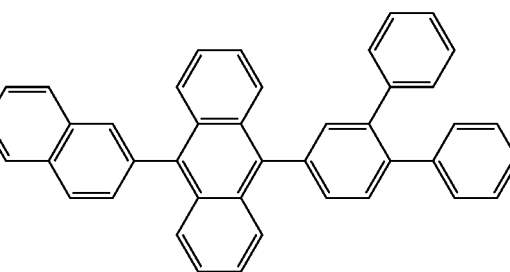

AN8
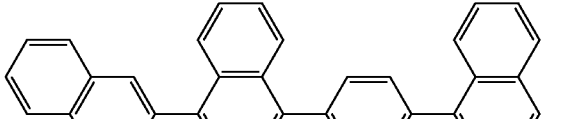

AN9
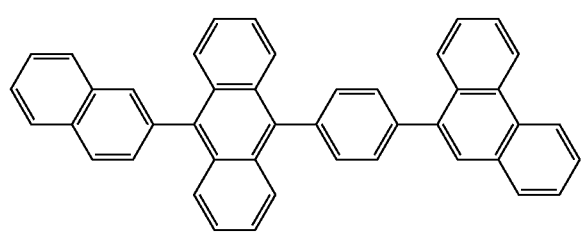
AN10
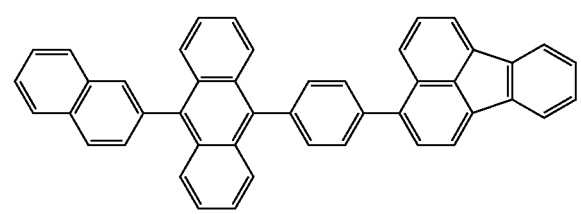
[Chemical Formula 21]
AN11
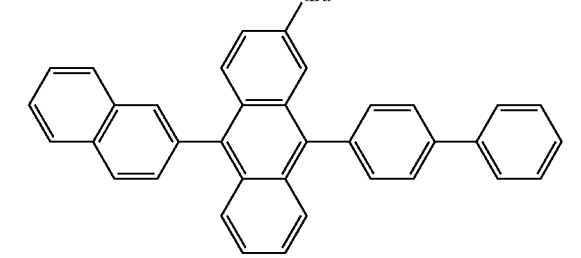
AN12
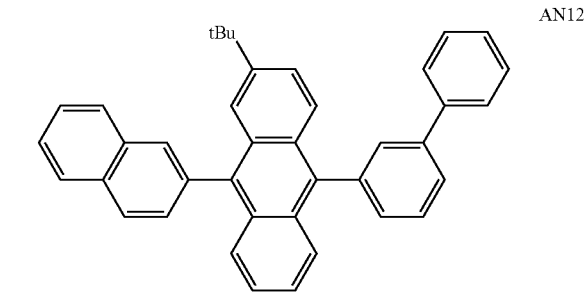
AN13
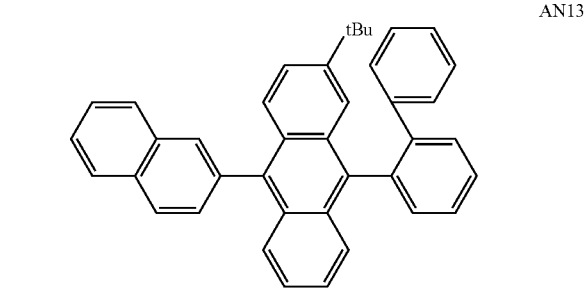
AN14
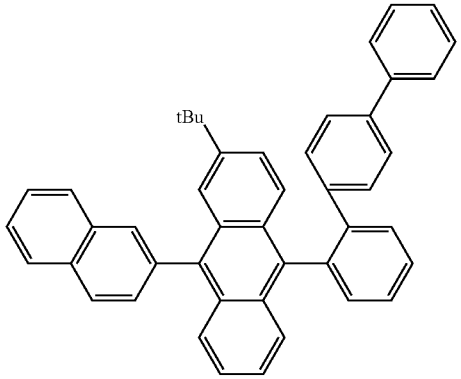
AN15
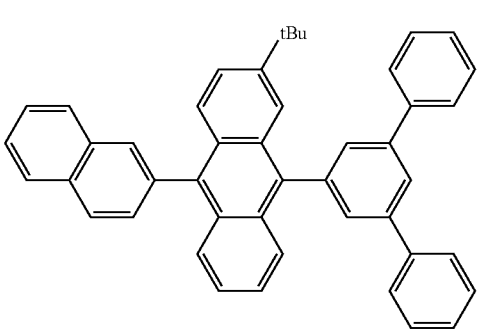
AN16
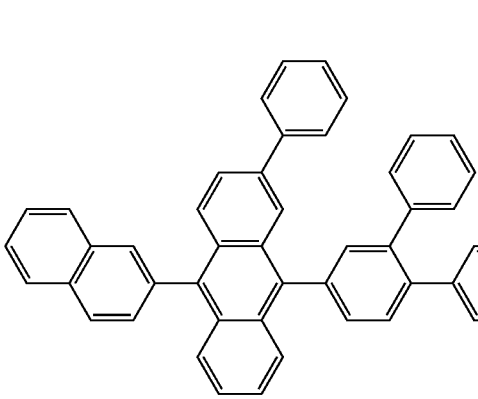
AN17
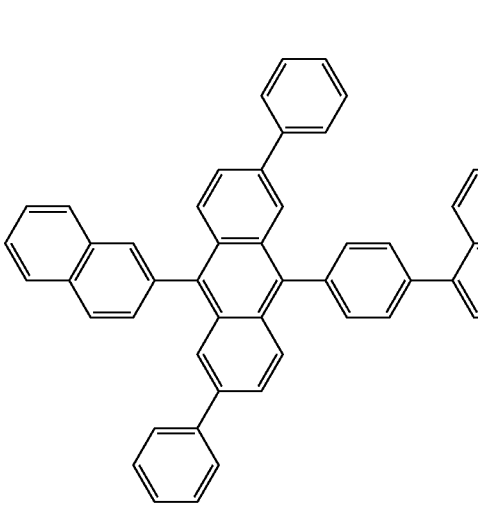

-continued
AN18
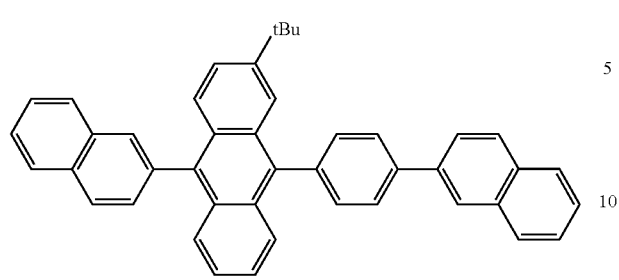
AN19
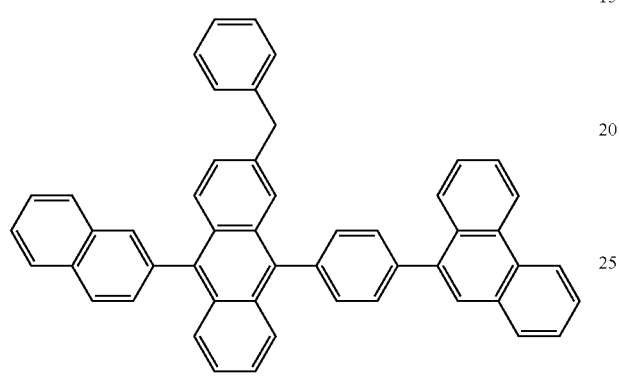
[Chemical Formula 22]
AN20
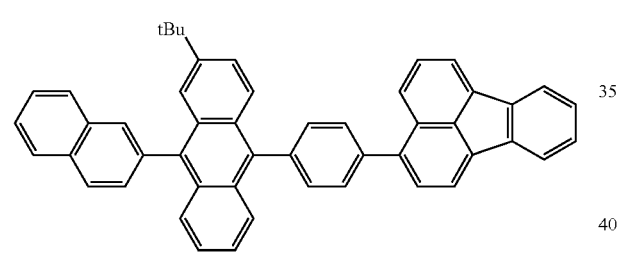
AN21
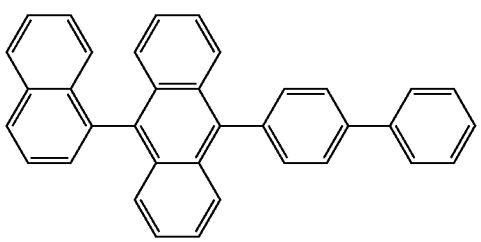
AN22
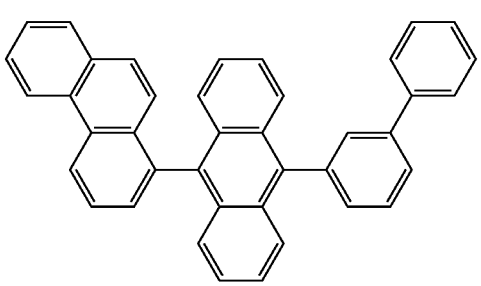
-continued
AN23
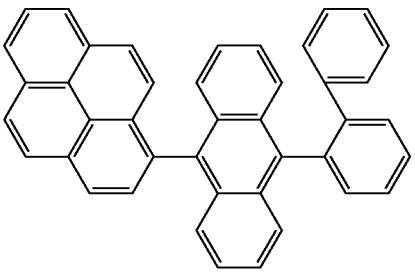
AN24
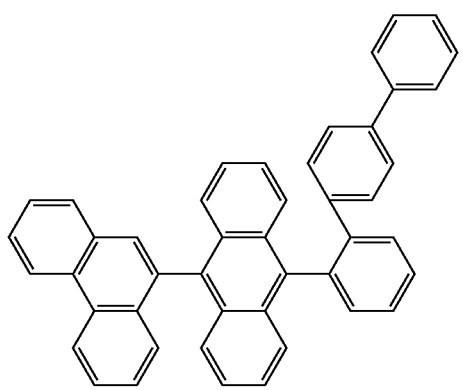
AN25
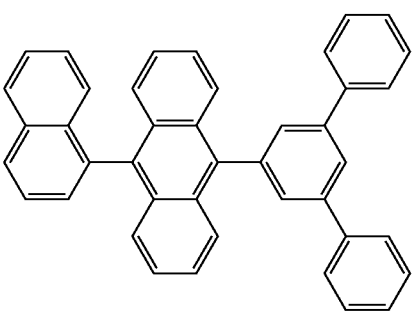
AN26
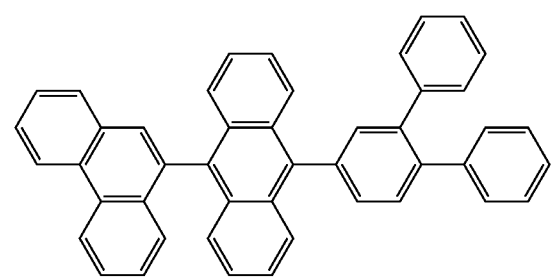
AN27
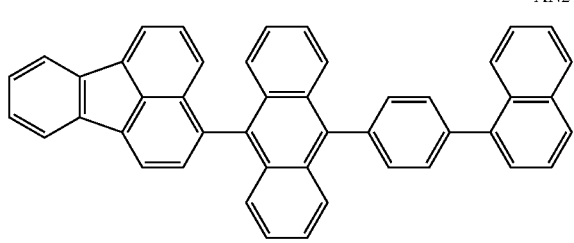

AN28
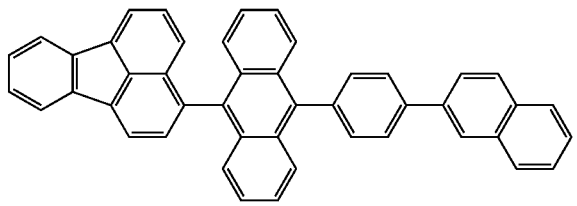
AN29
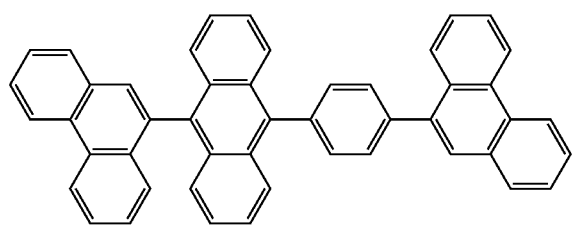
AN30
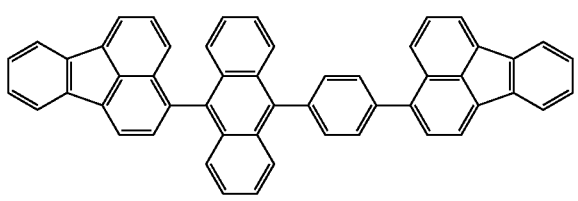
[Chemical Formula 23]
AN31
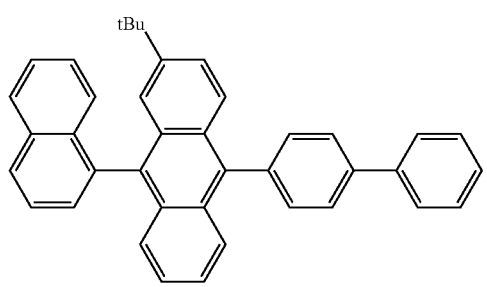
AN32
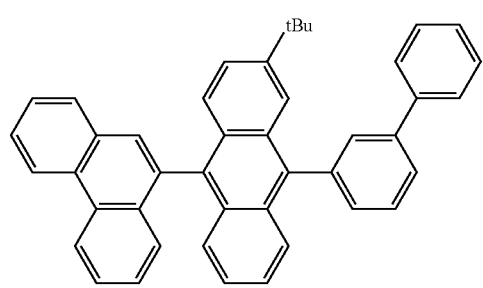
AN33
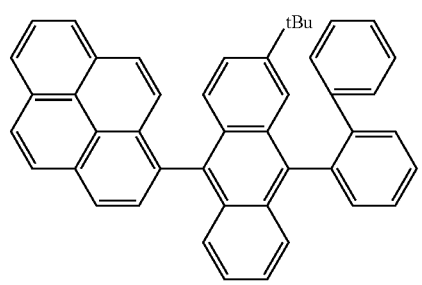
AN34
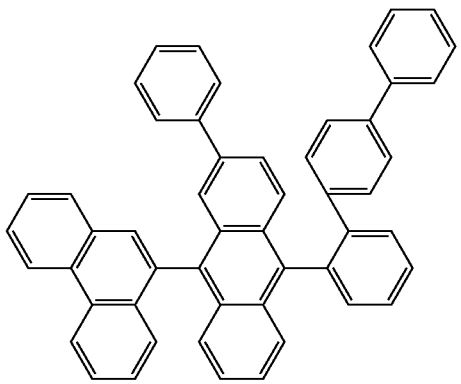
AN35
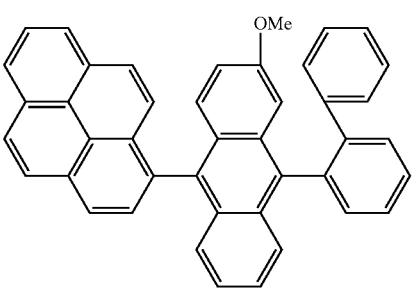
AN36
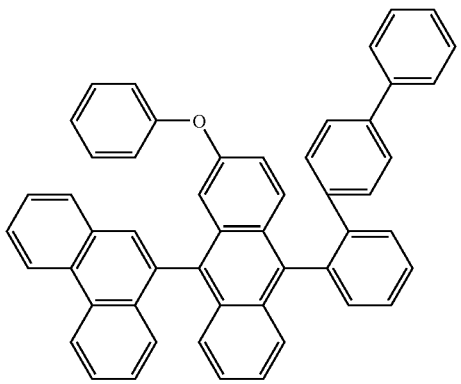
AN37
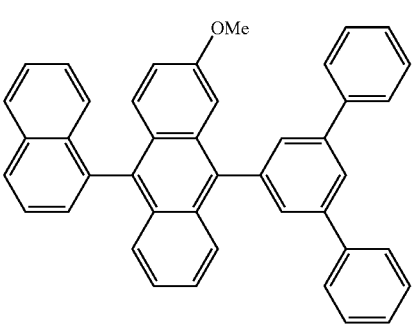

AN38
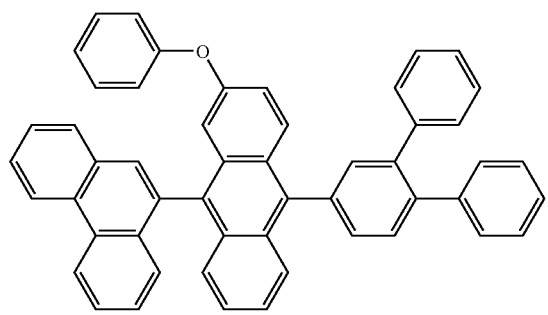
AN39
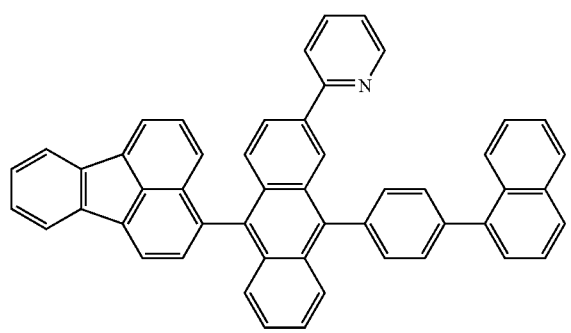
[Chemical Formula 24]
AN40
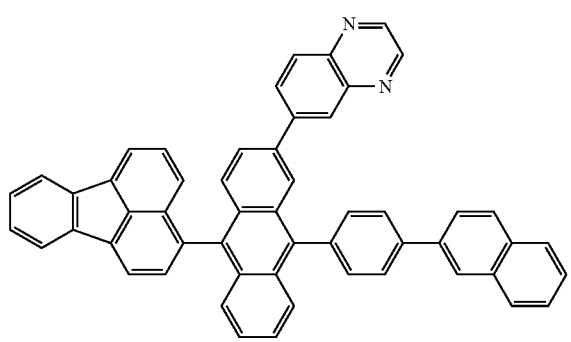
AN41
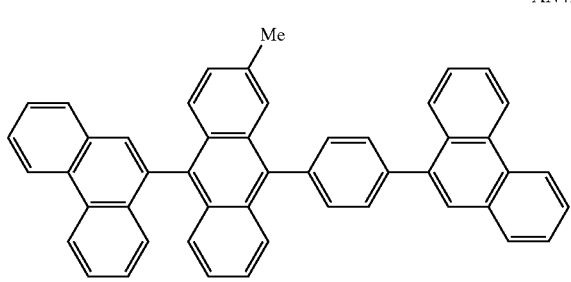
AN42
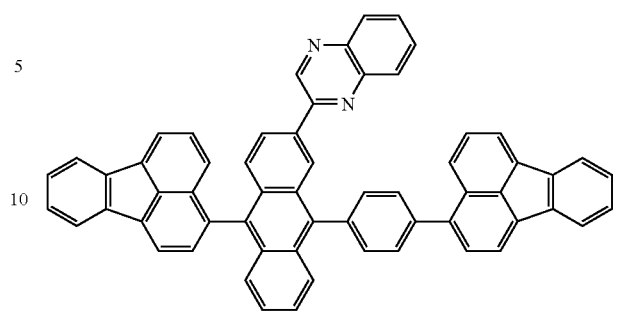
AN43
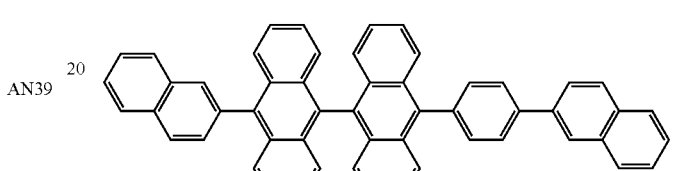
AN44
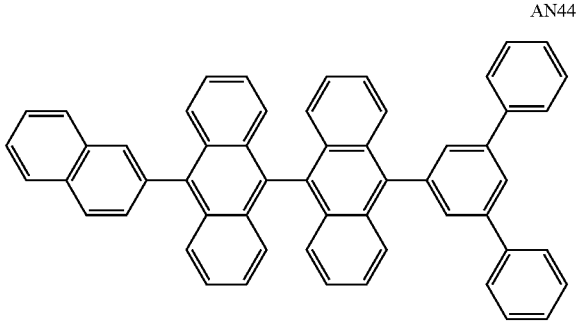
AN45
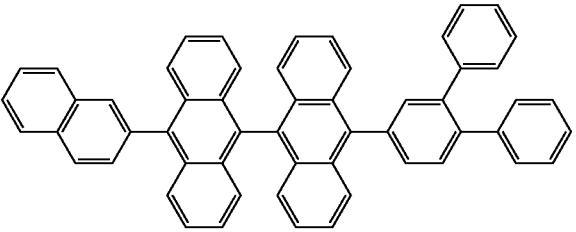
AN46
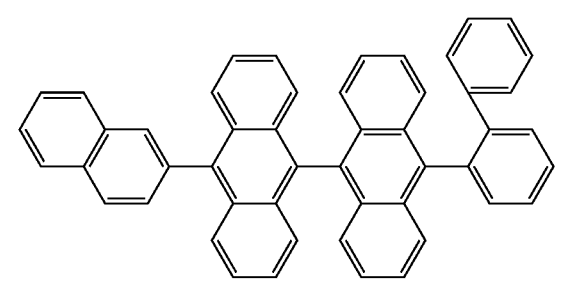

AN47
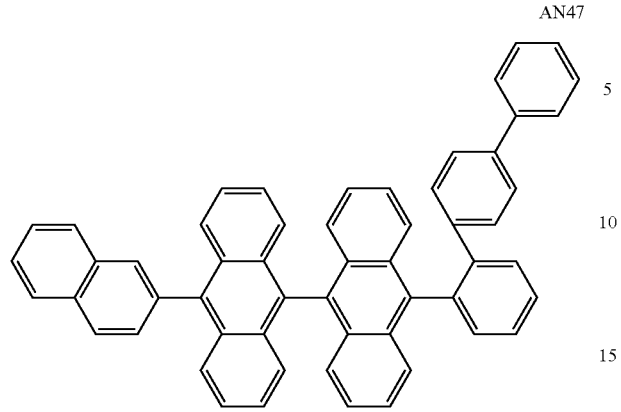
AN48
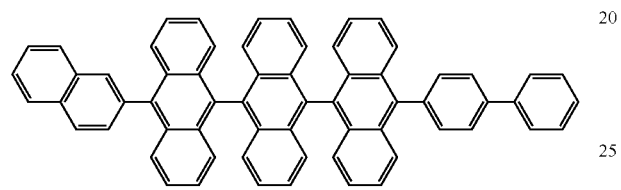
AN49
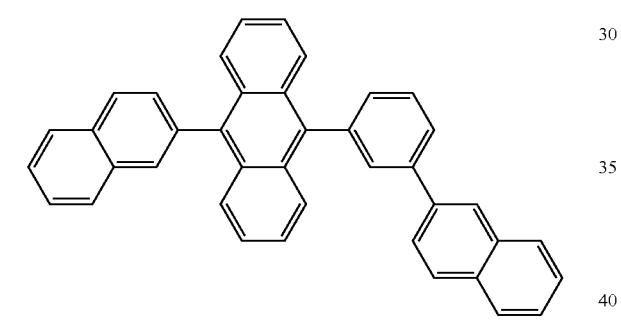
AN50
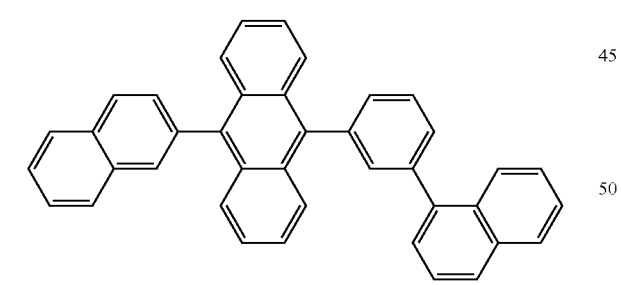
[Chemical Formula 25]
AN51
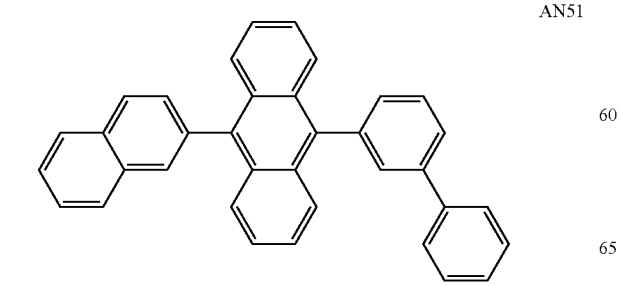
AN52
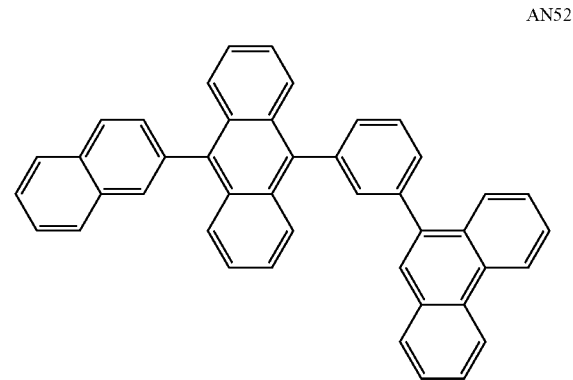
AN53
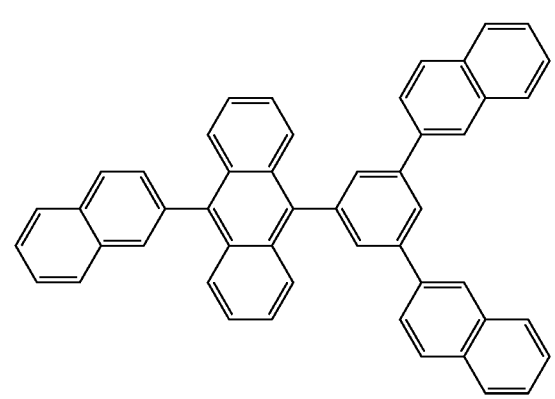
AN54
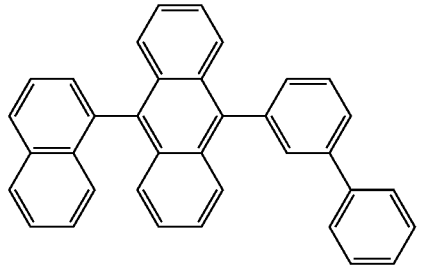
AN55
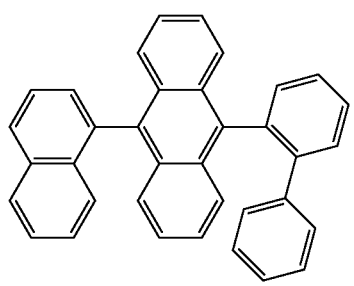

(4), and is exemplified by the following anthracene derivatives of AN-1 to AN-421 listed in WO2005/054162.

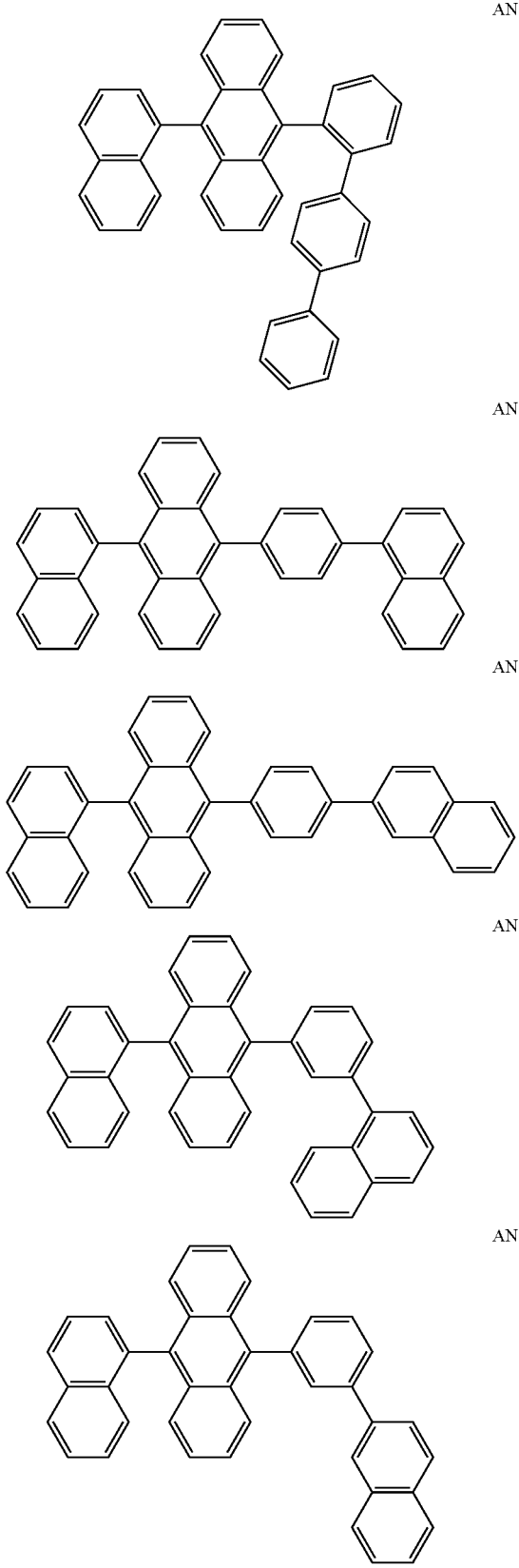

[Chemical Formula 26]

(4d)

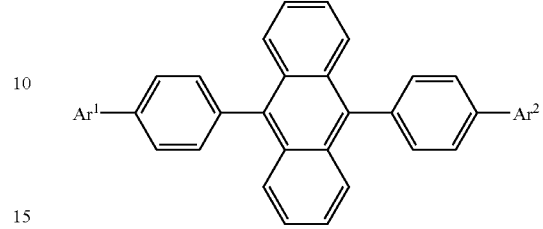

| Compound | Ar¹ | Ar² |
|---|---|---|
| AN-1 | 1-naphthyl | 9-phenanthryl |
| AN-2 | 1-naphthyl | 1-pyrenyl |
| AN-3 | 1-naphthyl | phenyl |
| AN-4 | 1-naphthyl | 2-biphenyl |
| AN-5 | 1-naphthyl | 3-biphenyl |
| AN-6 | 1-naphthyl | 4-biphenyl |
| AN-7 | 1-naphthyl | 2-p-terphenyl |
| AN-8 | 2-naphthyl | 1-naphthyl |
| AN-9 | 2-naphthyl | 9-phenanthryl |
| AN-10 | 2-naphthyl | 1-pyrenyl |
| AN-11 | 2-naphthyl | phenyl |
| AN-12 | 2-naphthyl | 2-biphenyl |
| AN-13 | 2-naphthyl | 3-biphenyl |
| AN-14 | 2-naphthyl | 4-biphenyl |
| AN-15 | 2-naphthyl | 2-p-terphenyl |
| AN-16 | 9-phenanthryl | 1-pyrenyl |
| AN-17 | 9-phenanthryl | phenyl |
| AN-18 | 9-phenanthryl | 2-biphenyl |
| AN-19 | 9-phenanthryl | 3-biphenyl |
| AN-20 | 9-phenanthryl | 4-biphenyl |

[Chemical Formula 27]

| AN-21 | 9-phenanthryl | 2-p-terphenyl |
|---|---|---|
| AN-22 | 1-pyrenyl | phenyl |
| AN-23 | 1-pyrenyl | 2-biphenyl |
| AN-24 | 1-pyrenyl | 3-biphenyl |
| AN-25 | 1-pyrenyl | 4-biphenyl |
| AN-26 | 1-pyrenyl | 2-p-terphenyl |
| AN-27 | phenyl | 2-biphenyl |
| AN-28 | phenyl | 3-biphenyl |
| AN-29 | phenyl | 4-biphenyl |
| AN-30 | phenyl | 2-p-terphenyl |
| AN-31 | 2-biphenyl | 3-biphenyl |
| AN-32 | 2-biphenyl | 4-biphenyl |
| AN-33 | 2-biphenyl | 2-p-terphenyl |
| AN-34 | 3-biphenyl | 4-biphenyl |
| AN-35 | 3-biphenyl | 2-p-terphenyl |

[Chemical Formula 28]

(4e)

| Compound | Ar¹ | Ar² |
|---|---|---|
| AN-36 | 1-naphthyl | 1-naphthyl |
| AN-37 | 1-naphthyl | 2-naphthyl |
| AN-38 | 1-naphthyl | 9-phenanthryl |
| AN-39 | 1-naphthyl | 1-pyrenyl |

The anthracene derivative is preferably an asymmetric monoanthracene derivative represented by the above formula

[Chemical Formula 29]

| Compound | | |
|---|---|---|
| AN-40 | 1-naphthyl | phenyl |
| AN-41 | 1-naphthyl | 2-biphenyl |
| AN-42 | 1-naphthyl | 3-biphenyl |
| AN-43 | 1-naphthyl | 4-biphenyl |
| AN-44 | 1-naphthyl | 2-p-terphenyl |
| AN-45 | 2-naphthyl | 1-naphthyl |
| AN-46 | 2-naphthyl | 2-naphthyl |
| AN-47 | 2-naphthyl | 9-phenanthryl |
| AN-48 | 2-naphthyl | 1-pyrenyl |
| AN-49 | 2-naphthyl | phenyl |
| AN-50 | 2-naphthyl | 2-biphenyl |
| AN-51 | 2-naphthyl | 3-biphenyl |
| AN-52 | 2-naphthyl | 4-biphenyl |
| AN-53 | 2-naphthyl | 2-p-terphenyl |
| AN-54 | 9-phenanthryl | 1-naphthyl |
| AN-55 | 9-phenanthryl | 2-naphthyl |
| AN-56 | 9-phenanthryl | 9-phenanthryl |
| AN-57 | 9-phenanthryl | 1-pyrenyl |
| AN-58 | 9-phenanthryl | phenyl |
| AN-59 | 9-phenanthryl | 2-biphenyl |
| AN-60 | 9-phenanthryl | 3-biphenyl |
| AN-61 | 9-phenanthryl | 4-biphenyl |
| AN-62 | 9-phenanthryl | 2-p-terphenyl |
| AN-63 | 1-pyrenyl | 1-naphthyl |
| AN-64 | 1-pyrenyl | 2-naphthyl |

[Chemical Formula 30]

| | | |
|---|---|---|
| AN-65 | 1-pyrenyl | 9-phenanthryl |
| AN-66 | 1-pyrenyl | 1-pyrenyl |
| AN-67 | 1-pyrenyl | phenyl |
| AN-68 | 1-pyrenyl | 2-biphenyl |
| AN-69 | 1-pyrenyl | 3-biphenyl |
| AN-70 | 1-pyrenyl | 4-biphenyl |
| AN-71 | 1-pyrenyl | 2-p-terphenyl |
| AN-72 | phenyl | 1-naphthyl |
| AN-73 | phenyl | 2-naphthyl |
| AN-74 | phenyl | 9-phenanthryl |
| AN-75 | phenyl | 1-pyrenyl |
| AN-76 | phenyl | phenyl |
| AN-77 | phenyl | 2-biphenyl |
| AN-78 | phenyl | 3-biphenyl |
| AN-79 | phenyl | 4-biphenyl |
| AN-80 | phenyl | 2-p-terphenyl |
| AN-81 | 2-biphenyl | 1-naphthyl |
| AN-82 | 2-biphenyl | 2-naphthyl |
| AN-83 | 2-biphenyl | 9-phenanthryl |
| AN-84 | 2-biphenyl | 1-pyrenyl |
| AN-85 | 2-biphenyl | phenyl |
| AN-86 | 2-biphenyl | 2-biphenyl |
| AN-87 | 2-biphenyl | 3-biphenyl |
| AN-88 | 2-biphenyl | 4-biphenyl |

[Chemical Formula 31]

| | | |
|---|---|---|
| AN-89 | 2-biphenyl | 2-p-terphenyl |
| AN-90 | 3-biphenyl | 1-naphthyl |
| AN-91 | 3-biphenyl | 2-naphthyl |
| AN-92 | 3-biphenyl | 9-phenanthryl |
| AN-93 | 3-biphenyl | 1-pyrenyl |
| AN-94 | 3-biphenyl | phenyl |
| AN-95 | 3-biphenyl | 2-biphenyl |
| AN-96 | 3-biphenyl | 3-biphenyl |
| AN-97 | 3-biphenyl | 4-biphenyl |
| AN-98 | 3-biphenyl | 2-p-terphenyl |
| AN-99 | 4-biphenyl | 1-naphthyl |
| AN-100 | 4-biphenyl | 2-naphthyl |
| AN-101 | 4-biphenyl | 9-phenanthryl |
| AN-102 | 4-biphenyl | 1-pyrenyl |
| AN-103 | 4-biphenyl | phenyl |
| AN-104 | 4-biphenyl | 2-biphenyl |
| AN-105 | 4-biphenyl | 3-biphenyl |
| AN-106 | 4-biphenyl | 4-biphenyl |
| AN-107 | 4-biphenyl | 2-p-terphenyl |

[Chemical Formula 32]

(4f)

[Structure: anthracene with Ar¹ substituent (ortho) on one phenyl and Ar² substituent (para) on the other phenyl]

| Compound | Ar¹ | Ar² |
|---|---|---|
| AN-108 | 1-naphthyl | 1-naphthyl |
| AN-109 | 1-naphthyl | 2-naphthyl |
| AN-110 | 1-naphthyl | 9-phenanthryl |
| AN-111 | 1-naphthyl | 1-pyrenyl |
| AN-112 | 1-naphthyl | phenyl |
| AN-113 | 1-naphthyl | 2-biphenyl |
| AN-114 | 1-naphthyl | 3-biphenyl |
| AN-115 | 1-naphthyl | 4-biphenyl |
| AN-116 | 1-naphthyl | 2-p-terphenyl |
| AN-117 | 2-naphthyl | 1-naphthyl |
| AN-118 | 2-naphthyl | 2-naphthyl |
| AN-119 | 2-naphthyl | 9-phenanthryl |
| AN-120 | 2-naphthyl | 1-pyrenyl |
| AN-121 | 2-naphthyl | phenyl |
| AN-122 | 2-naphthyl | 2-biphenyl |
| AN-123 | 2-naphthyl | 3-biphenyl |
| AN-124 | 2-naphthyl | 4-biphenyl |
| AN-125 | 2-naphthyl | 2-p-terphenyl |
| AN-126 | 9-phenanthryl | 1-naphthyl |
| AN-127 | 9-phenanthryl | 2-naphthyl |

[Chemical Formula 33]

| | | |
|---|---|---|
| AN-128 | 9-phenanthryl | 9-phenanthryl |
| AN-129 | 9-phenanthryl | 1-pyrenyl |
| AN-130 | 9-phenanthryl | phenyl |
| AN-131 | 9-phenanthryl | 2-biphenyl |
| AN-132 | 9-phenanthryl | 3-biphenyl |
| AN-133 | 9-phenanthryl | 4-biphenyl |
| AN-134 | 9-phenanthryl | 2-p-terphenyl |
| AN-135 | 1-pyrenyl | 1-naphthyl |
| AN-136 | 1-pyrenyl | 2-naphthyl |
| AN-137 | 1-pyrenyl | 9-phenanthryl |
| AN-138 | 1-pyrenyl | 1-pyrenyl |
| AN-139 | 1-pyrenyl | phenyl |
| AN-140 | 1-pyrenyl | 2-biphenyl |
| AN-141 | 1-pyrenyl | 3-biphenyl |
| AN-142 | 1-pyrenyl | 4-biphenyl |
| AN-143 | 1-pyrenyl | 2-p-terphenyl |
| AN-144 | phenyl | 1-naphthyl |
| AN-145 | phenyl | 2-naphthyl |
| AN-146 | phenyl | 9-phenanthryl |
| AN-147 | phenyl | 1-pyrenyl |
| AN-148 | phenyl | phenyl |
| AN-149 | phenyl | 2-biphenyl |
| AN-150 | phenyl | 3-biphenyl |
| AN-151 | phenyl | 4-biphenyl |
| AN-152 | phenyl | 2-p-terphenyl |

[Chemical Formula 34]

| | | |
|---|---|---|
| AN-153 | 2-biphenyl | 1-naphthyl |
| AN-154 | 2-biphenyl | 2-naphthyl |
| AN-155 | 2-biphenyl | 9-phenanthryl |
| AN-156 | 2-biphenyl | 1-pyrenyl |
| AN-157 | 2-biphenyl | phenyl |
| AN-158 | 2-biphenyl | 2-biphenyl |
| AN-159 | 2-biphenyl | 3-biphenyl |
| AN-160 | 2-biphenyl | 4-biphenyl |
| AN-161 | 2-biphenyl | 2-p-terphenyl |
| AN-162 | 3-biphenyl | 1-naphthyl |
| AN-163 | 3-biphenyl | 2-naphthyl |
| AN-164 | 3-biphenyl | 9-phenanthryl |
| AN-165 | 3-biphenyl | 1-pyrenyl |
| AN-166 | 3-biphenyl | phenyl |

| Compound | Ar¹ | Ar² |
|---|---|---|
| AN-167 | 3-biphenyl | 2-biphenyl |
| AN-168 | 3-biphenyl | 3-biphenyl |
| AN-169 | 3-biphenyl | 4-biphenyl |
| AN-170 | 3-biphenyl | 2-p-terphenyl |
| AN-171 | 4-biphenyl | 1-naphthyl |
| AN-172 | 4-biphenyl | 2-naphthyl |
| AN-173 | 4-biphenyl | 9-phenanthryl |
| AN-174 | 4-biphenyl | 1-pyrenyl |
| AN-175 | 4-biphenyl | phenyl |
| AN-176 | 4-biphenyl | 2-biphenyl |

[Chemical Formula 35]

| Compound | Ar¹ | Ar² |
|---|---|---|
| AN-177 | 4-biphenyl | 3-biphenyl |
| AN-178 | 4-biphenyl | 4-biphenyl |
| AN-179 | 4-biphenyl | 2-p-terphenyl |

[Chemical Formula 36]

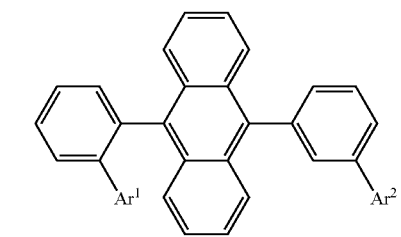

(4g)

| Compound | Ar¹ | Ar² |
|---|---|---|
| AN-180 | 1-naphthyl | 1-naphthyl |
| AN-181 | 1-naphthyl | 2-naphthyl |
| AN-182 | 1-naphthyl | 9-phenanthryl |
| AN-183 | 1-naphthyl | 1-pyrenyl |
| AN-184 | 1-naphthyl | phenyl |
| AN-185 | 1-naphthyl | 2-biphenyl |
| AN-186 | 1-naphthyl | 3-biphenyl |
| AN-187 | 1-naphthyl | 4-biphenyl |
| AN-188 | 2-naphthyl | 1-naphthyl |
| AN-189 | 2-naphthyl | 2-naphthyl |
| AN-190 | 2-naphthyl | 9-phenanthryl |
| AN-191 | 2-naphthyl | 1-pyrenyl |
| AN-192 | 2-naphthyl | phenyl |
| AN-193 | 2-naphthyl | 2-biphenyl |
| AN-194 | 2-naphthyl | 3-biphenyl |
| AN-195 | 2-naphthyl | 4-biphenyl |

[Chemical Formula 37]

| Compound | Ar¹ | Ar² |
|---|---|---|
| AN-196 | 9-phenanthryl | 1-naphthyl |
| AN-197 | 9-phenanthryl | 2-naphthyl |
| AN-198 | 9-phenanthryl | 9-phenanthryl |
| AN-199 | 9-phenanthryl | 1-pyrenyl |
| AN-200 | 9-phenanthryl | phenyl |
| AN-201 | 9-phenanthryl | 2-biphenyl |
| AN-202 | 9-phenanthryl | 3-biphenyl |
| AN-203 | 9-phenanthryl | 4-biphenyl |
| AN-204 | 1-pyrenyl | 1-naphthyl |
| AN-205 | 1-pyrenyl | 2-naphthyl |
| AN-206 | 1-pyrenyl | 9-phenanthryl |
| AN-207 | 1-pyrenyl | 1-pyrenyl |
| AN-208 | 1-pyrenyl | phenyl |
| AN-209 | 1-pyrenyl | 2-biphenyl |
| AN-210 | 1-pyrenyl | 3-biphenyl |
| AN-211 | 1-pyrenyl | 4-biphenyl |
| AN-212 | phenyl | 1-naphthyl |
| AN-213 | phenyl | 2-naphthyl |
| AN-214 | phenyl | 9-phenanthryl |
| AN-215 | phenyl | 1-pyrenyl |
| AN-216 | phenyl | phenyl |
| AN-217 | phenyl | 2-biphenyl |
| AN-218 | phenyl | 3-biphenyl |
| AN-219 | phenyl | 4-biphenyl |
| AN-220 | 2-biphenyl | 1-naphthyl |

[Chemical Formula 38]

| Compound | Ar¹ | Ar² |
|---|---|---|
| AN-221 | 2-biphenyl | 2-naphthyl |
| AN-222 | 2-biphenyl | 9-phenanthryl |
| AN-223 | 2-biphenyl | 1-pyrenyl |
| AN-224 | 2-biphenyl | phenyl |
| AN-225 | 2-biphenyl | 2-biphenyl |
| AN-226 | 2-biphenyl | 3-biphenyl |
| AN-227 | 2-biphenyl | 4-biphenyl |
| AN-228 | 3-biphenyl | 1-naphthyl |
| AN-229 | 3-biphenyl | 2-naphthyl |
| AN-230 | 3-biphenyl | 9-phenanthryl |
| AN-231 | 3-biphenyl | 1-pyrenyl |
| AN-232 | 3-biphenyl | phenyl |
| AN-233 | 3-biphenyl | 2-biphenyl |
| AN-234 | 3-biphenyl | 3-biphenyl |
| AN-235 | 3-biphenyl | 4-biphenyl |
| AN-236 | 4-biphenyl | 1-naphthyl |
| AN-237 | 4-biphenyl | 2-naphthyl |
| AN-238 | 4-biphenyl | 9-phenanthryl |
| AN-239 | 4-biphenyl | 1-pyrenyl |
| AN-240 | 4-biphenyl | phenyl |
| AN-241 | 4-biphenyl | 2-biphenyl |
| AN-242 | 4-biphenyl | 3-biphenyl |
| AN-243 | 4-biphenyl | 4-biphenyl |

[Chemical Formula 39]

(4h)

| Compound | Ar¹ | Ar² |
|---|---|---|
| AN-244 | 1-naphthyl | 2-naphthyl |
| AN-245 | 1-naphthyl | 9-phenanthryl |
| AN-246 | 1-naphthyl | 1-pyrenyl |
| AN-247 | 1-naphthyl | phenyl |
| AN-248 | 1-naphthyl | 2-biphenyl |
| AN-249 | 1-naphthyl | 3-biphenyl |
| AN-250 | 1-naphthyl | 4-biphenyl |
| AN-251 | 2-naphthyl | 9-phenanthryl |
| AN-252 | 2-naphthyl | 1-pyrenyl |
| AN-253 | 2-naphthyl | phenyl |
| AN-254 | 2-naphthyl | 2-biphenyl |
| AN-255 | 2-naphthyl | 3-biphenyl |
| AN-256 | 2-naphthyl | 4-biphenyl |
| AN-257 | 9-phenanthryl | 1-pyrenyl |
| AN-258 | 9-phenanthryl | phenyl |
| AN-259 | 9-phenanthryl | 2-biphenyl |
| AN-260 | 9-phenanthryl | 3-biphenyl |
| AN-261 | 9-phenanthryl | 4-biphenyl |
| AN-262 | 1-pyrenyl | phenyl |
| AN-263 | 1-pyrenyl | 2-biphenyl |

[Chemical Formula 40]

| Compound | Ar¹ | Ar² |
|---|---|---|
| AN-264 | 1-pyrenyl | 3-biphenyl |
| AN-265 | 1-pyrenyl | 4-biphenyl |
| AN-266 | phenyl | 2-biphenyl |
| AN-267 | phenyl | 3-biphenyl |
| AN-268 | phenyl | 4-biphenyl |
| AN-269 | 2-biphenyl | 3-biphenyl |
| AN-270 | 2-biphenyl | 4-biphenyl |
| AN-271 | 3-biphenyl | 4-biphenyl |

[Chemical Formula 41]

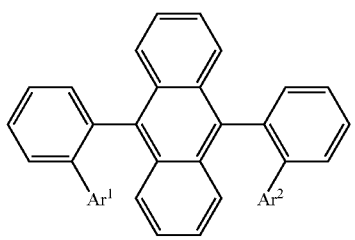

(4i)

| Compound | Ar¹ | Ar² |
|---|---|---|
| AN-272 | 1-naphthyl | 2-naphthyl |
| AN-273 | 1-naphthyl | 9-phenanthryl |
| AN-274 | 1-naphthyl | 1-pyrenyl |
| AN-275 | 1-naphthyl | phenyl |
| AN-276 | 1-naphthyl | 2-biphenyl |
| AN-277 | 1-naphthyl | 3-biphenyl |
| AN-278 | 1-naphthyl | 4-biphenyl |
| AN-279 | 2-naphthyl | 9-phenanthryl |
| AN-280 | 2-naphthyl | 1-pyrenyl |
| AN-281 | 2-naphthyl | phenyl |
| AN-282 | 2-naphthyl | 2-biphenyl |

[Chemical Formula 42]

| Compound | Ar¹ | Ar² |
|---|---|---|
| AN-283 | 2-naphthyl | 3-biphenyl |
| AN-284 | 2-naphthyl | 4-biphenyl |
| AN-285 | 9-phenanthryl | 1-pyrenyl |
| AN-286 | 9-phenanthryl | phenyl |
| AN-287 | 9-phenanthryl | 2-biphenyl |
| AN-288 | 9-phenanthryl | 3-biphenyl |
| AN-289 | 9-phenanthryl | 4-biphenyl |
| AN-290 | 1-pyrenyl | phenyl |
| AN-291 | 1-pyrenyl | 2-biphenyl |
| AN-292 | 1-pyrenyl | 3-biphenyl |
| AN-293 | 1-pyrenyl | 4-biphenyl |
| AN-294 | phenyl | 2-biphenyl |
| AN-295 | phenyl | 3-biphenyl |
| AN-296 | phenyl | 4-biphenyl |
| AN-297 | 2-biphenyl | 3-biphenyl |
| AN-298 | 2-biphenyl | 4-biphenyl |
| AN-299 | 3-biphenyl | 4-biphenyl |

[Chemical Formula 43]

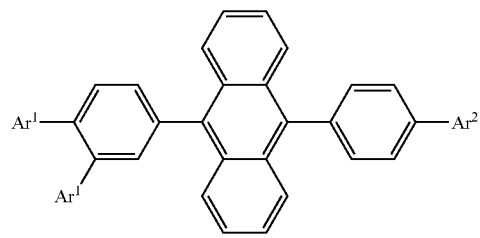

(4j)

| Compound | Ar¹ | Ar² |
|---|---|---|
| AN-300 | 1-naphthyl | 1-naphthyl |
| AN-301 | 1-naphthyl | 2-naphthyl |

[Chemical Formula 44]

| | | |
|---|---|---|
| AN-302 | 1-naphthyl | 9-phenanthryl |
| AN-303 | 1-naphthyl | 1-pyrenyl |
| AN-304 | 1-naphthyl | phenyl |
| AN-305 | 1-naphthyl | 2-biphenyl |
| AN-306 | 1-naphthyl | 3-biphenyl |
| AN-307 | 1-naphthyl | 4-biphenyl |
| AN-308 | 1-naphthyl | 2-p-terphenyl |
| AN-309 | 2-naphthyl | 1-naphthyl |
| AN-310 | 2-naphthyl | 2-naphthyl |
| AN-311 | 2-naphthyl | 9-phenanthryl |
| AN-312 | 2-naphthyl | 1-pyrenyl |
| AN-313 | 2-naphthyl | phenyl |
| AN-314 | 2-naphthyl | 2-biphenyl |
| AN-315 | 2-naphthyl | 3-biphenyl |
| AN-316 | 2-naphthyl | 4-biphenyl |
| AN-317 | 2-naphthyl | 2-p-terphenyl |

[Chemical Formula 45]

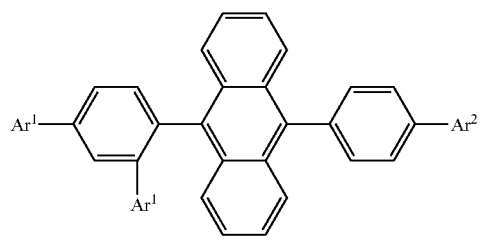

(4k)

| Compound | Ar¹ | Ar² |
|---|---|---|
| AN-318 | 1-naphthyl | 1-naphthyl |
| AN-319 | 1-naphthyl | 2-naphthyl |
| AN-320 | 1-naphthyl | 9-phenanthryl |

[Chemical Formula 46]

| | | |
|---|---|---|
| AN-321 | 1-naphthyl | 1-pyrenyl |
| AN-322 | 1-naphthyl | phenyl |
| AN-323 | 1-naphthyl | 2-biphenyl |
| AN-324 | 1-naphthyl | 3-biphenyl |
| AN-325 | 1-naphthyl | 4-biphenyl |
| AN-326 | 1-naphthyl | 2-p-terphenyl |
| AN-327 | 2-naphthyl | 1-naphthyl |
| AN-328 | 2-naphthyl | 2-naphthyl |
| AN-329 | 2-naphthyl | 9-phenanthryl |
| AN-330 | 2-naphthyl | 1-pyrenyl |
| AN-331 | 2-naphthyl | phenyl |
| AN-332 | 2-naphthyl | 2-biphenyl |
| AN-333 | 2-naphthyl | 3-biphenyl |
| AN-334 | 2-naphthyl | 4-biphenyl |
| AN-335 | 2-naphthyl | 2-p-terphenyl |

[Chemical Formula 47]

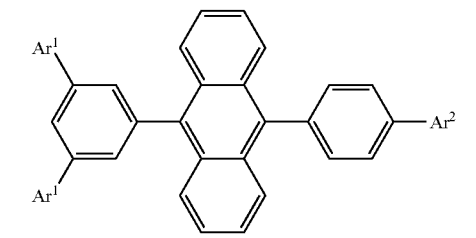

(4l)

| Compound | Ar¹ | Ar² |
|---|---|---|
| AN-336 | 1-naphthyl | 1-naphthyl |
| AN-337 | 1-naphthyl | 2-naphthyl |
| AN-338 | 1-naphthyl | 9-phenanthryl |
| AN-339 | 1-naphthyl | 1-pyrenyl |

[Chemical Formula 48]

| | | |
|---|---|---|
| AN-340 | 1-naphthyl | phenyl |
| AN-341 | 1-naphthyl | 2-biphenyl |
| AN-342 | 1-naphthyl | 3-biphenyl |
| AN-343 | 1-naphthyl | 4-biphenyl |
| AN-344 | 1-naphthyl | 2-p-terphenyl |
| AN-345 | 2-naphthyl | 1-naphthyl |
| AN-346 | 2-naphthyl | 2-naphthyl |
| AN-347 | 2-naphthyl | 9-phenanthryl |
| AN-348 | 2-naphthyl | 1-pyrenyl |
| AN-349 | 2-naphthyl | phenyl |
| AN-350 | 2-naphthyl | 2-biphenyl |
| AN-351 | 2-naphthyl | 3-biphenyl |

| | | |
|---|---|---|
| AN-352 | 2-naphthyl | 4-biphenyl |
| AN-353 | 2-naphthyl | 2-p-terphenyl |

[Chemical Formula 49]

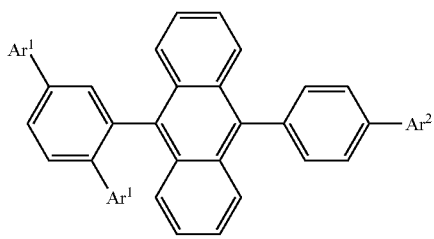

(4m)

| Compound | Ar¹ | Ar² |
|---|---|---|
| AN-354 | 1-naphthyl | 1-naphthyl |
| AN-355 | 1-naphthyl | 2-naphthyl |
| AN-356 | 1-naphthyl | 9-phenanthryl |
| AN-357 | 1-naphthyl | 1-pyrenyl |
| AN-358 | 1-naphthyl | phenyl |

[Chemical Formula 50]

| AN-359 | 1-naphthyl | 2-biphenyl |
|---|---|---|
| AN-360 | 1-naphthyl | 3-biphenyl |
| AN-361 | 1-naphthyl | 4-biphenyl |
| AN-362 | 1-naphthyl | 2-p-terphenyl |
| AN-363 | 2-naphthyl | 1-naphthyl |
| AN-364 | 2-naphthyl | 2-naphthyl |
| AN-365 | 2-naphthyl | 9-phenanthryl |
| AN-366 | 2-naphthyl | 1-pyrenyl |
| AN-367 | 2-naphthyl | phenyl |
| AN-368 | 2-naphthyl | 2-biphenyl |
| AN-369 | 2-naphthyl | 3-biphenyl |
| AN-370 | 2-naphthyl | 4-biphenyl |
| AN-371 | 2-naphthyl | 2-p-terphenyl |

[Chemical Formula 51]

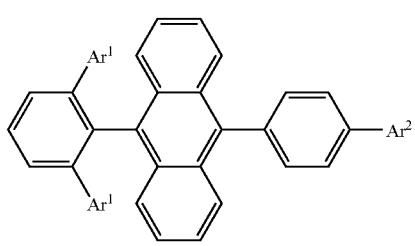

(4n)

| Compound | Ar¹ | Ar² |
|---|---|---|
| AN-372 | 1-naphthyl | 1-naphthyl |
| AN-373 | 1-naphthyl | 2-naphthyl |
| AN-374 | 1-naphthyl | 9-phenanthryl |
| AN-375 | 1-naphthyl | 1-pyrenyl |
| AN-376 | 1-naphthyl | phenyl |
| AN-377 | 1-naphthyl | 2-biphenyl |

[Chemical Formula 52]

| AN-378 | 1-naphthyl | 3-biphenyl |
|---|---|---|
| AN-379 | 1-naphthyl | 4-biphenyl |
| AN-380 | 1-naphthyl | 2-p-terphenyl |
| AN-381 | 2-naphthyl | 1-naphthyl |
| AN-382 | 2-naphthyl | 2-naphthyl |
| AN-383 | 2-naphthyl | 9-phenanthryl |
| AN-384 | 2-naphthyl | 1-pyrenyl |
| AN-385 | 2-naphthyl | phenyl |
| AN-386 | 2-naphthyl | 2-biphenyl |
| AN-387 | 2-naphthyl | 3-biphenyl |
| AN-388 | 2-naphthyl | 4-biphenyl |
| AN-389 | 2-naphthyl | 2-p-terphenyl |

[Chemical Formula 53]

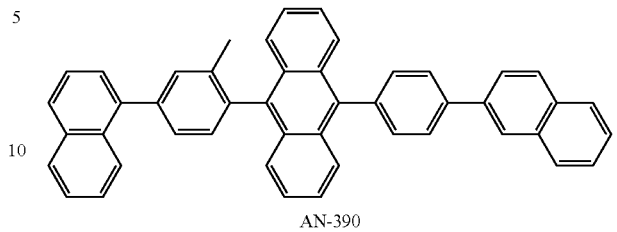

AN-390

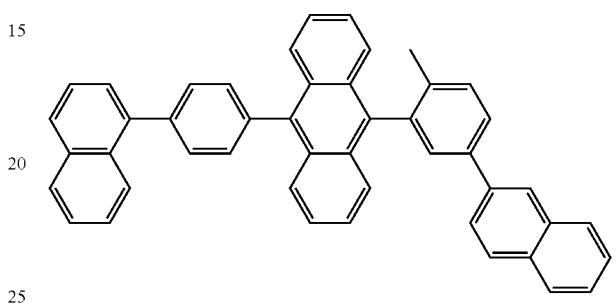

AN-391

AN-392

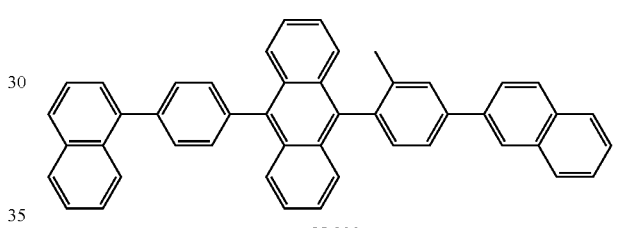

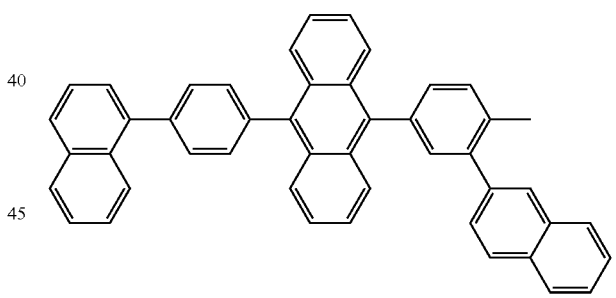

AN-393

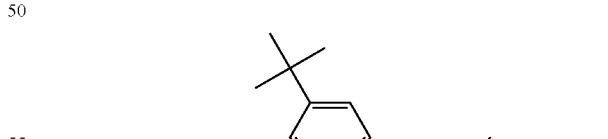

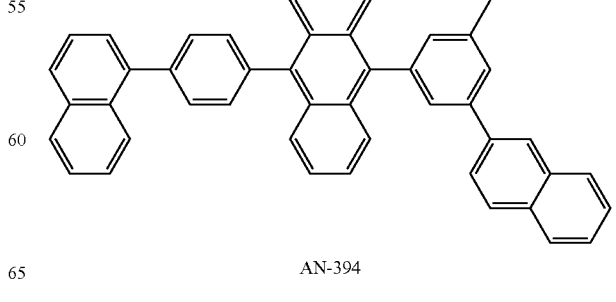

AN-394

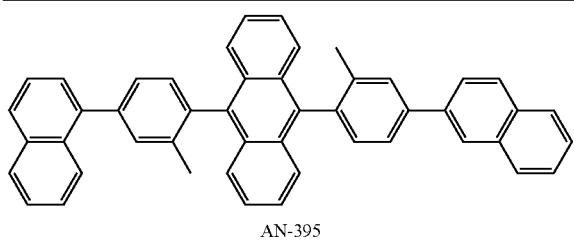
AN-395
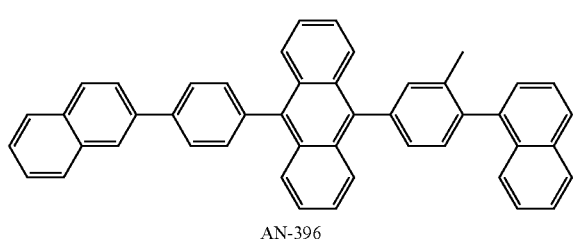 [SMILES: Cc1cc(-c2c3ccccc3c(-c3ccc(-c4ccc5ccccc5c4)cc3)c3ccccc23)ccc1-c1cccc2ccccc12]
AN-396
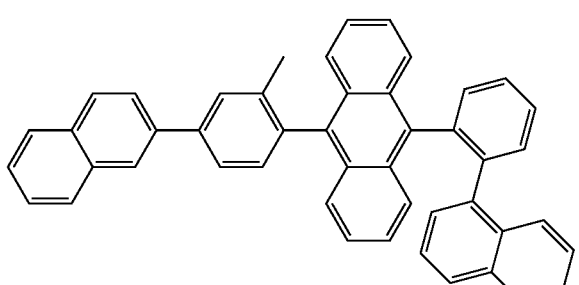
AN-397
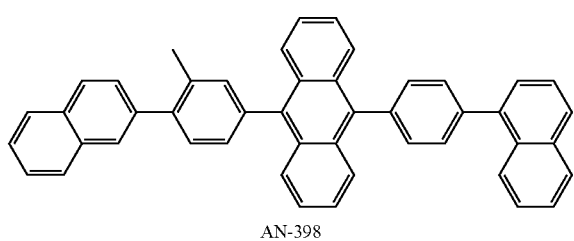
AN-398
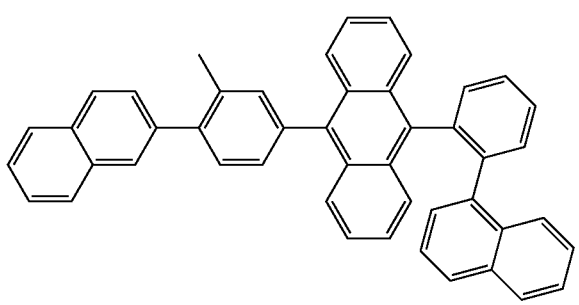
AN-399
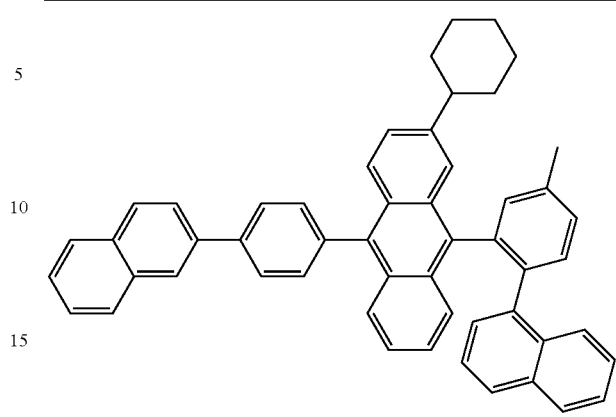
AN-400
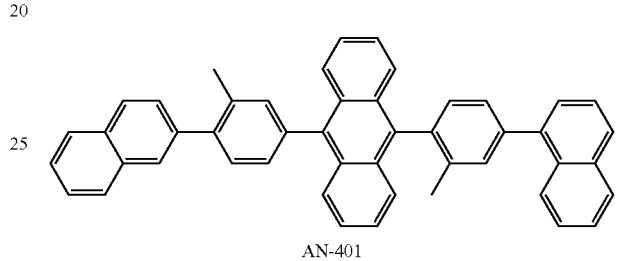
AN-401
[Chemical Formula 54]
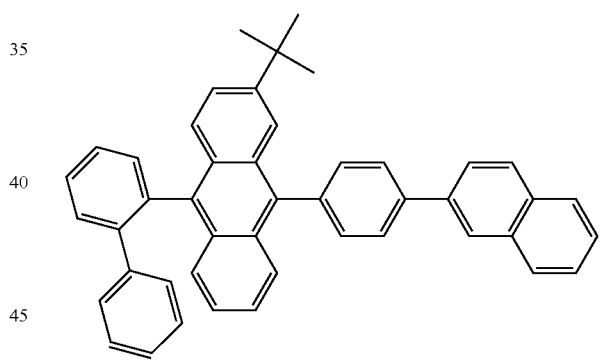
AN-402
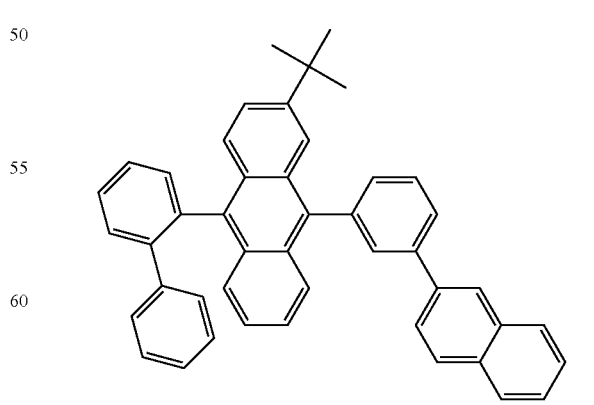
AN-403

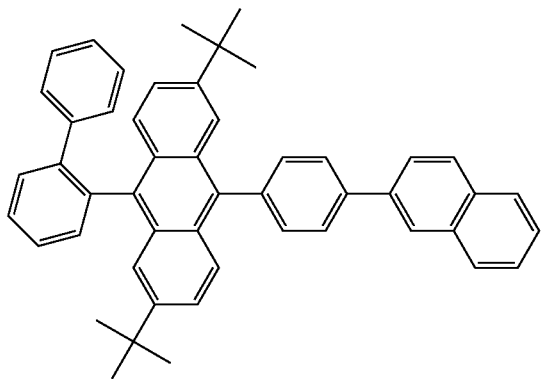
AN-404
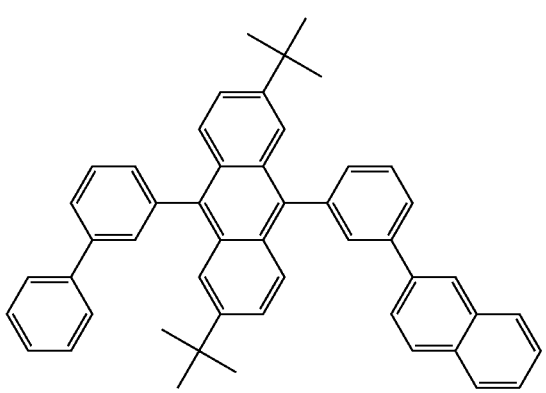
AN-405
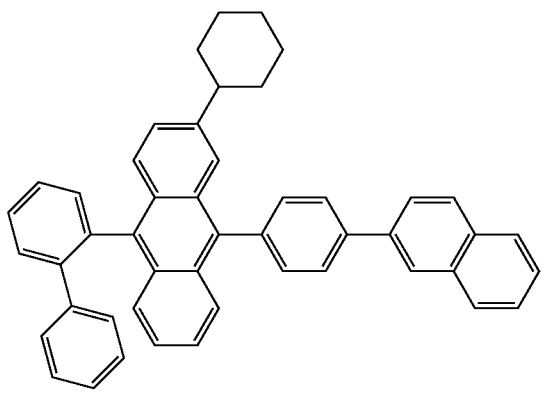
AN-406
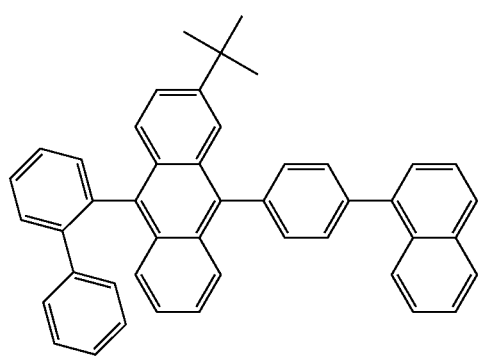
AN-407
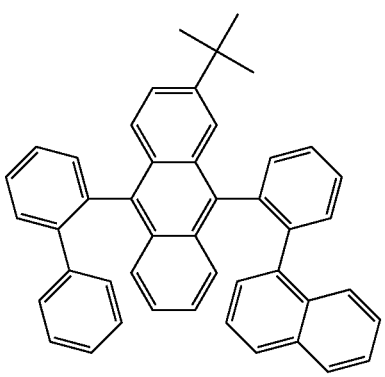
AN-408
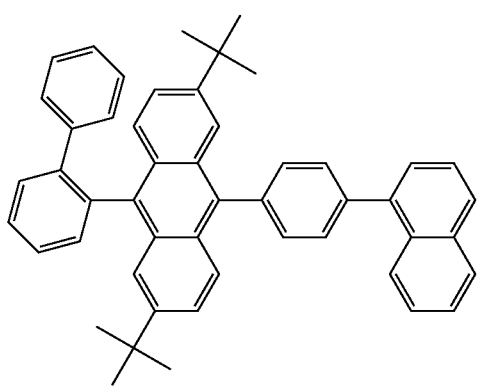
AN-409
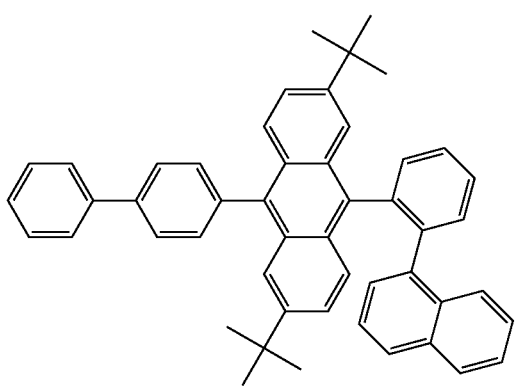
AN-410

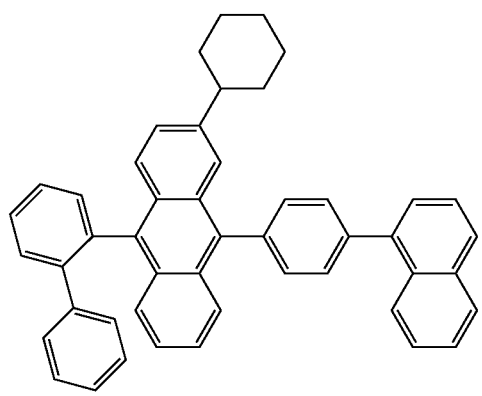
AN-411
[Chemical Formula 55]
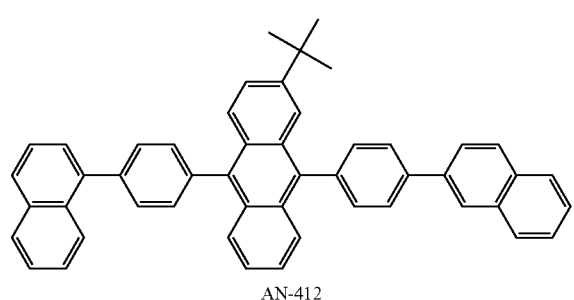 [SMILES: CC(C)(C)c1ccc2c(-c3ccc(-c4cccc5ccccc45)cc3)c3ccccc3c(-c3ccc(-c4ccc5ccccc5c4)cc3)c2c1]
AN-412
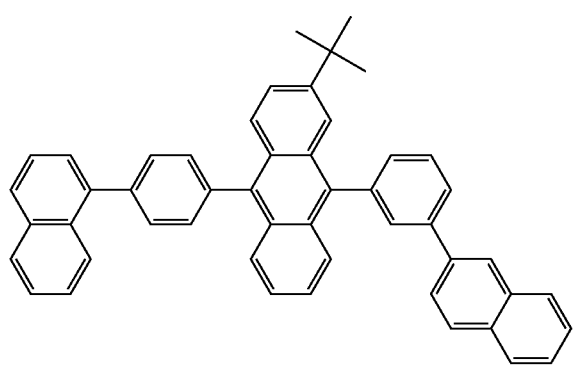
AN-413
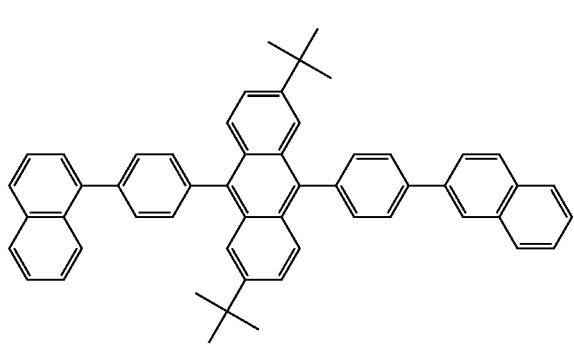
AN-414
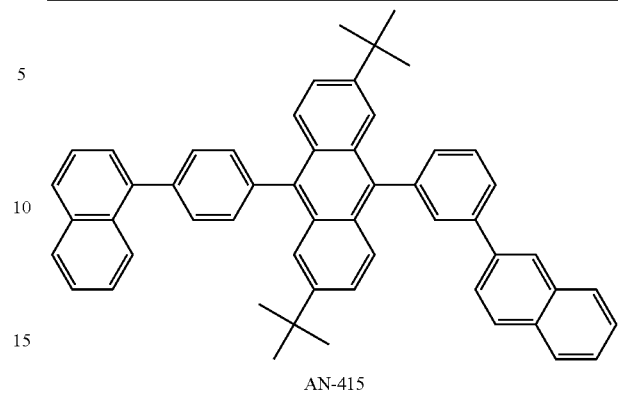
AN-415
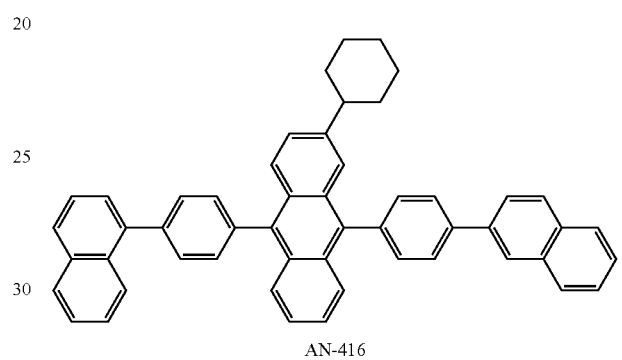
AN-416
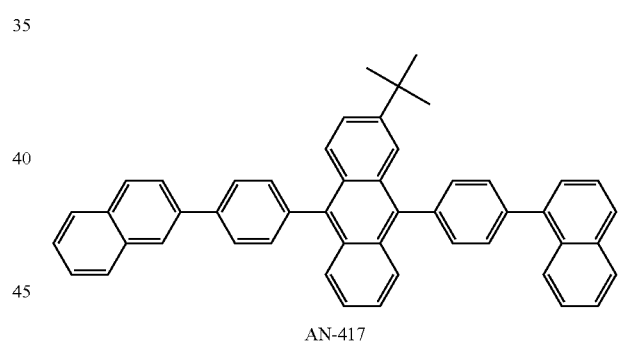
AN-417
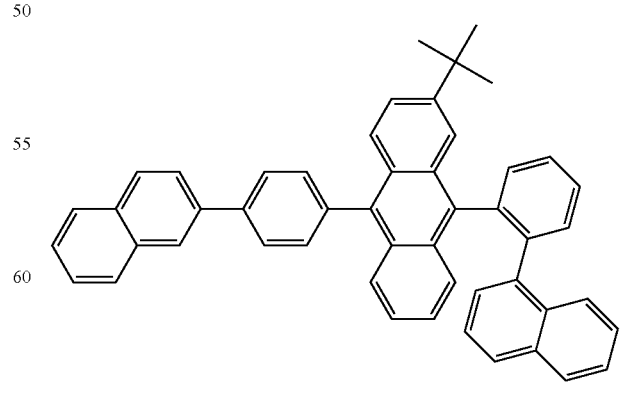
AN-418

-continued
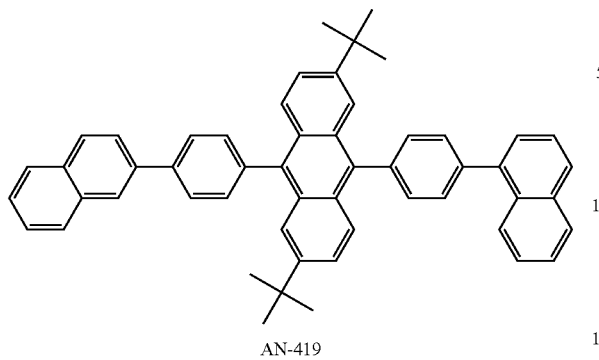
AN-419
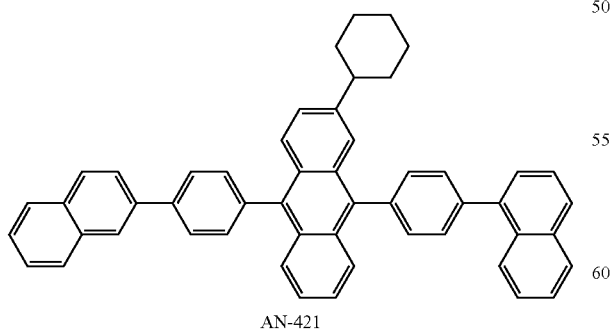
AN-420
AN-421
Specific examples of the host are compounds as follows.
[Chemical Formula 56]
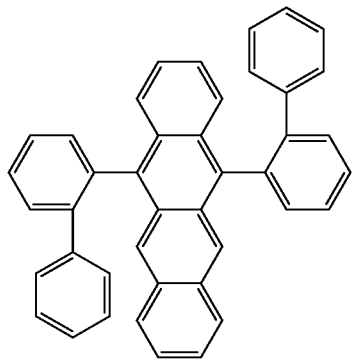
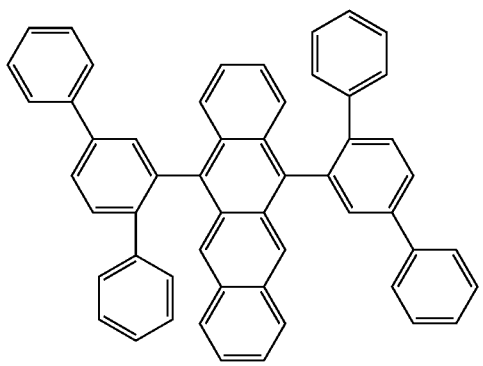
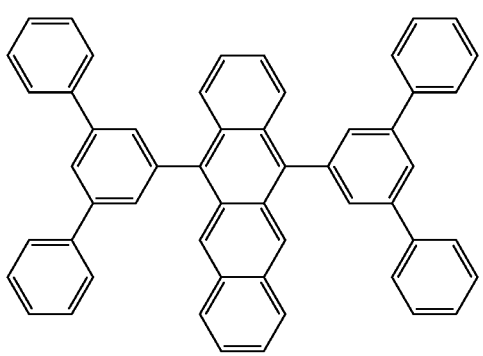
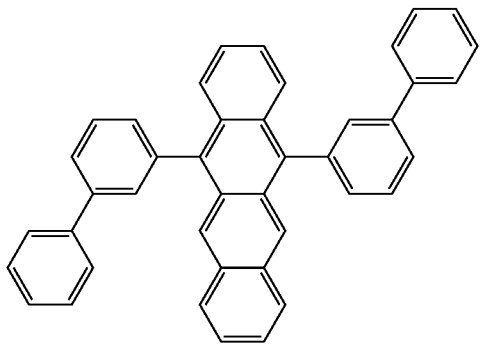
In place of the anthracene derivative, a naphthacene derivative represented by the above formula (5) may be used as the host.

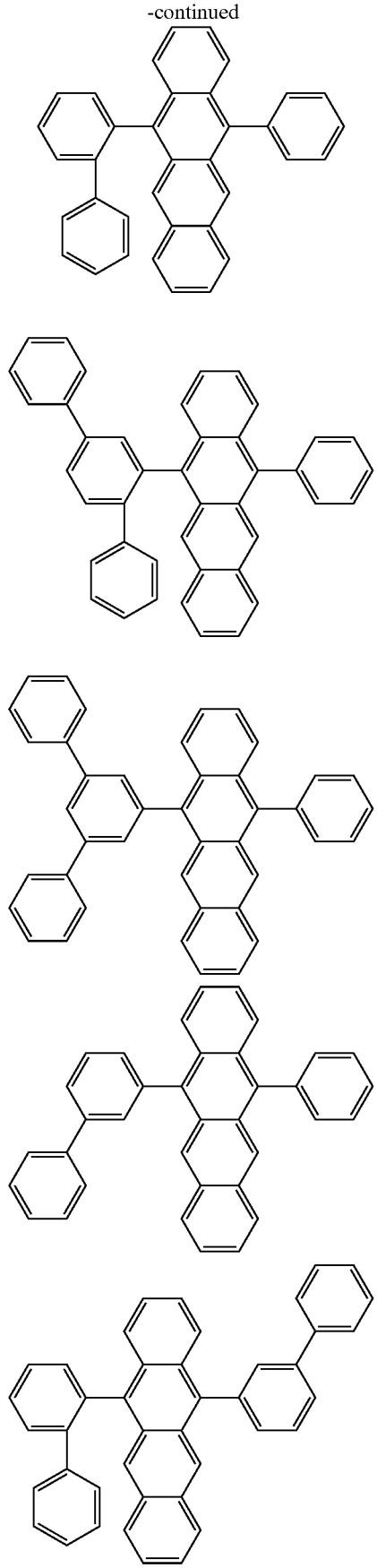
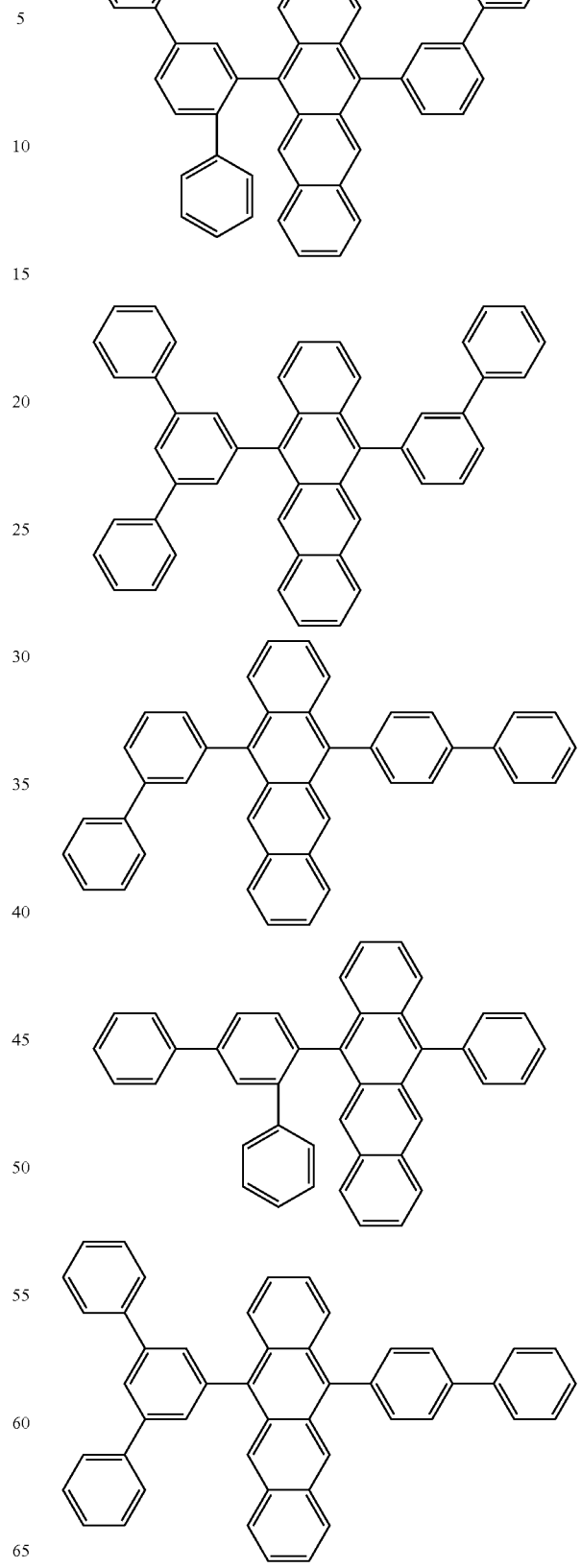

Examples of the dopant used together with the anthracene host (the formulae (2) and (4)) are a styrylamine derivative represented by the above formula (7) and a substituted derivative of arylamine represented by the above formula (8).
Specific examples of the dopant are as follows.
[Chemical Formula 57]
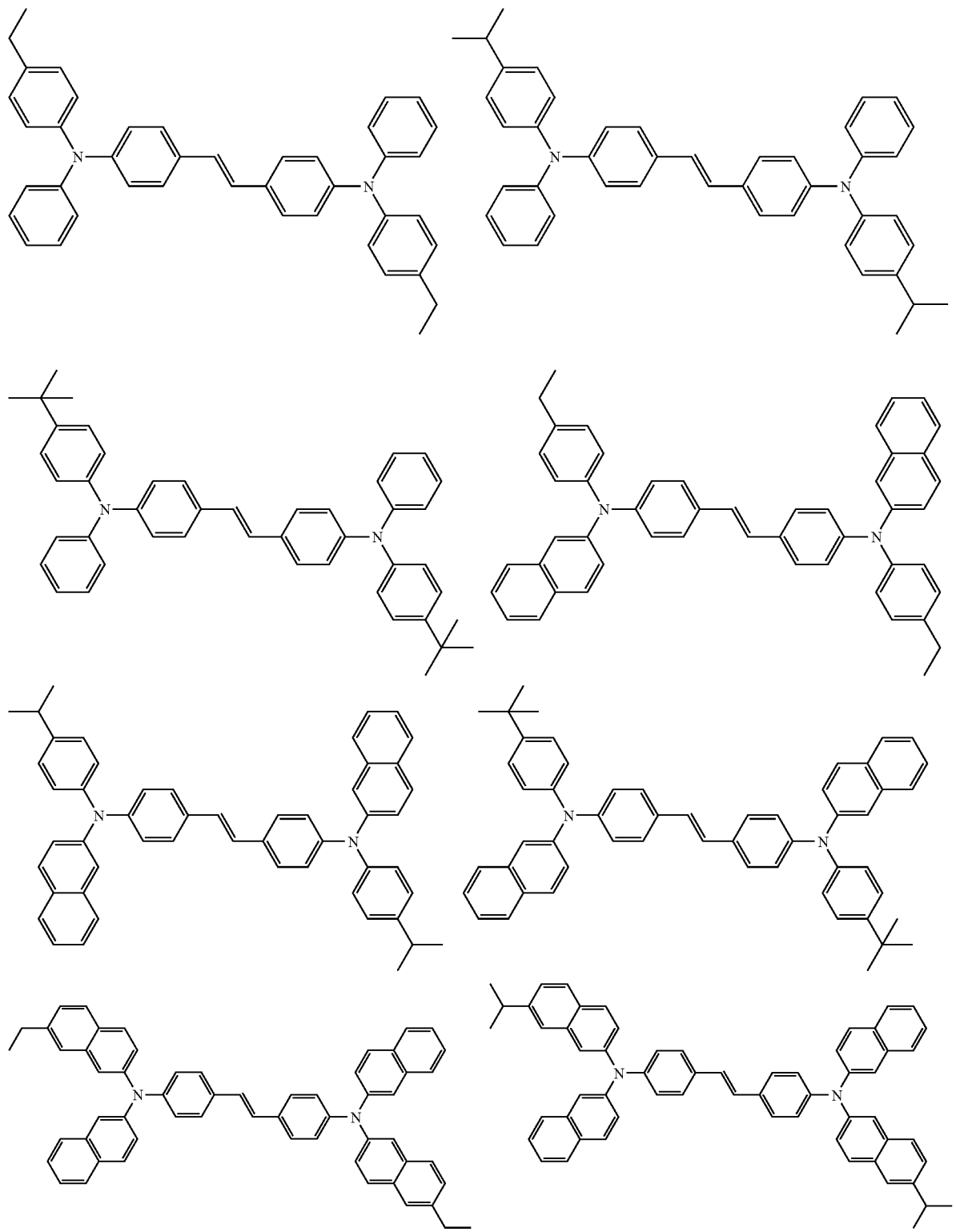

-continued
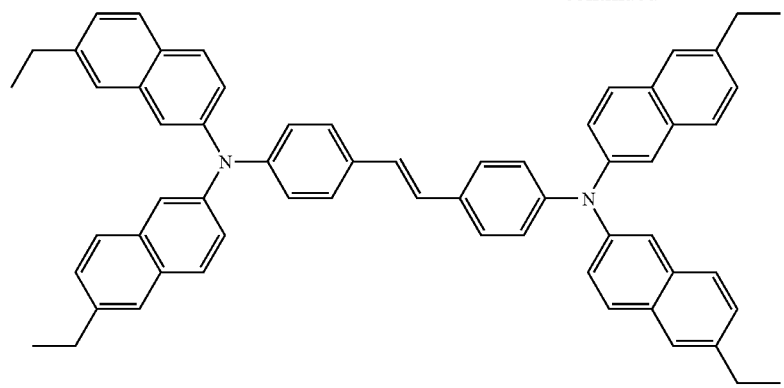
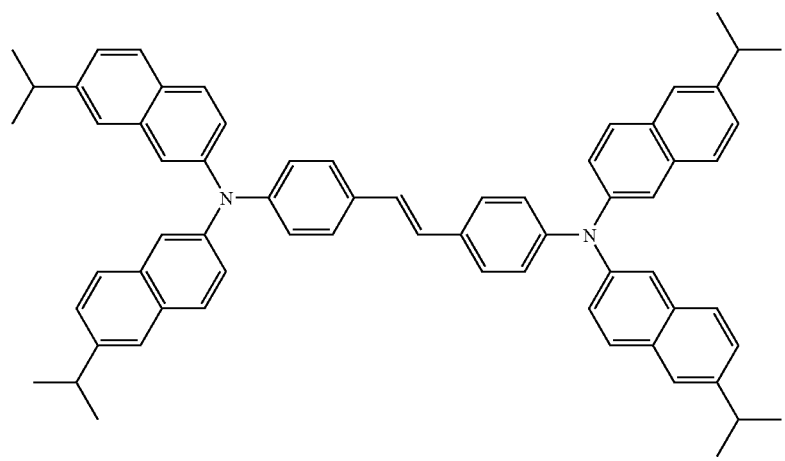
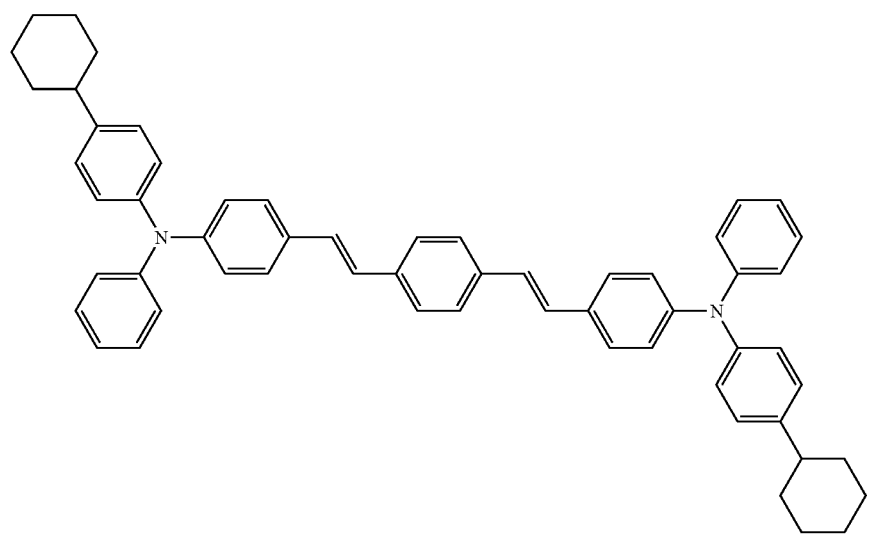

-continued
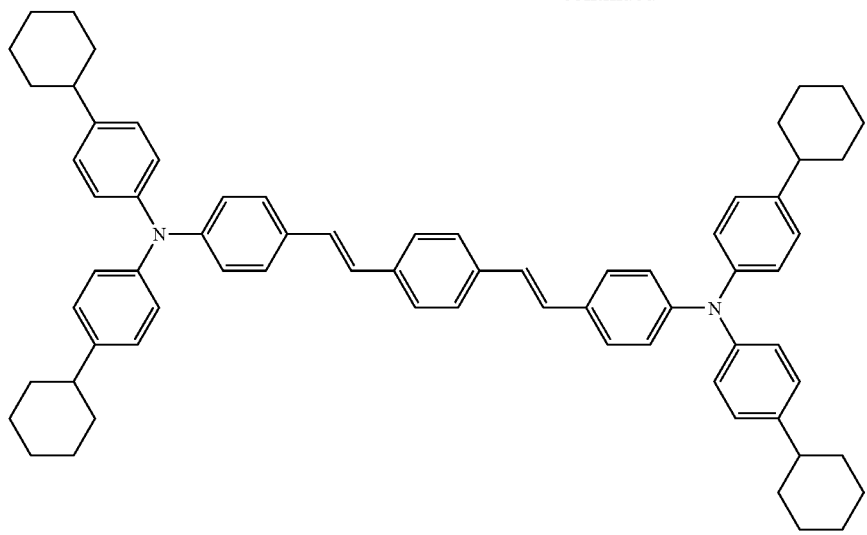
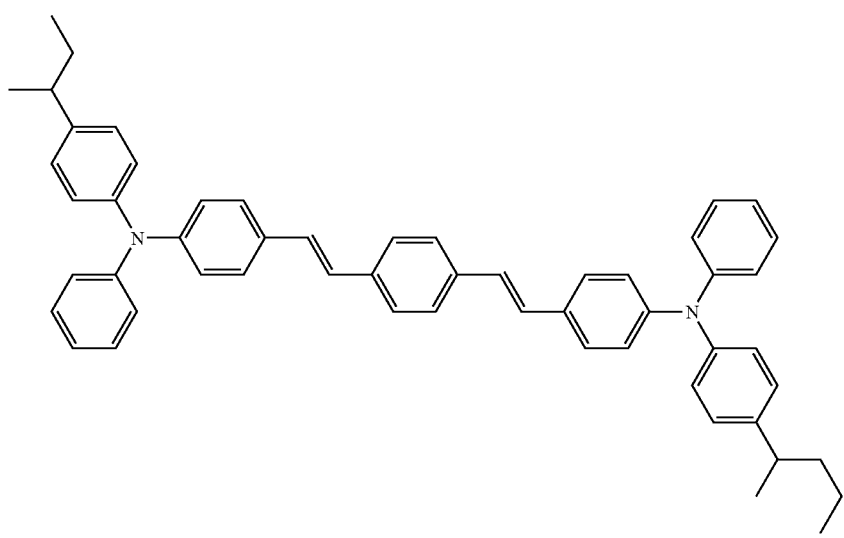
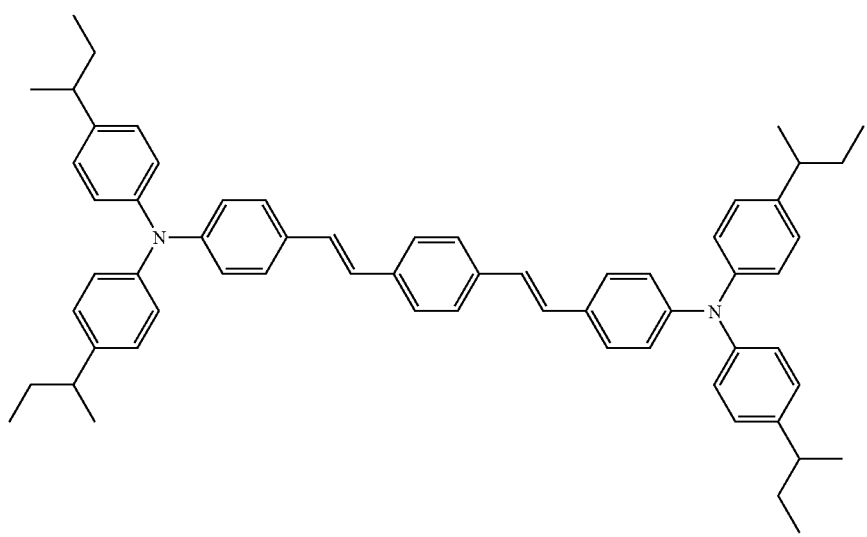

[Chemical Formula 58]
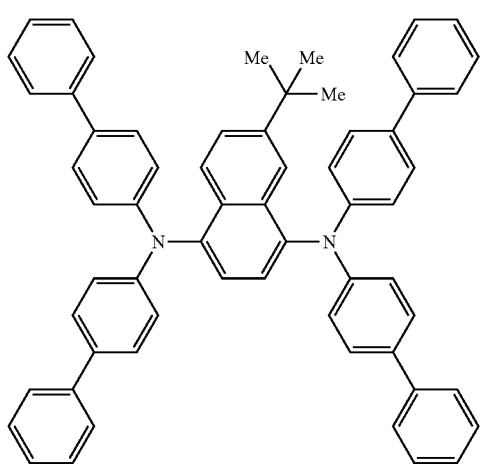
EM126
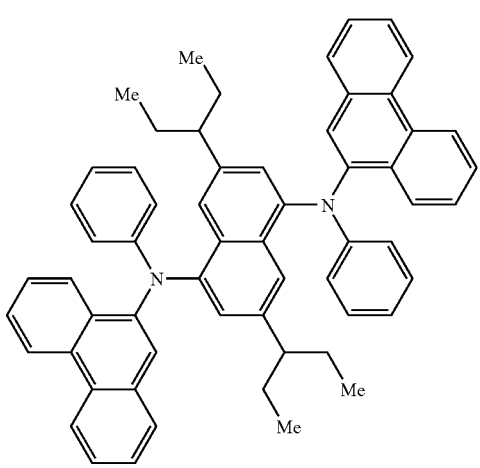
EM127
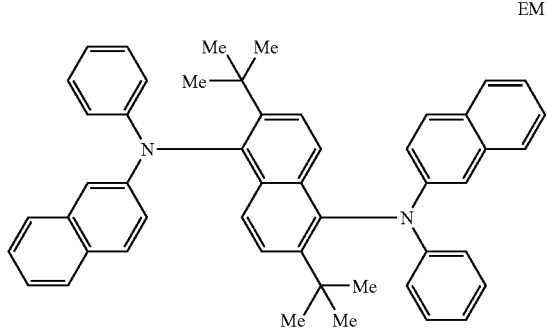
EM128
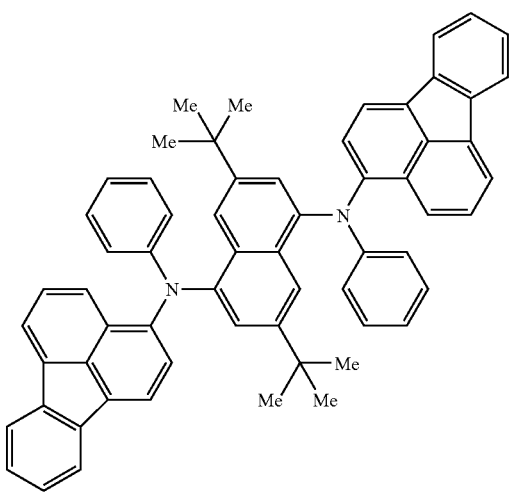
EM129
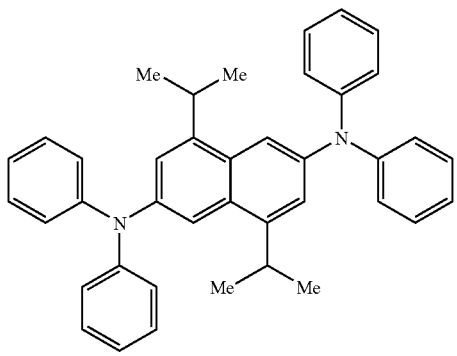
EM130
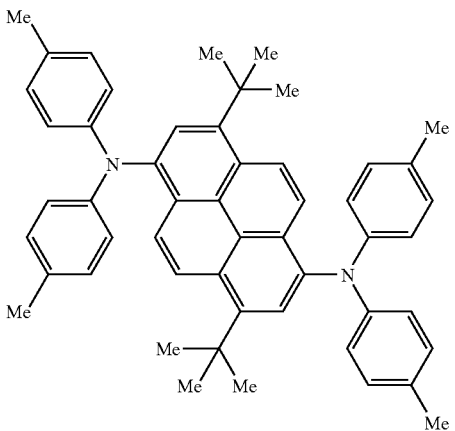
EM131

-continued
EM132
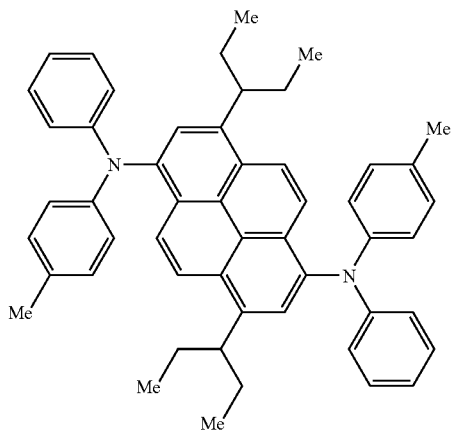
EM133
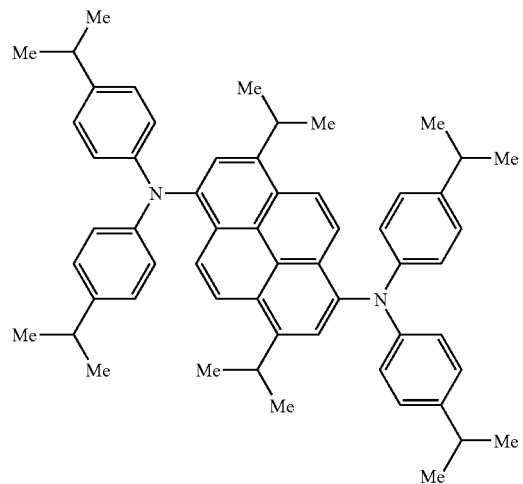
EM134
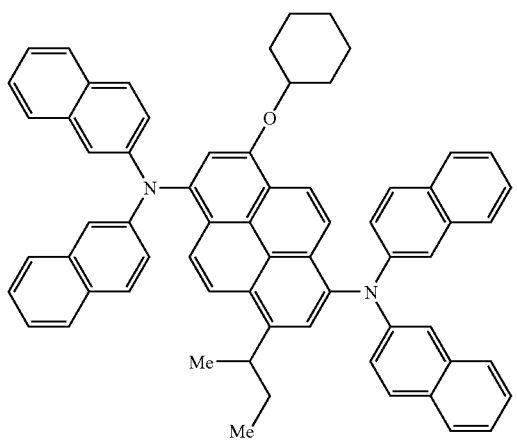
EM135
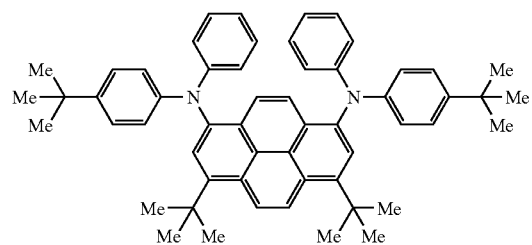
EM136
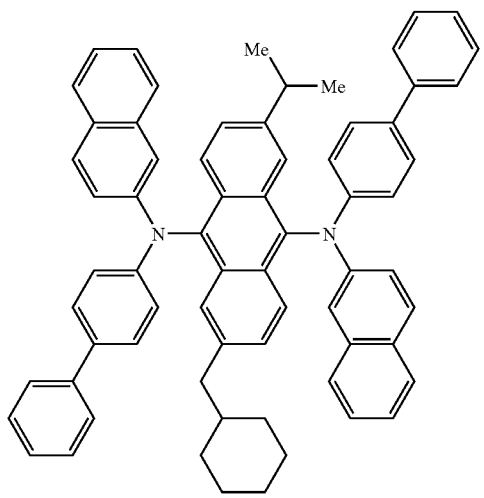
EM137
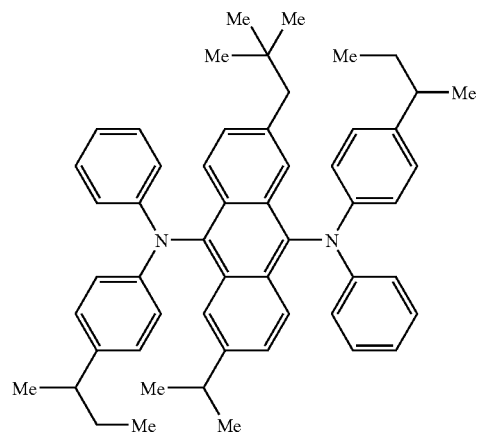

[Chemical Formula 59]
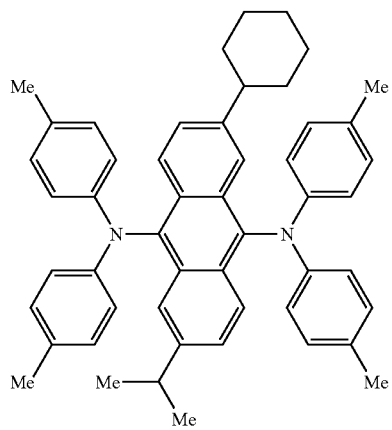
EM138
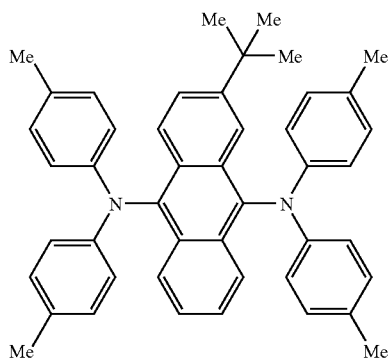
EM139
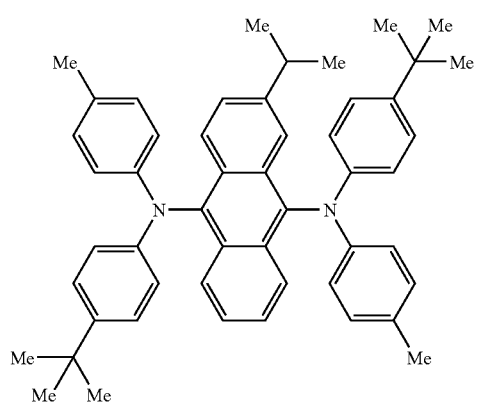
EM140
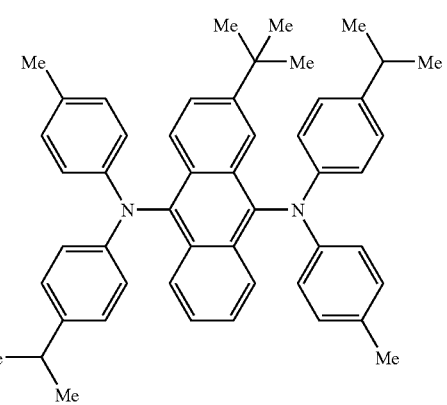
EM141
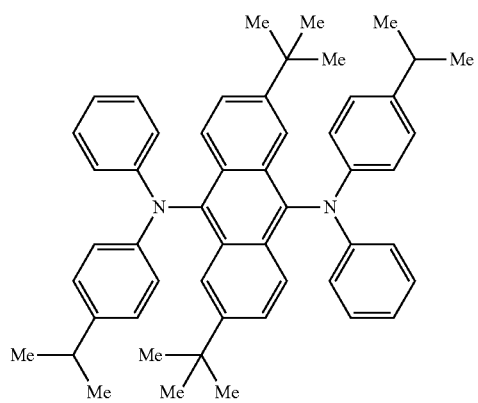
EM142
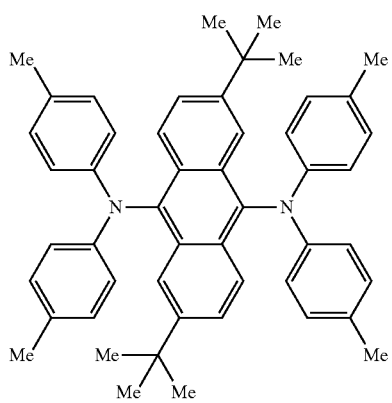
EM143
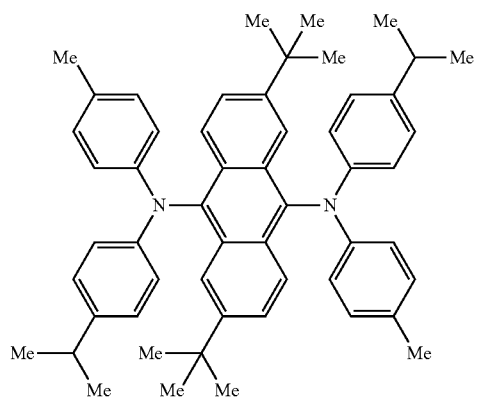
EM144
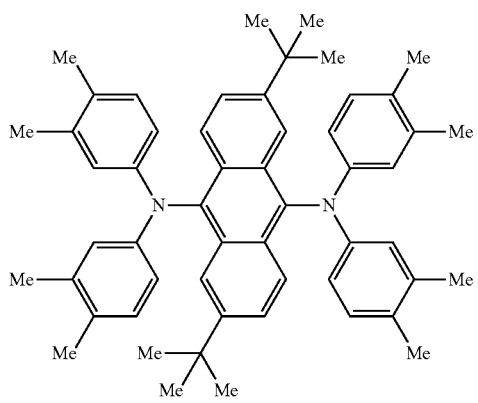
EM145

EM146
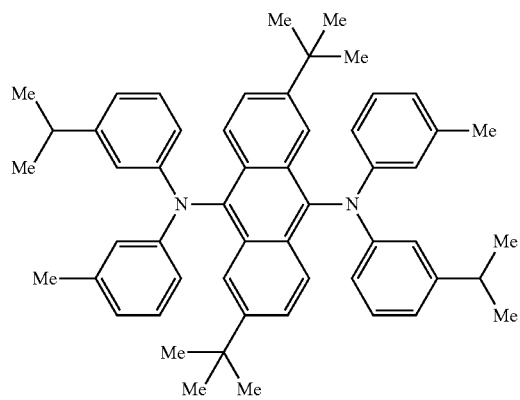
EM147
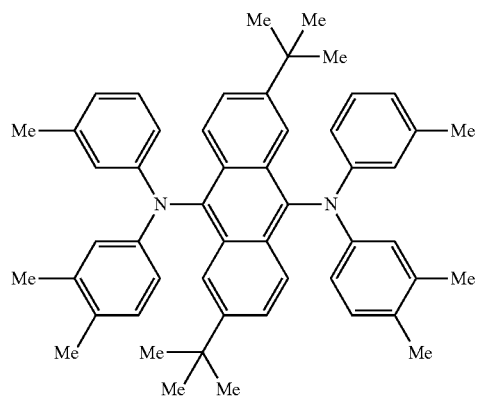
EM148
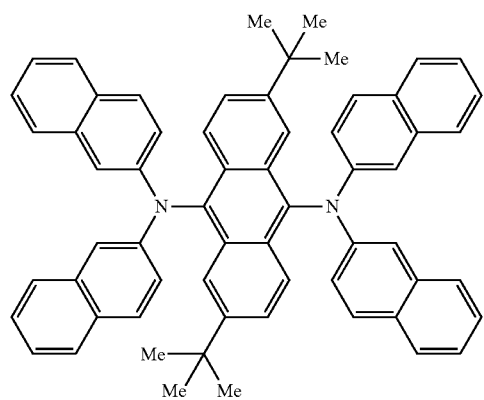
EM149
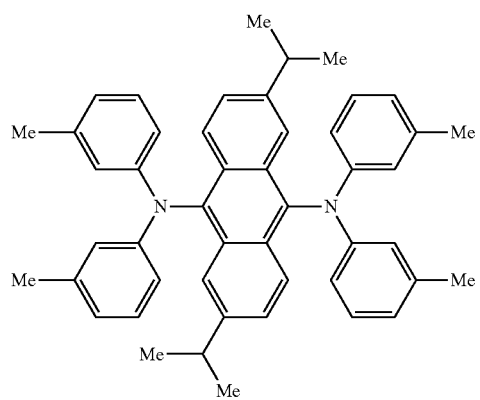
[Chemical Formula 60]
EM150
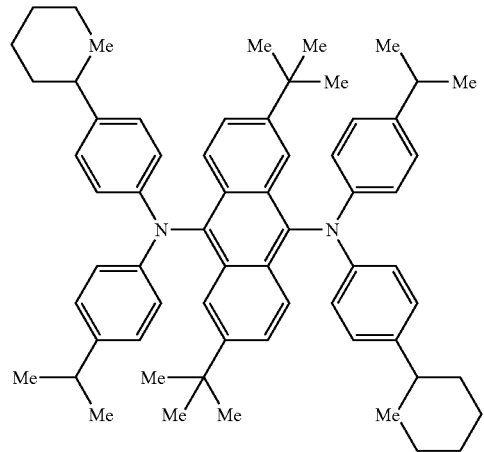
EM151
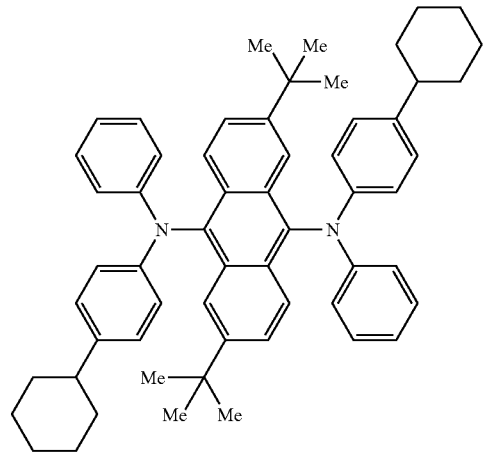

-continued
EM152
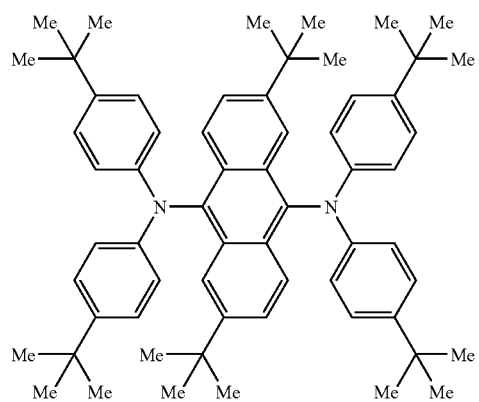
EM153
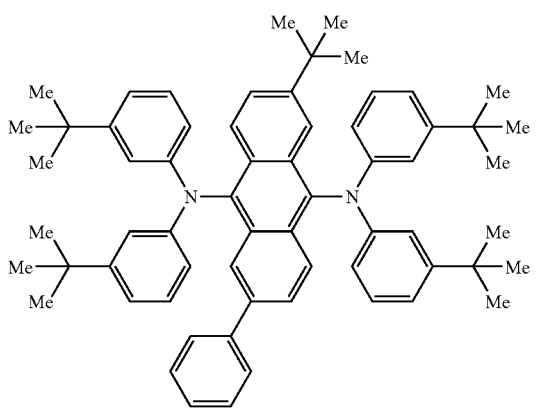
EM154
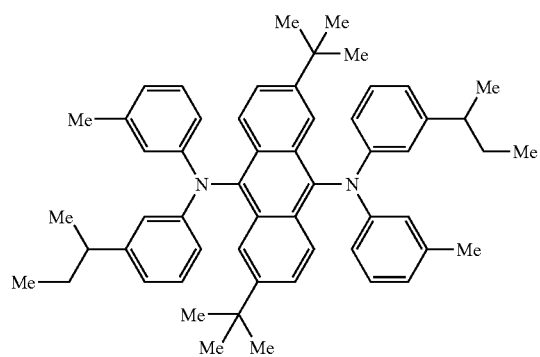
EM155
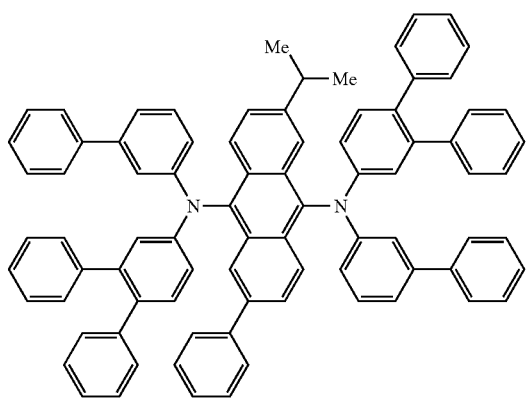
EM156
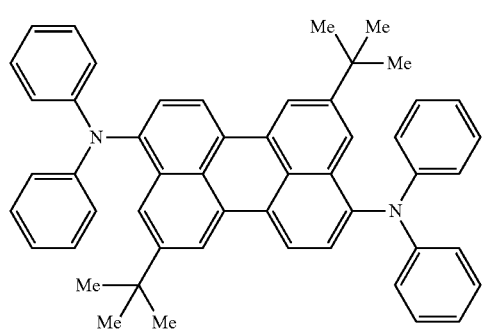
EM157
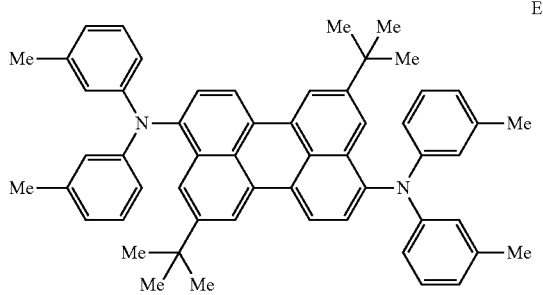
EM158
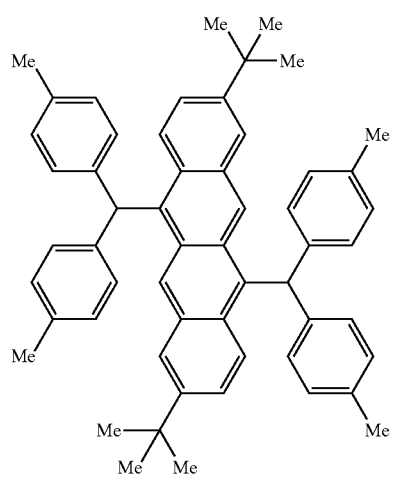
EM159
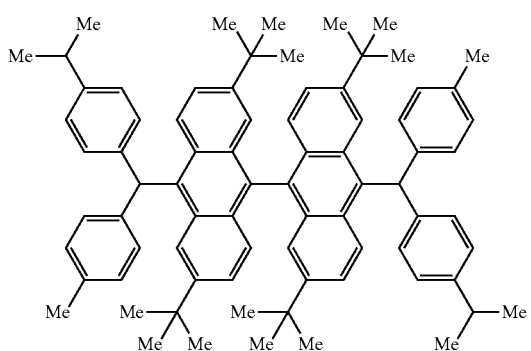

-continued
EM160
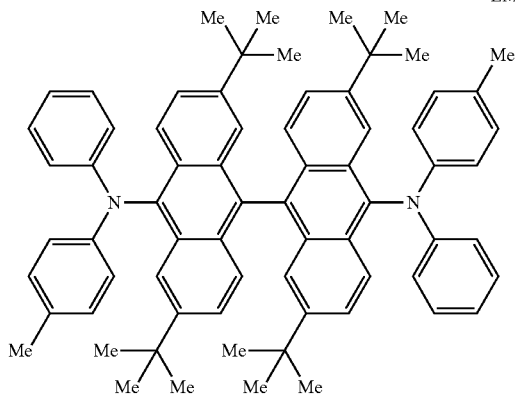
EM161
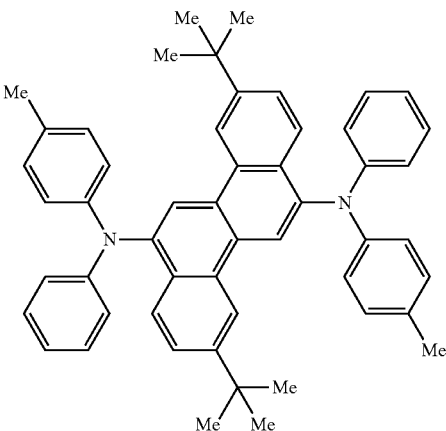
[Chemical Formula 61]
EM162
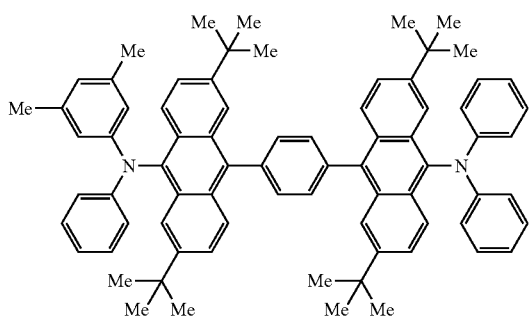
EM163
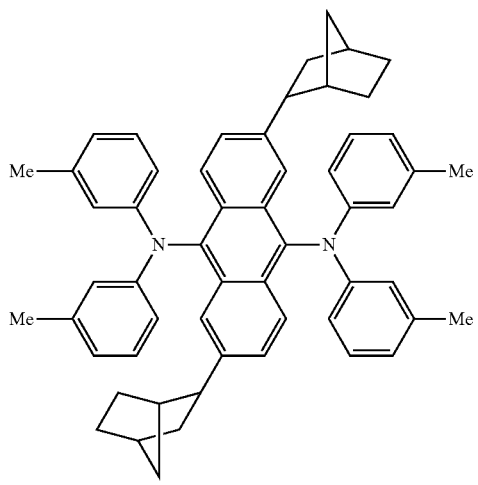
EM164
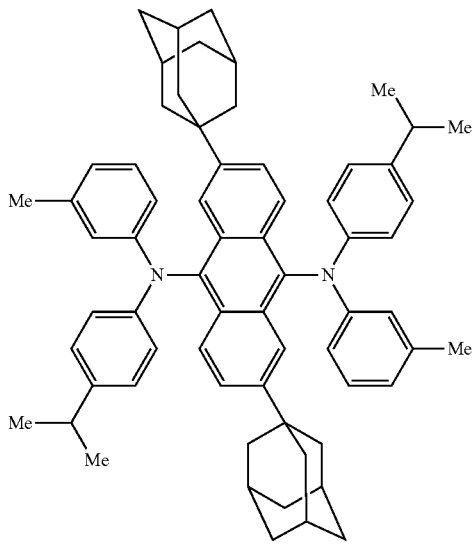
EM165
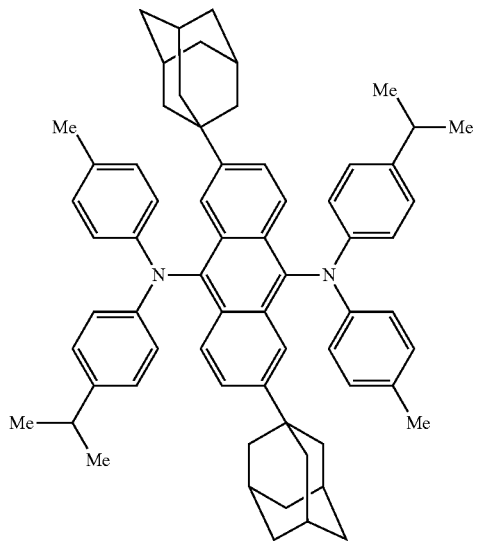

-continued
EM166
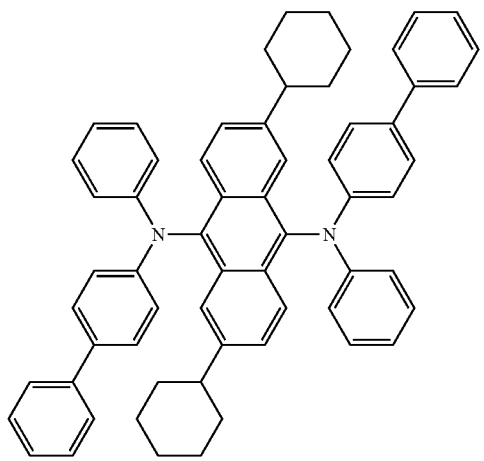
EM167
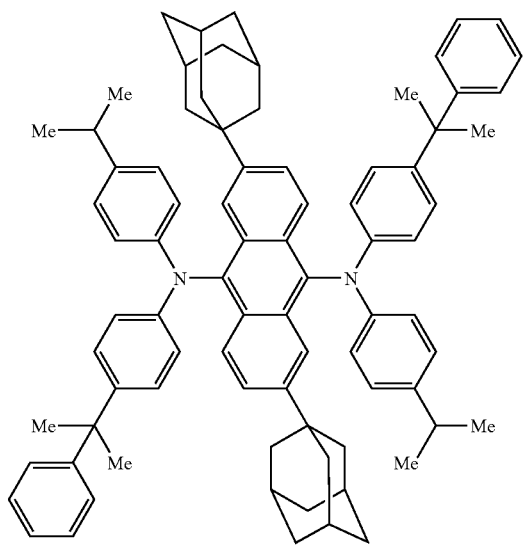
EM168
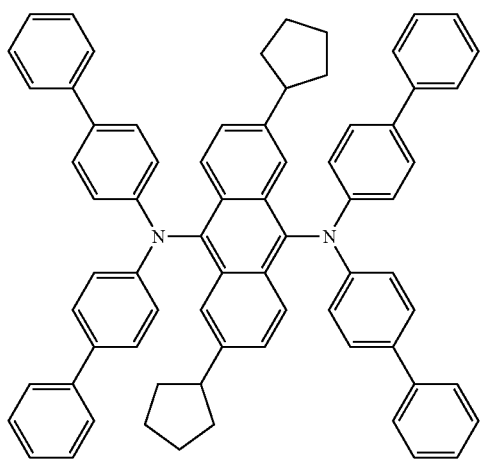
EM169
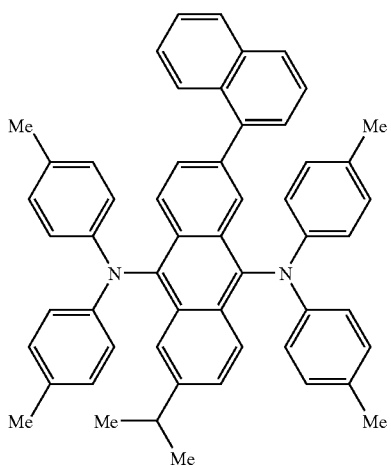
EM170
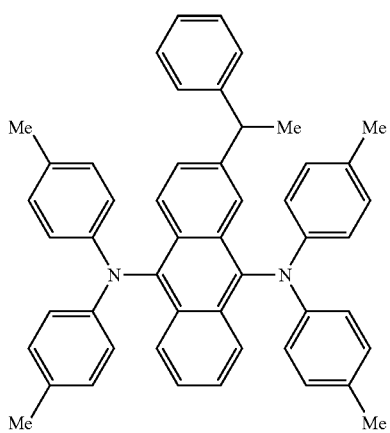
EM171
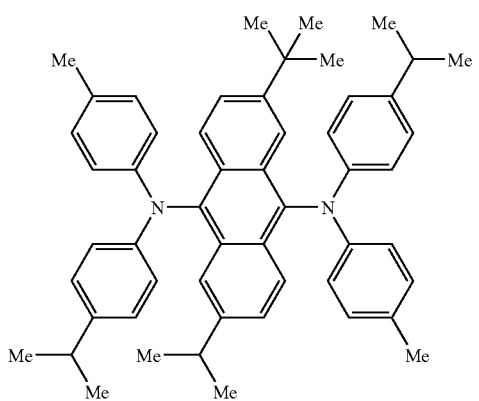

-continued
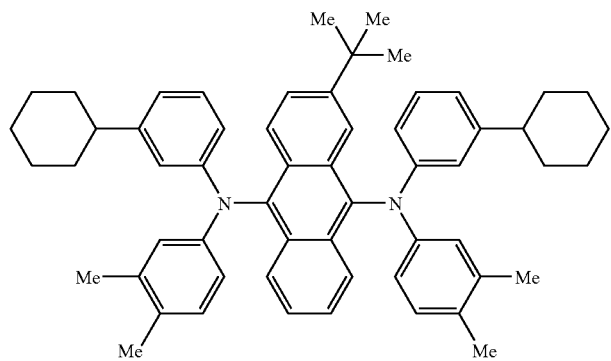
EM172
[Chemical Formula 62]
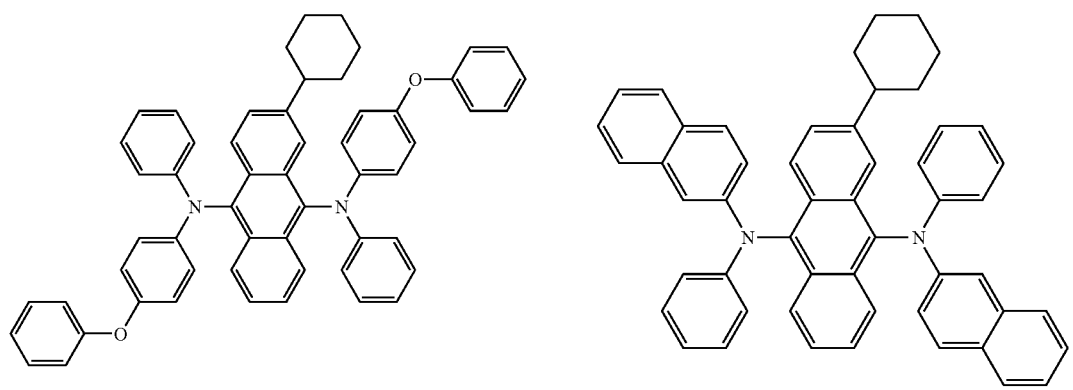
EM173  EM174
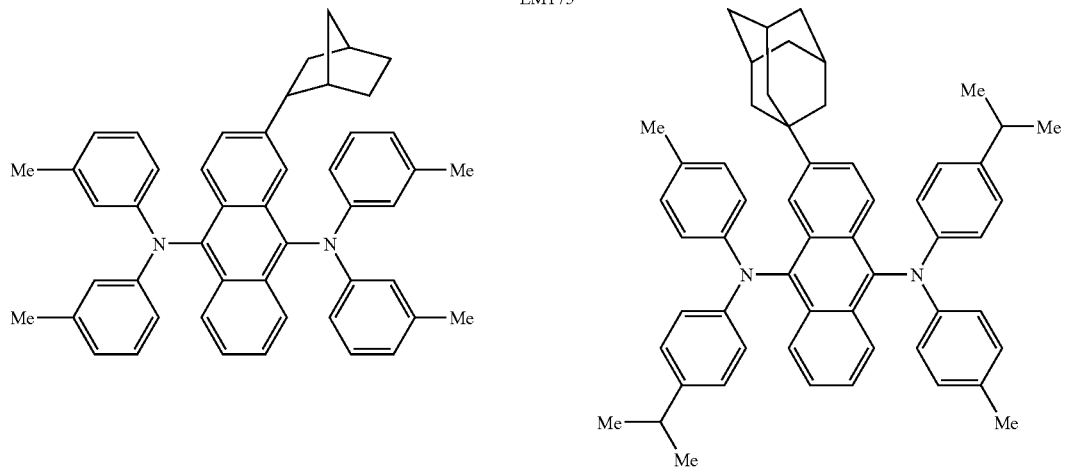
EM175  EM176

-continued
EM177
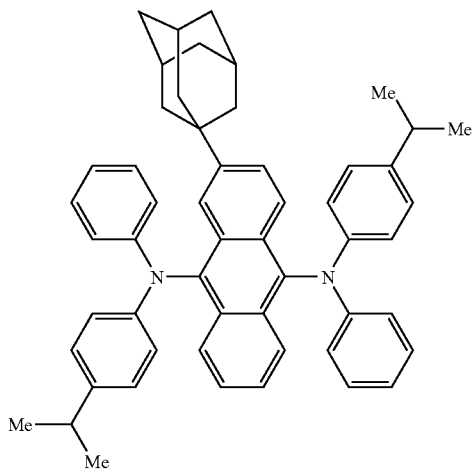
EM178
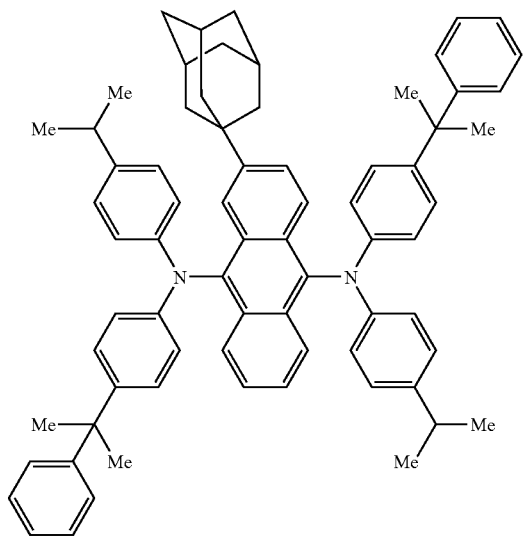
EM179
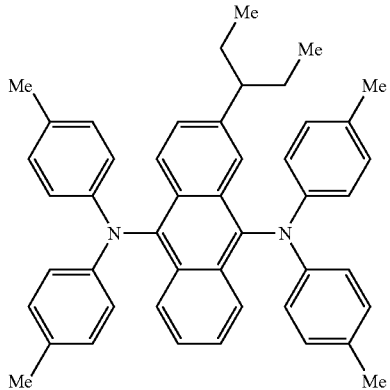
EM180
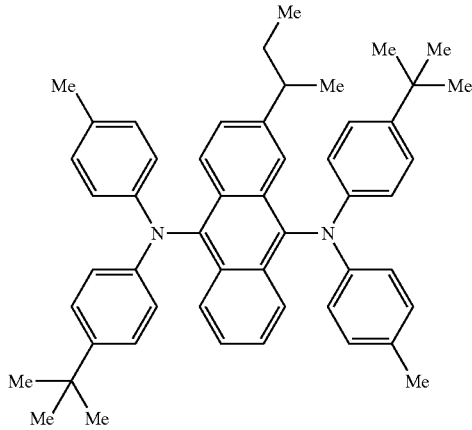
EM181
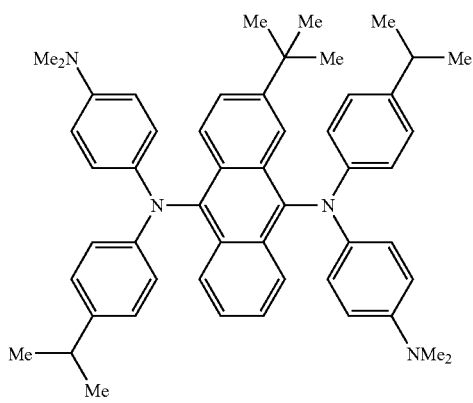
EM182
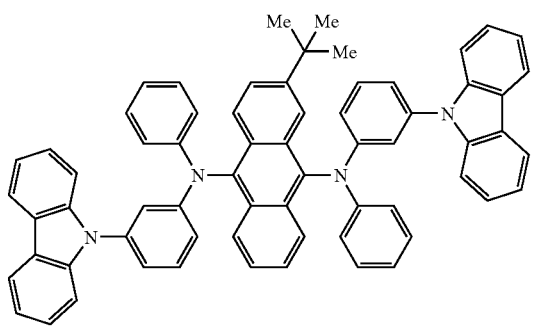

-continued
EM183
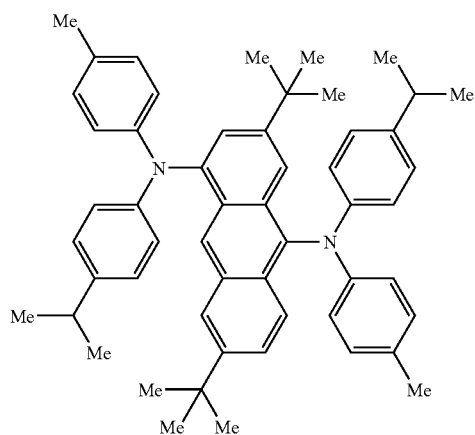
EM184
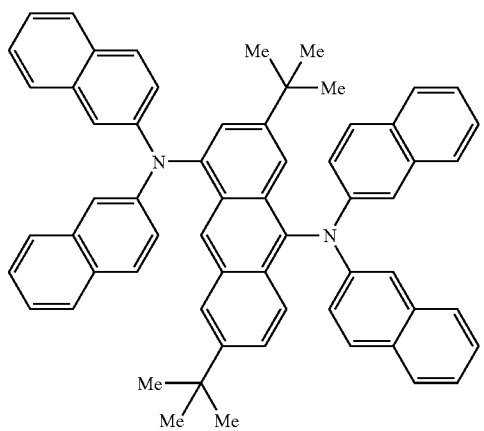
[Chemical Formula 63]
EM185
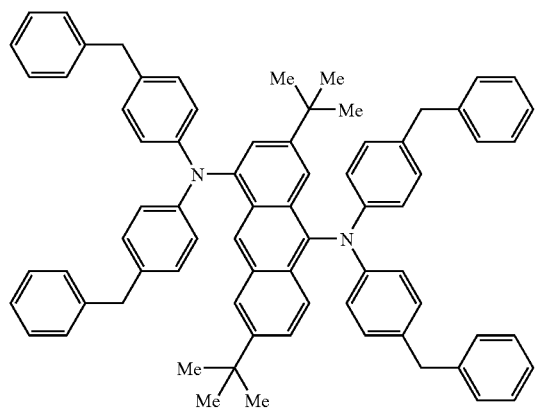
EM186
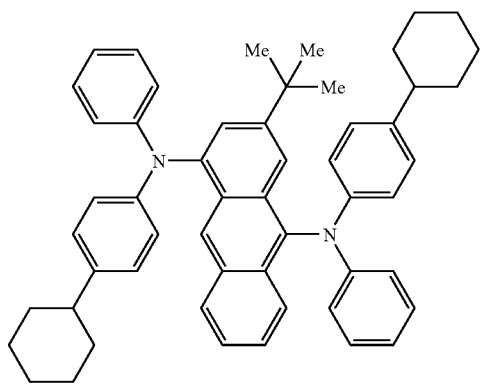
EM187
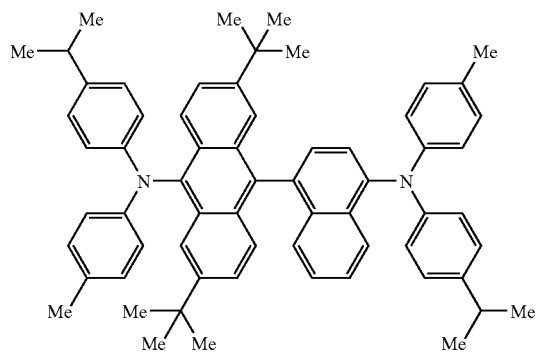
EM188
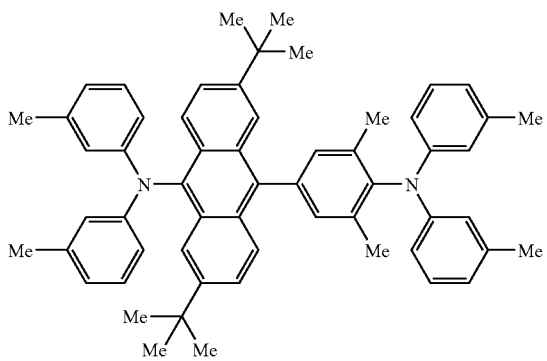
EM189
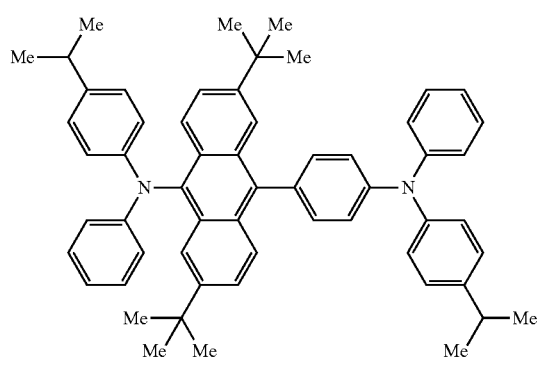
EM190

[Chemical Formula 64]
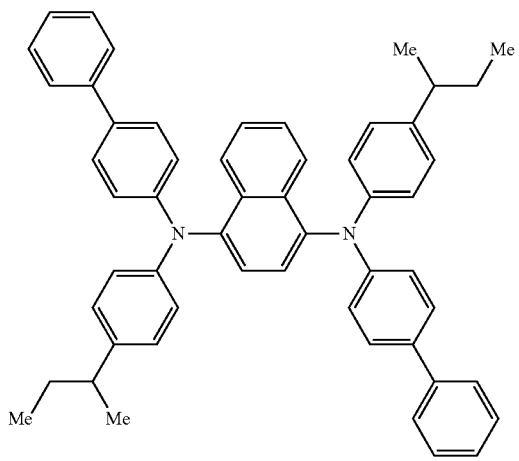
EM191
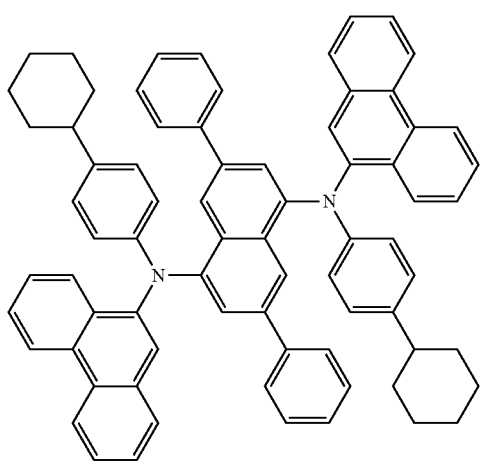
EM192
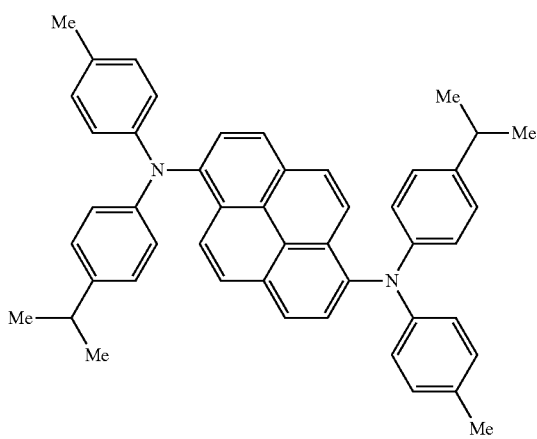
EM193
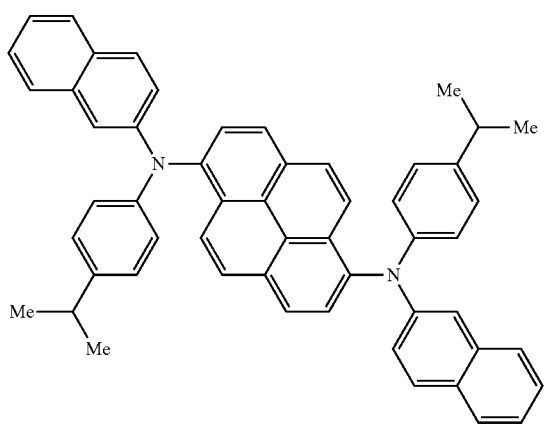
EM194
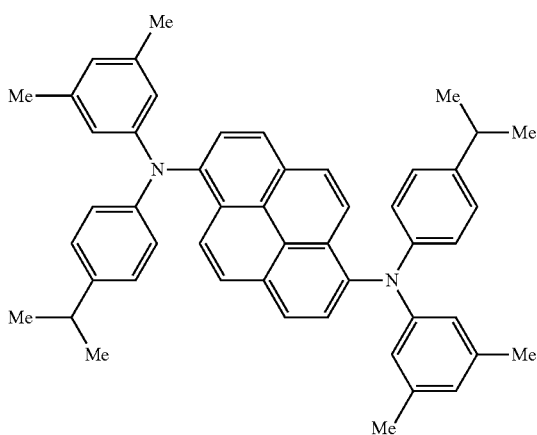
EM195

-continued
EM196
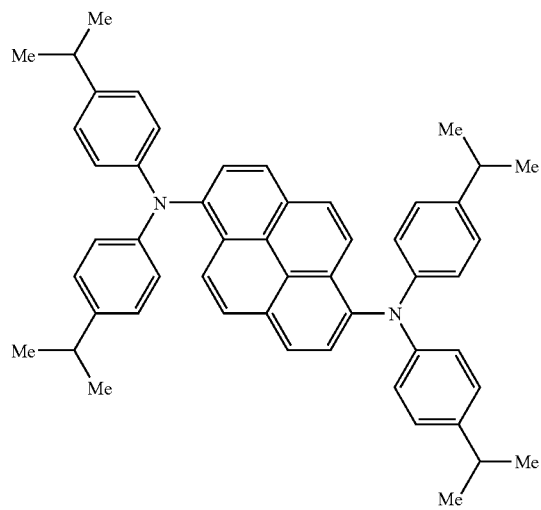
EM197
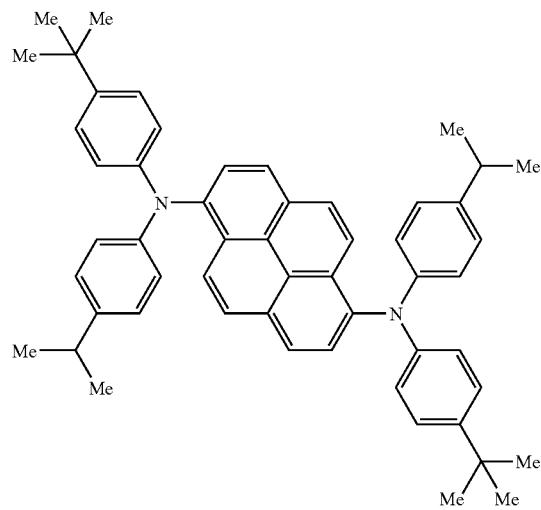
EM198
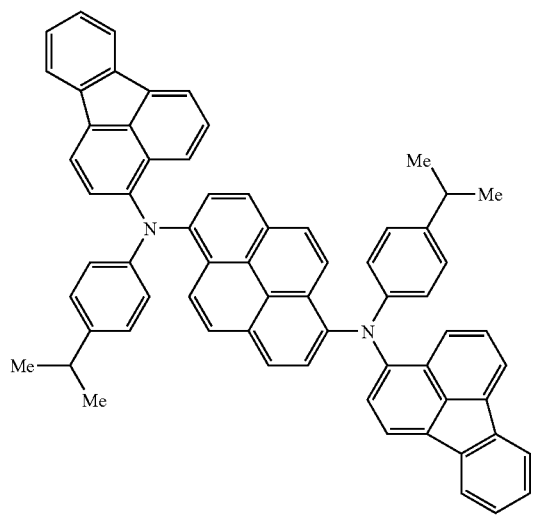
EM199
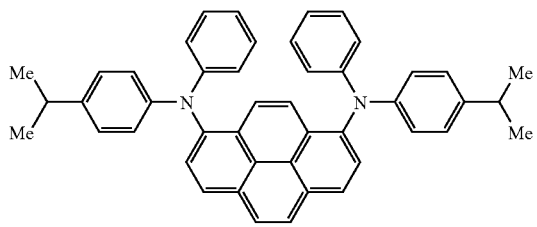
EM200
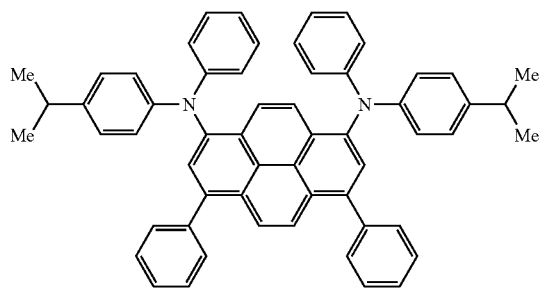
EM201
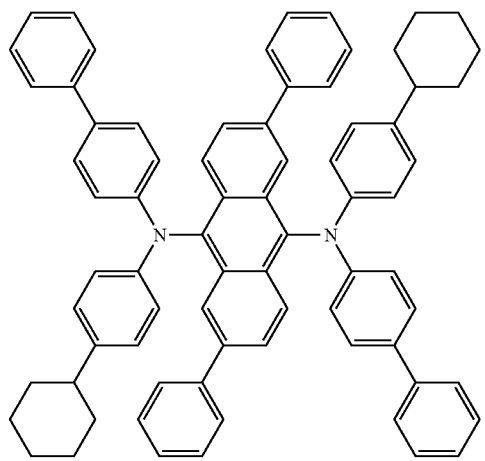

[Chemical Formula 65]
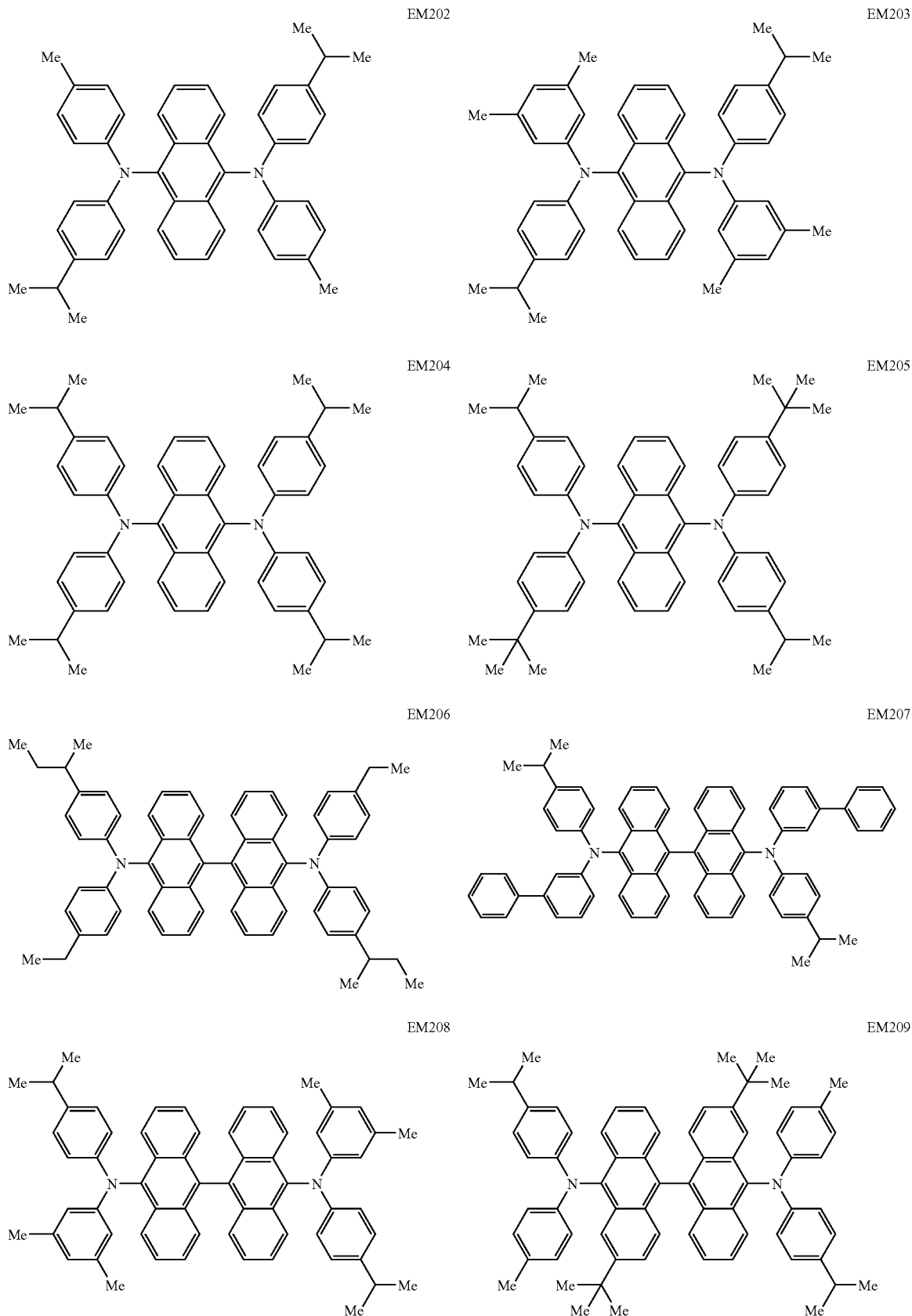

-continued
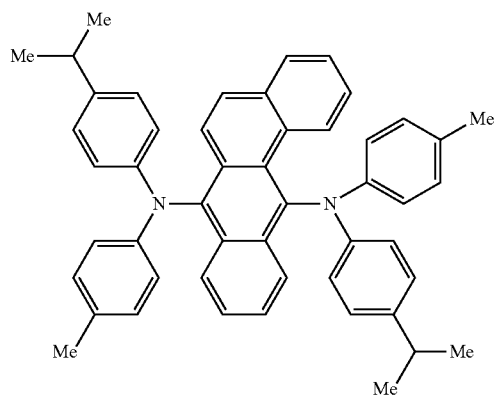
EM210
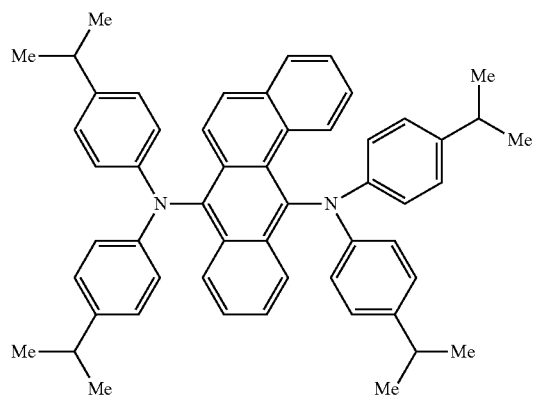
EM211
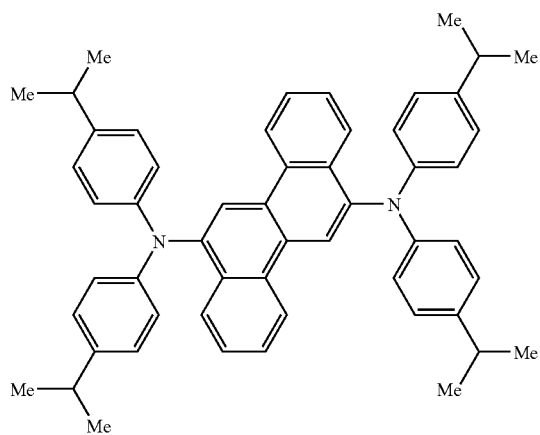
EM212
[Chemical Formula 66]
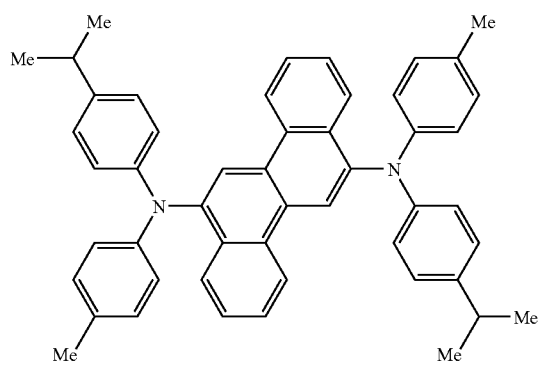
EM213
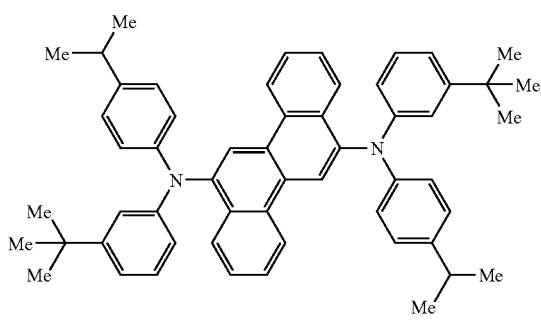
EM214

-continued
EM215
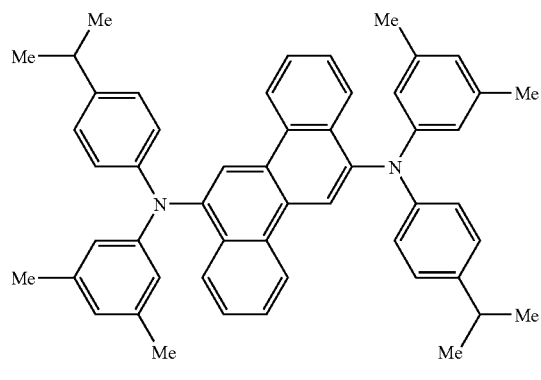
EM216
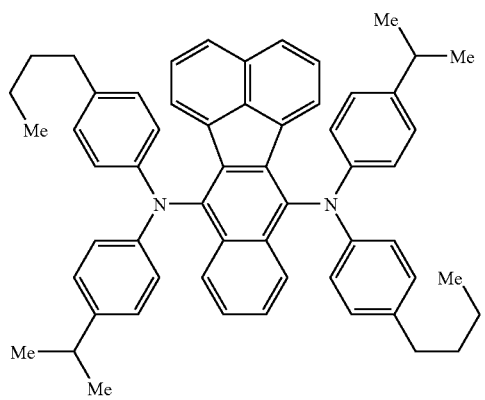
EM217
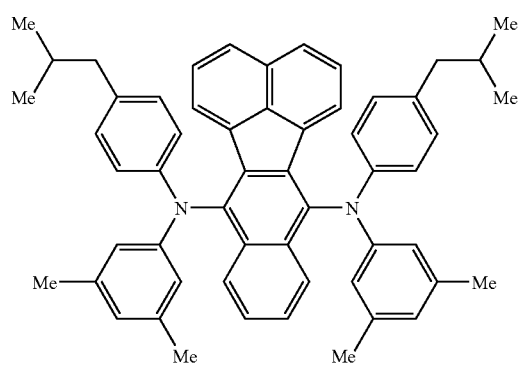
EM218
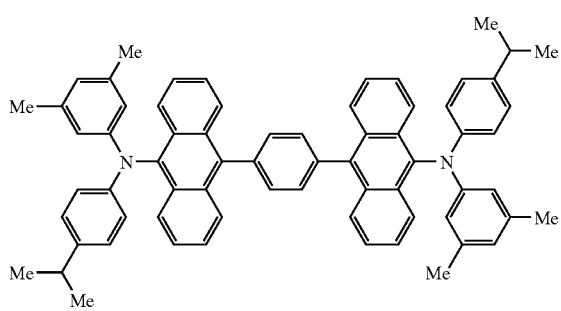
EM219
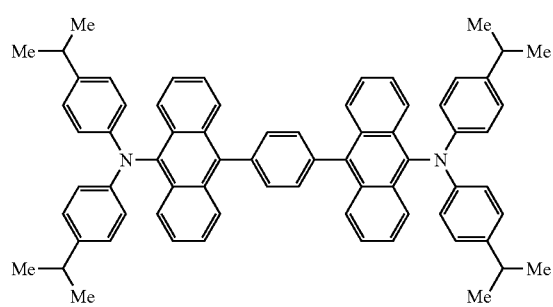
EM220
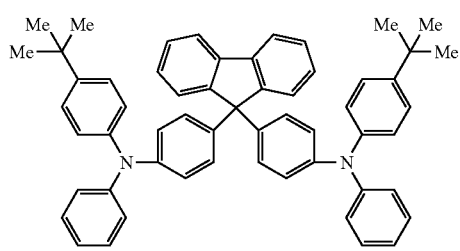
EM221
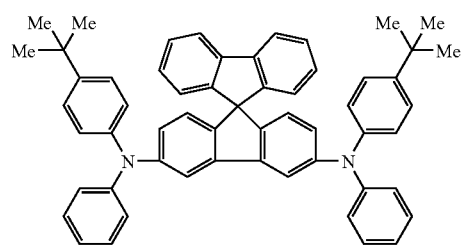
EM222
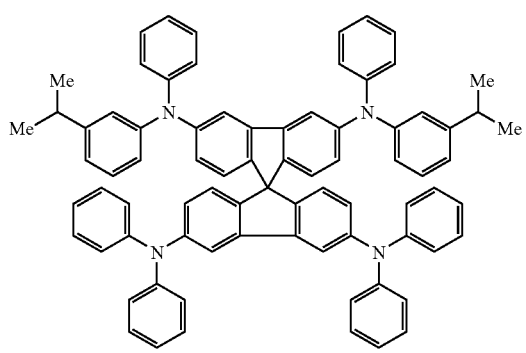

[Chemical Formula 67]
EM223
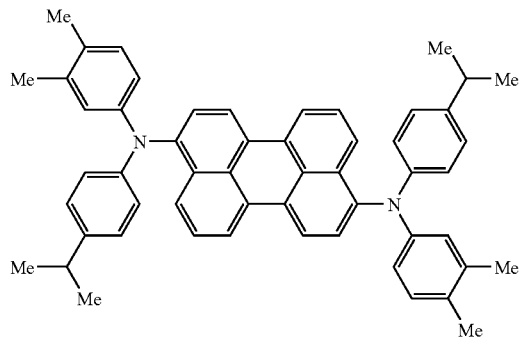
EM224
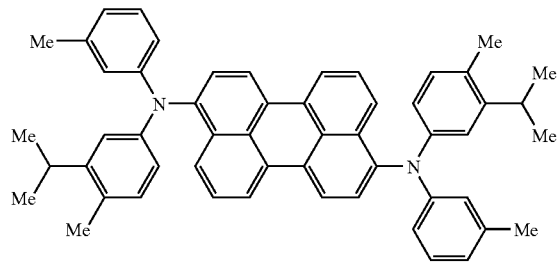
EM225
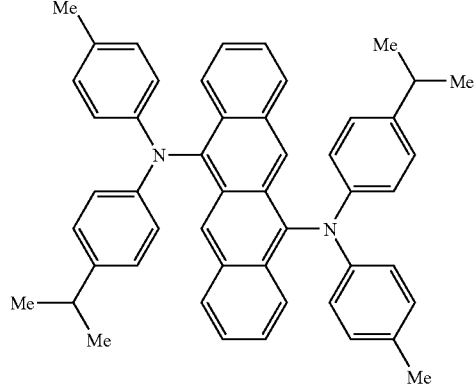
EM226
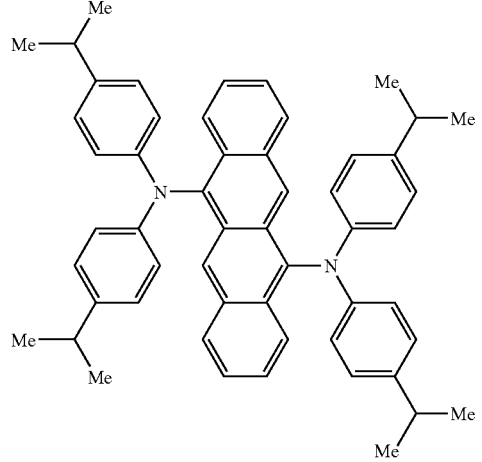
EM227
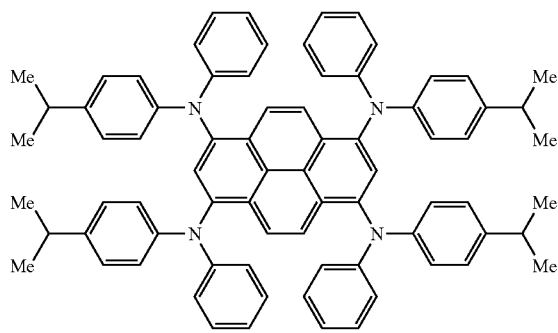
EM228
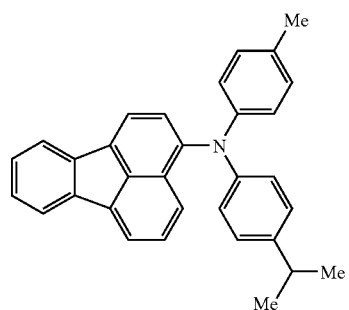
EM229
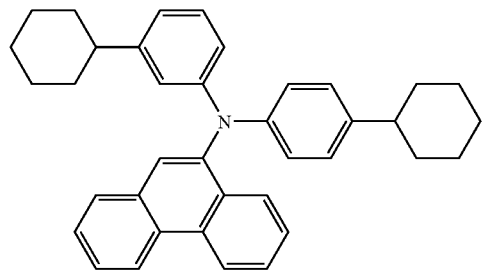
EM230
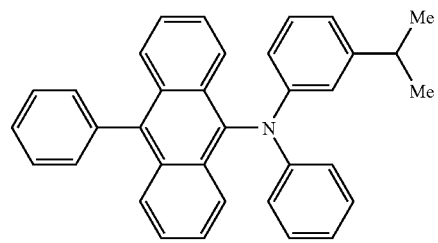

-continued

EM231

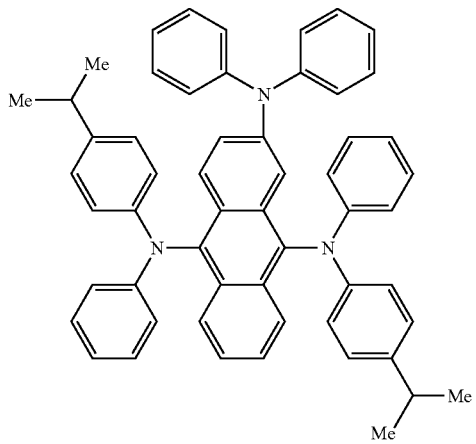

EM232

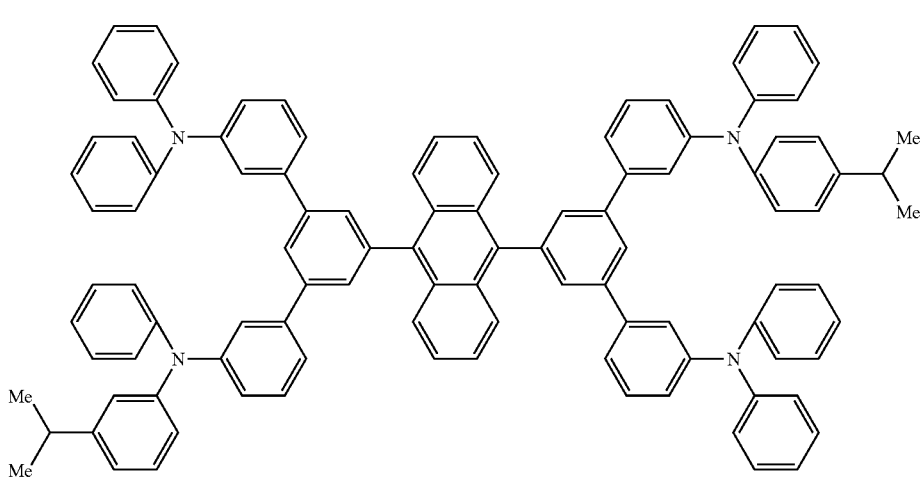

Examples of the dopant used together with the naphthacene host (the formula (5)) are a dopant represented by the above formula (9), preferably a dopant represented by the above formula (10).

In the solvent, a host of 0.5 mass % or more is soluble.

The solvent is the cyclic ketones represented by the above formula (1).

Examples of the cyclic ketones are cyclohexanone derivatives and the like.

The organic electroluminescent material-containing solution preferably contains the viscosity control reagent.

Examples of the viscosity control reagent are alcohol-based solutions, ketone-based solutions, paraffin-based solutions and alkyl-substituted aromatic solutions. The viscosity control reagent is preferably the alcohol-based solutions and the alkyl-substituted aromatic solutions.

Examples of the alcohol-based solutions are methanol, ethanol, propanol, n-butanol, s-butanol, 2-methyl-1-butanol, 2-methyl-2-butanol, 3-methyl-2-butanol, t-butanol, n-pentanol, 4-methyl-2-pentanol, 3-methyl-1-pentine-3-ol, n-hexanol, 2-ethylhexanol, 3,5-dimethyl-1-hexine-3-ol, n-heptanol, 3,3,5-trimethyl-hexanol, 3-heptanol, n-octanol, 2-octanol, n-nonanol, n-decanol, methylcyclohexanol, cyclohexanol, α-terpineol, neopentyl alcohol, glycidol, methyl cellosolve, ethyl cellosolve, ethylene glycol, propanediol, butanediol and benzyl alcohol. The above alcohols may be of a linear structure or of a branched structure.

Examples of the alkyl-substituted aromatic solutions are linear or branched butyl benzene, dodecyl benzene, tetralin, cyclohexyl benzene, dicyclohexyl benzene, 1,1-bis(3,4-dimethylphenyl)ethane and 3-methyl diphenyl ether.

As the viscosity control reagent, one of the above examples may be singularly used, or a mixture of a plurality thereof may be used.

EXAMPLE

Example(s) and Comparative(s) of the present invention will be described below.

(Solubility Evaluation 1)

30 mg of each of anthracene compounds 1 to 14 represented by the following formulae was put into a sample bottle, and 1 g of each of various solvents was dropped into the bottle with agitation. By visual check, a case where it was confirmed that the compounds were dissolved in the dropped solvents is marked as A and a case where the compounds were not completely dissolved and undissolved residues remained is marked as C. Results of solubility evaluation will be shown in Tables 1 and 2 below.

TABLE 1
[Chemical Formula 69]
Compound 1
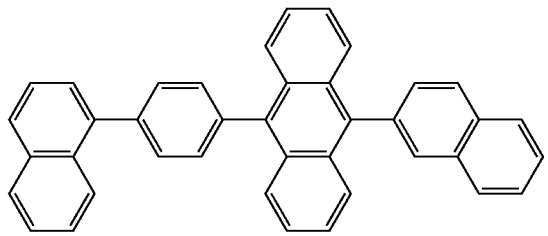 [SMILES: c1ccc2cc(-c3c4ccccc4c(-c4ccc(-c5cccc6ccccc56)cc4)c4ccccc34)ccc2c1]
Compound 2
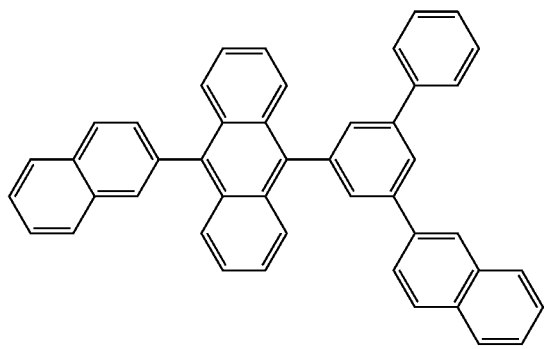 [SMILES: c1ccc(-c2cc(-c3ccc4ccccc4c3)cc(-c3c4ccccc4c(-c4ccc5ccccc5c4)c4ccccc34)c2)cc1]
Compound 3
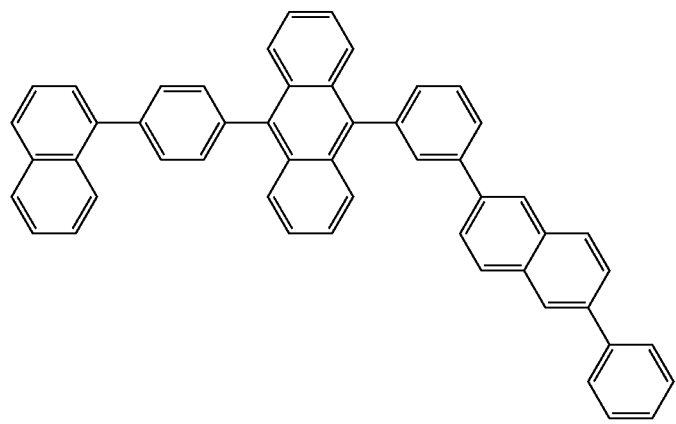 [SMILES: c1ccc(-c2ccc3cc(-c4cccc(-c5c6ccccc6c(-c6ccc(-c7cccc8ccccc78)cc6)c6ccccc56)c4)ccc3c2)cc1]
Compound 4
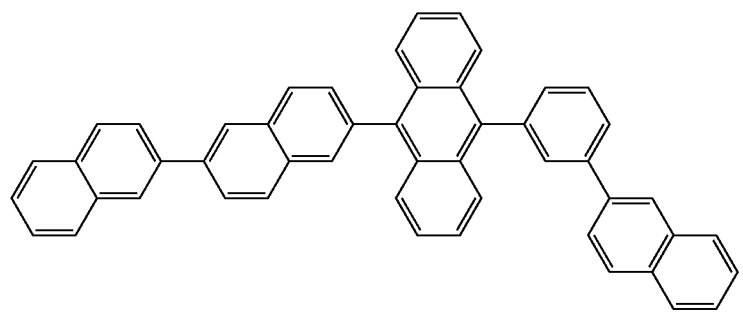 [SMILES: c1cc(-c2ccc3ccccc3c2)cc(-c2c3ccccc3c(-c3ccc4cc(-c5ccc6ccccc6c5)ccc4c3)c3ccccc23)c1]

TABLE 1-continued
[Chemical Formula 69]
Compound 5
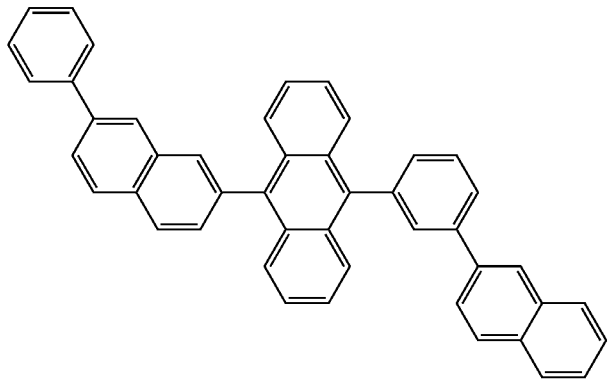 [SMILES: c1ccc(-c2ccc3ccc(-c4c5ccccc5c(-c5cccc(-c6ccc7ccccc7c6)c5)c5ccccc45)cc3c2)cc1]
Compound 6
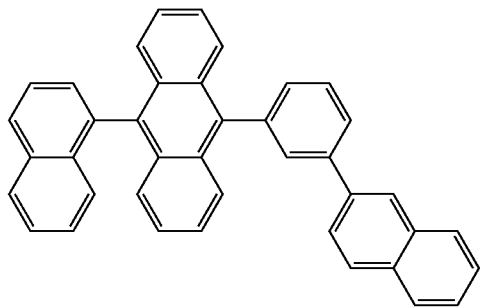 [SMILES: c1cc(-c2ccc3ccccc3c2)cc(-c2c3ccccc3c(-c3cccc4ccccc34)c3ccccc23)c1]
Compound 7
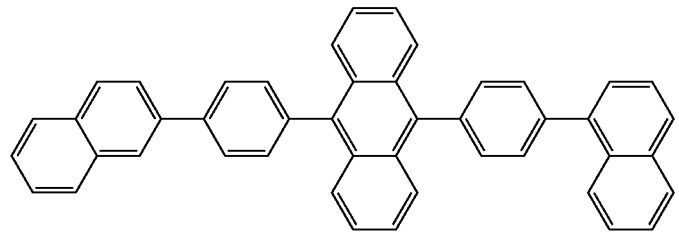 [SMILES: c1ccc2cc(-c3ccc(-c4c5ccccc5c(-c5ccc(-c6cccc7ccccc67)cc5)c5ccccc45)cc3)ccc2c1]
Compound 8
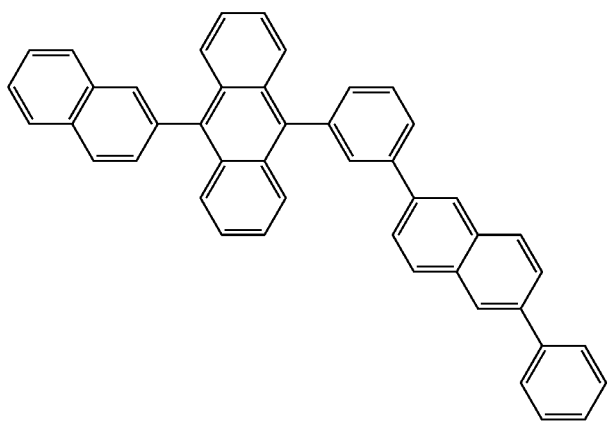 [SMILES: c1ccc(-c2ccc3cc(-c4cccc(-c5c6ccccc6c(-c6ccc7ccccc7c6)c6ccccc56)c4)ccc3c2)cc1]

TABLE 1-continued

[Chemical Formula 69]

Compound 9

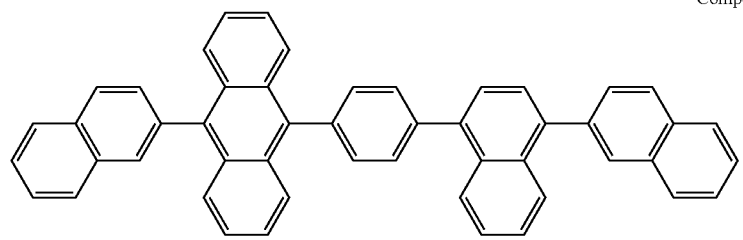

Compound 10

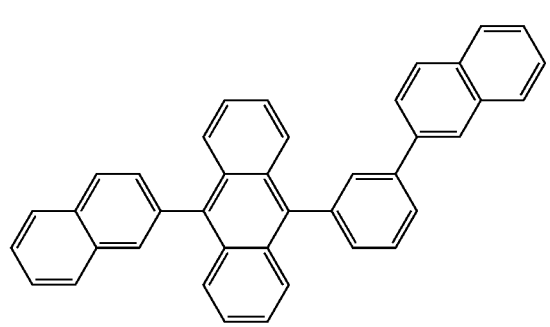 [SMILES: c1cc(-c2ccc3ccccc3c2)cc(-c2c3ccccc3c(-c3ccc4ccccc4c3)c3ccccc23)c1]

| | Compound | | | | | | | | | |
|---|---|---|---|---|---|---|---|---|---|---|
| | 1 | 2 | 3 | 4 | 5 | 6 | 7 | 8 | 9 | 10 |
| Cyclohexanone | A | A | A | A | A | A | A | A | A | A |
| Toluene | A | A | A | C | C | C | A | C | C | A |
| Xylene | A | A | A | C | C | C | A | C | C | A |
| Tetralin | C | C | C | C | C | C | C | C | C | C |
| Dodecylbenzene | C | C | C | C | C | C | C | C | C | C |
| Anisole | C | C | C | C | C | C | C | C | C | C |
| Dioxane | A | A | A | C | C | C | A | C | C | C |
| ButylAcetate | C | C | C | C | C | C | C | C | C | C |
| Methylethylketone | C | C | C | C | C | C | C | C | C | C |
| N-methylpyrolidone | A | A | A | A | A | A | A | A | A | A |

TABLE 2

[Chemical Formula 70]

Compound 11

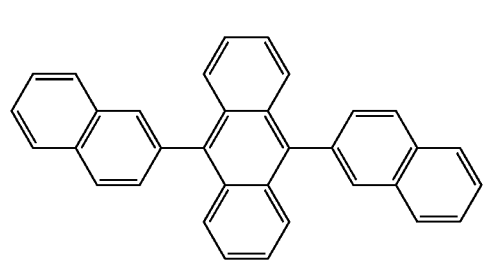 [SMILES: c1ccc2cc(-c3c4ccccc4c(-c4ccc5ccccc5c4)c4ccccc34)ccc2c1]

TABLE 2-continued

[Chemical Formula 70]

Compound 12

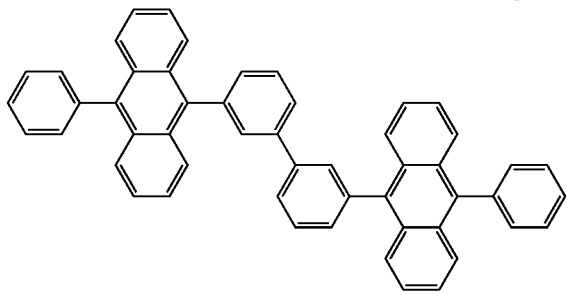 [SMILES: c1ccc(-c2c3ccccc3c(-c3cccc(-c4cccc(-c5c6ccccc6c(-c6ccccc6)c6ccccc56)c4)c3)c3ccccc23)cc1]

TABLE 2-continued

[Chemical Formula 70]

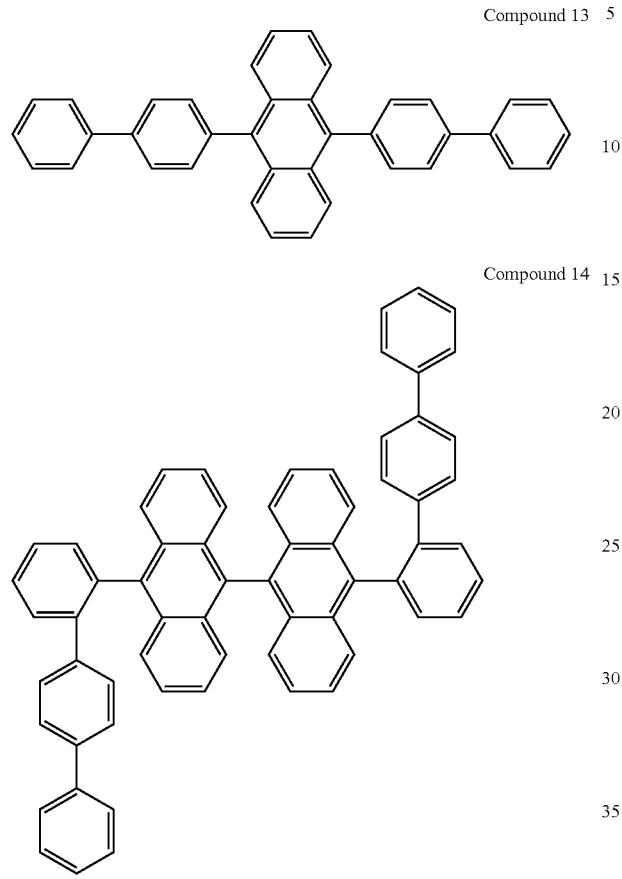

Compound 13

Compound 14

| | Compound | | | |
|---|---|---|---|---|
| | 11 | 12 | 13 | 14 |
| Cyclohexanone | C | C | C | A |
| Toluene | C | C | C | A |
| Xylene | C | C | C | C |
| Tetralin | C | C | C | C |
| Dodecylbenzene | C | C | C | C |
| Anisole | C | C | C | C |
| Dioxane | C | C | C | A |
| Butyl Acetate | C | C | C | C |
| Methylethylketone | C | C | C | C |
| N-methylpyrolidone | C | C | C | A |

As is understood from Tables 1 and 2, cyclohexanone and NMP (N-methylpyrrolidone) exhibited favorable solubility in anthracene compounds in a broad range except the compounds 11 to 13, and storage stability of the solutions was also favorable (precipitation of solids was not observed even after a week).

(Solubility Evaluation 2)

Next, naphthacene compounds 15 and 16 were used in place of the anthracene compounds, and the solubility was evaluated in the same manner as the above. Same as in Solubility Evaluation 1, by visual check, a case where it was confirmed that the compounds were dissolved in the dropped solvents is marked as A and a case where the compounds were not completely dissolved and undissolved residues remained is marked as C. Moreover, a case where precipitation was observed after several hours of dissolution is marked as B. Result of solubility evaluation will be shown in Table 3 below.

TABLE 3

[Chemical Formula 71]

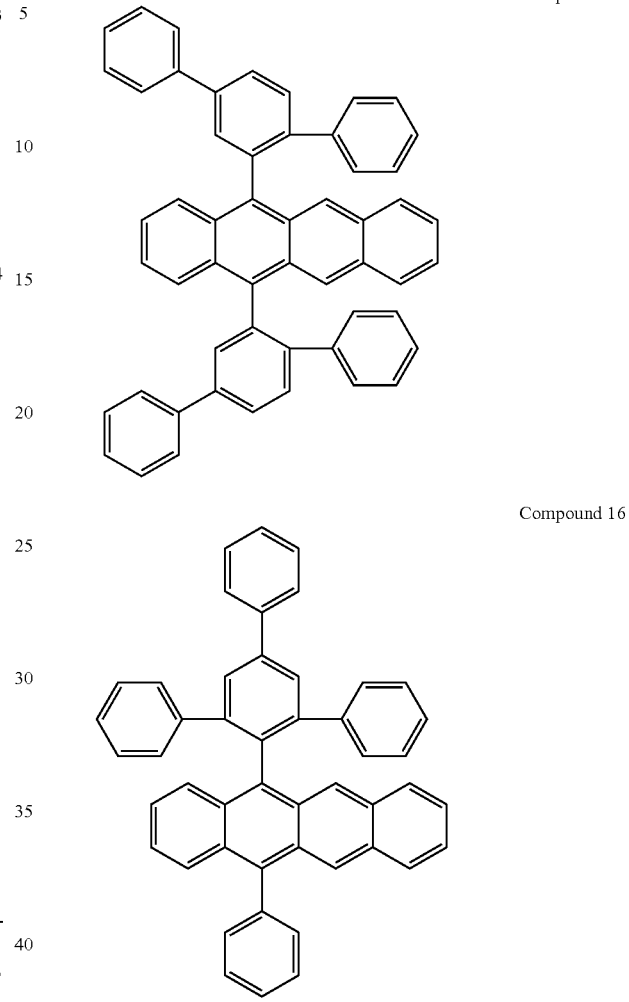

Compound 15

Compound 16

| | Compound | |
|---|---|---|
| | 15 | 16 |
| Toluene | B | C |
| Xylene | B | C |
| Cyclohexanone | A | A |
| Cycloheptanone | A | A |
| N-methylpyrolidone | A | A |

As is understood from Table 3, all the above compounds exhibited favorable solubility in cyclohexanone, cycloheptanone and NMP (N-methylpyrrolidone).

Thus, Solubility Evaluations 1 and 2 showed that both anthracene derivatives and naphthacene derivatives are favorably soluble in cyclohexanone.

Example of Ink Preparation 1

Inks prepared as examples of the organic EL material-containing solution will be described.

Specifically, an exemplary ink prepared to have a predetermined viscosity by being mixed with the viscosity control reagent will be described.

Example 1

0.5 mass % of each of the above compounds 1 to 10, 15 and 16 was dissolved with use of 1,2-butandiol as a thickener (viscosity control reagent) to prepare inks A solvent was composed of cyclohexanone and 1,2-butandiol (mass ratio: cyclohexanone/1,2-butandiol=75/25). As a result, all the compounds were dissolved and solution viscosities thereof at 22 degrees C. were of 3.4 to 3.5cP.

Comparative 1

In place of the solvent composition of cyclohexanone and 1,2-butandiol (mass ratio: cyclohexanone/1,2-butandiol=75/25), toluene and 1,2-butandiol (mass ratio: toluene/1,2-butandiol=75/25) were mixed. However, the solvents were not compatible with each other to cause phase separation.

From the above result, use of an aromatic solvent such as toluene as the thickener may cause phase separation depending on a type of an alcohol solvent. Accordingly, even when the thickener (e.g. an alcohol-based solution) is added, ink cannot be sufficiently thickened.

In view of this point, when cyclohexanone (a solution viscosity at 22 degrees C.: 2cP) is used as a main solvent, cyclohexanone is compatible with a polar solvent such as diol, thereby facilitating increase of the ink viscosity.

In other words, cyclic ketone compounds (e.g., cyclohexanone) highly compatible with viscosity control reagents (e.g., alcohol) are extremely excellent as a solvent for a low-molecular organic electroluminescent material in view of necessity of viscosity control.

Evaluation of Organic Electroluminescence Device

Example 2

A glass substrate (size: 25 mm×75 mm×1.1 mm thick) having an ITO transparent electrode (manufactured by Geomatics) was ultrasonic-cleaned in isopropyl alcohol for five minutes, and then UV (ultraviolet)/ozone-cleaned for 30 minutes.

The cleaned glass substrate having the transparent electrode was mounted on a substrate holder of a vacuum deposition instrument. A compound H1 formed a 60 nm-thick film on a surface where the transparent electrode was provided to cover the transparent electrode, thereby providing a hole injecting layer.

The following compound TBDB formed a 20 nm-thick film on the hole injecting layer. The film serves as a hole transporting layer.

A compound 4 was further vapor-deposited on the film to form a 40 nm-thick film. At the same time, an amine compound D1 having the following styryl group was vapor-deposited as an emitting molecule with a mass ratio of the compound 4 to the amine compound D1 being 40:2. The film serves as an emitting layer.

The following Alq formed a 10 nm-thick film on this film. The film serves as an electron injecting layer.

Subsequently, Li (Li source: manufactured by SAES Getters Corporation) as a reductive dopant and Alq were co-deposited to form an Alq:Li film (10 nm thick) as the electron injecting layer (cathode). Metal (Al) was vapor-deposited on the Alq:Li film to form a metal cathode, such that the organic electroluminescence device was provided.

With respect to the obtained organic electroluminescence device, luminous efficiency and time elapsed until the luminescence intensity was reduced to the half (i.e., half-life) when the device was driven by DC constant current at a room temperature with initial luminescence of 5000 cd/m² were measured.

[Chemical Formula 72]

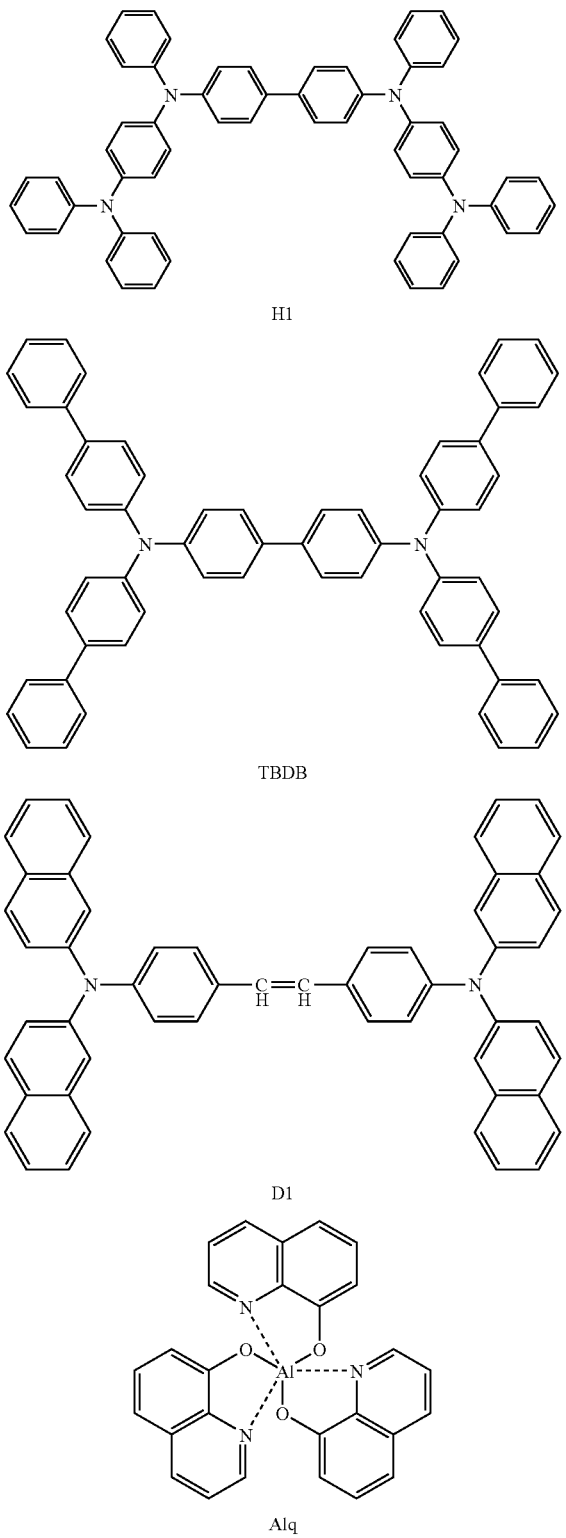

Comparative 2

An organic electroluminescence device was manufactured in the same manner as Example 2 except that the compound 1 was used in place of the compound 4.

Comparative 3

An organic electroluminescence device was manufactured in the same manner as Example 2 except that the compound 14 was used in place of the compound 4.

With respect to these Comparatives, the luminous efficiency and time elapsed until a half-life were measured in the same manner as Example 2.

The results are shown in Table 4.

TABLE 4

| | Anthracene Compound | Efficiency (cd/A) | Time elapsed until a half-life of the luminescence intensity (h) |
|---|---|---|---|
| Example 2 | Compound 4 | 6.9 | 700 |
| Comparative 1 | Compound 1 | 6.8 | 500 |
| Comparative 2 | Compound 14 | 6.2 | 300 |

As is understood from the above results in Table 4, the compound 4 was not dissolved in toluene, but was dissolved in cyclohexanone. There are some materials exhibiting a high emitting performance among such compounds which are typically undissolved in toluene and the like.

Such compounds that are typically undissolved in toluene and the like can be dissolved in cyclohexanone, thereby enabling manufacturing of a device of a high emitting performance by a coating process.

Device Manufacturing Examples

Next, manufacturing examples of the organic electroluminescence device by a film-formation by coating will be described below.

Example 3

A glass substrate (size: 25 mm×75 mm×1.1 mm thick) having an ITO transparent electrode (manufactured by Geomatics) was ultrasonic-cleaned in isopropyl alcohol for five minutes, and then UV (ultraviolet)/ozone-cleaned for 30 minutes.

Polyethylene-dioxy-thiophene/polystyrene sulphonic acid (PEDOT•PSS) to be used for the hole injecting layer was deposited on the cleaned glass substrate having the transparent electrode by the spin coating to form a 50 nm-thick film.

A toluene solution (0.6 mass %) of Polymer 1 shown below (Mw: 145000) was deposited by the spin coating to form a 20 nm-thick film, which was dried at 170 degrees C. for 30 minutes.

The emitting layer was subsequently formed in a film form by spin coating from a cyclohexanone solution containing the compound 4 and a compound BD-1 by 1 mass % with a ratio of the compound 4 to BD-1 being 20 to 1 (mass/mass). The film thickness was 50 nm at that time.

Then, a tris(8-quinolinol)aluminum film (hereinafter, abbreviated as Alq film) having a thickness of 10 nm was formed on the film. The Alq film serves as an electron transporting layer.

Lithium fluoride formed a 1 nm-thick film on the layer as an electron injecting layer. Finally, aluminum formed a 200 nm-thick film to provide a cathode.

The device emitted blue light and its light-emission surface was uniform.

The luminescence efficiency at this time was 5.6 cd/A, and time elapsed until a half-life of the luminescent intensity was 3500 hours with the initial luminescence intensity being 1000 cd/m$^2$.

[Chemical Formula 73]

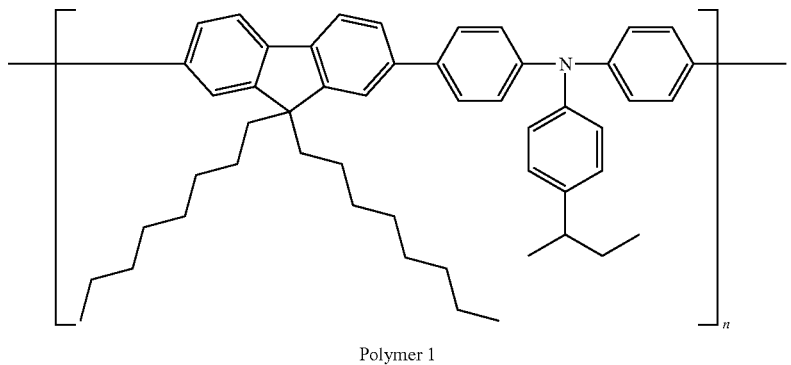

Polymer 1

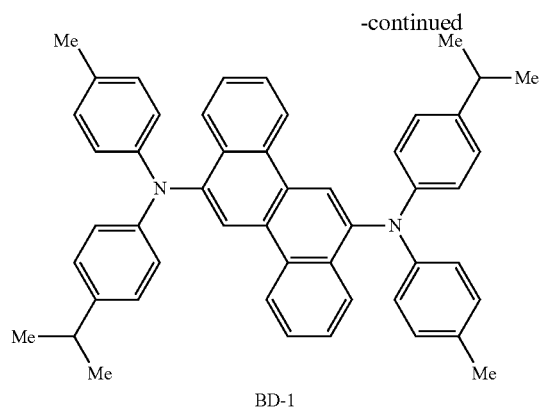

BD-1

Example of Ink Preparation 2

Example 4

Inks prepared as examples of an organic EL material-containing solution will be shown in Table 5 below Inks 1 to 24 described blow were prepared at a concentration (a total amount of a host and a dopant/a solvent amount) of 1 mass %. BD-1 (described above), RD-1, EM144, EM145, EM151, EM131, EM195 and EM196 (described below) were used as a dopant.

As a result, each ink had no undissolved residue according to visual check, and a uniform solution was provided.

TABLE 5

| | Host | Dopant | Host/Dopant (mass/mass) | Solvent |
|---|---|---|---|---|
| Ink 1 | Compound 1 | BD-1 | 20/1 | Cyclohexanone |
| Ink 2 | Compound 2 | BD-1 | 20/1 | Cyclohexanone |
| Ink 3 | Compound 7 | BD-1 | 20/1 | Cyclohexanone |
| Ink 4 | Compound 8 | BD-1 | 20/1 | Cyclohexanone |
| Ink 5 | Compound 1 | EM144 | 20/1 | Cyclohexanone |
| Ink 6 | Compound 1 | EM145 | 20/1 | Cyclohexanone |
| Ink 7 | Compound 1 | EM151 | 20/1 | Cyclohexanone |
| Ink 8 | Compound 1 | EM131 | 20/1 | Cyclohexanone |
| Ink 9 | Compound 1 | EM195 | 20/1 | Cyclohexanone |
| Ink 10 | Compound 1 | EM196 | 20/1 | Cyclohexanone |
| Ink 11 | Compound 1 | BD-1 | 20/1 | N-methyl pyrrolidone |
| Ink 12 | Compound 2 | BD-1 | 20/1 | N-methyl pyrrolidone |
| Ink 13 | Compound 7 | BD-1 | 20/1 | N-methyl pyrrolidone |
| Ink 14 | Compound 8 | BD-1 | 20/1 | N-methyl pyrrolidone |
| Ink 15 | Compound 1 | EM144 | 20/1 | N-methyl pyrrolidone |
| Ink 16 | Compound 1 | EM145 | 20/1 | N-methyl pyrrolidone |
| Ink 17 | Compound 1 | EM151 | 20/1 | N-methyl pyrrolidone |
| Ink 18 | Compound 1 | EM131 | 20/1 | N-methyl pyrrolidone |
| Ink 19 | Compound 1 | EM195 | 20/1 | N-methyl pyrrolidone |
| Ink 20 | Compound 1 | EM196 | 20/1 | N-methyl pyrrolidone |
| Ink 21 | Compound 15 | RD-1 | 100/1 | Cyclohexanone |
| Ink 22 | Compound 16 | RD-1 | 100/1 | Cyclohexanone |
| Ink 23 | Compound 15 | RD-1 | 100/1 | N-methyl pyrrolidone |
| Ink 24 | Compound 16 | RD-1 | 100/1 | N-methyl pyrrolidone |

[Chemical Formula 74]

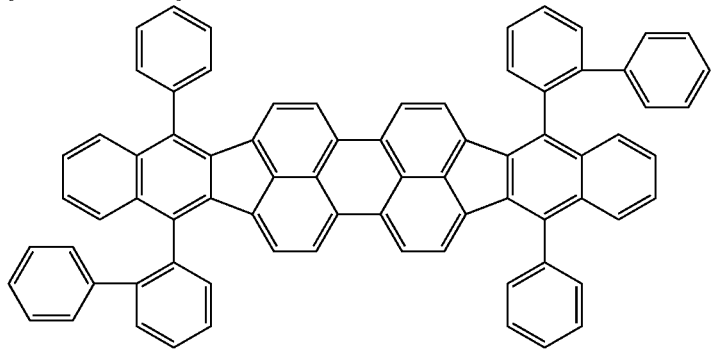

RD-1

The invention claimed is:

1. An organic electroluminescent material-containing solution, comprising:
   an organic electroluminescent material;
   a solvent, and
   a viscosity control reagent, the viscosity control reagent is selected from the group consisting of propanediol, 1,2-butanediol and a mixture thereof;
   wherein the organic electroluminescent material at least comprises a host and a dopant,
   the host is an anthracene derivative having a molecular weight of 4000 or less, the anthracene derivative being represented by a formula (2) or a formula (4) as follows,
   the dopant is a styrylamine derivative represented by any one of formulae (d-1) to (d-11) below, and
   the solvent is a cyclic ketone compound represented by a formula (1) as follows, the host of 0.5 mass % or more being soluble in the solvent,

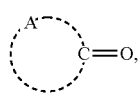
(1)

wherein A represents a substituted or unsubstituted cyclic hydrocarbon group having 5 to 10 members or a substituted or unsubstituted group for forming a nitrogen-containing heterocycle having 5 to 10 members,
wherein formula (2) is

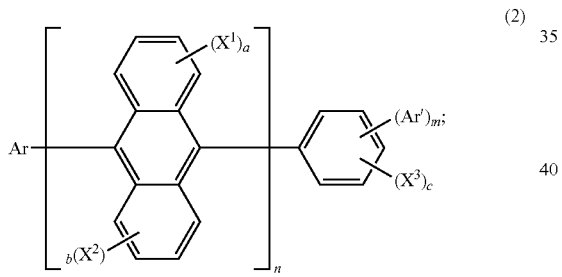
(2)

wherein Ar represents an unsubstituted fused aromatic group having 10 to 50 carbon atoms forming the aromatic ring;
Ar' represents an unsubstituted aromatic group having 6 to 50 carbon atoms forming the aromatic ring;
$X^3$ represents an unsubstituted aromatic group having 6 to 50 carbon atoms forming the aromatic ring, unsubstituted aromatic heterocyclic group having 5 to 50 carbon atoms forming the aromatic ring, an unsubstituted alkyl group having 1 to 50 carbon atoms, an unsubstituted alkoxy group having 1 to 50 carbon atoms, an unsubstituted aralkyl group having 6 to 50 carbon atoms, an unsubstituted aryloxy group having 5 to 50 carbon atoms, an unsubstituted arylthio group having 5 to 50 carbon atoms, an unsubstituted alkoxycarbonyl group having 1 to 50 carbon atoms, a carboxyl group, a halogen group, a cyano group, a nitro group or a hydroxyl group;
a and b are 0 and c is an integer of 0 to 4, a plurality of $X^3$ being allowed to be mutually the same or different when c is 2 or more;
n is an integer from 1 to 3; and
m is 0 or 1, wherein formula (4) is

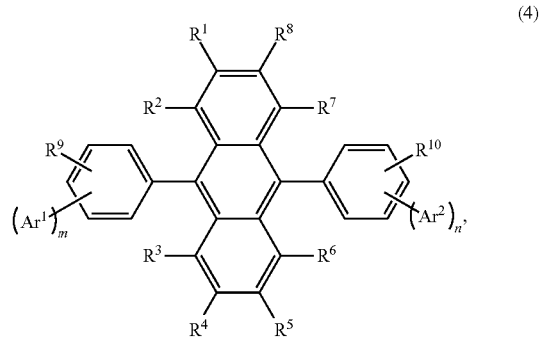
(4)

wherein $Ar^1$ and $Ar^2$ each independently represent an unsubstituted aromatic ring group having 6 to 50 carbon atoms forming the aromatic ring; m and n are each integers of 1 to 4, $Ar^1$ and $Ar^2$ are mutually different when: m and n are both equal to 1; and positions at which $Ar^1$ and $Ar^2$ are respectively bonded to benzene rings are symmetric, m and n being mutually different when m or n is an integer of 2 to 4;

$R^1$ to $R^8$ represent a hydrogen atom, and $R^9$ and $R^{10}$ each independently represent a hydrogen atom, an unsubstituted aromatic group having 6 to 50 carbon atoms forming the aromatic ring, an unsubstituted aromatic heterocyclic group having 5 to 50 carbon atoms forming the aromatic ring, an unsubstituted alkyl group having 1 to 50 carbon atoms, an unsubstituted cycloalkyl group, an unsubstituted alkoxy group having 1 to 50 carbon atoms, an unsubstituted aralkyl group having 6 to 50 carbon atoms, an unsubstituted aryloxy group having 5 to 50 atoms forming the ring, an unsubstituted arylthio group having 5 to 50 atoms forming the ring, an unsubstituted alkoxycarbonyl group having 1 to 50 carbon atoms, an unsubstituted silyl group, a carboxyl group, a halogen group, a cyano group, a nitro group or a hydroxyl group; and wherein formulae (d-1) to (d-11) are

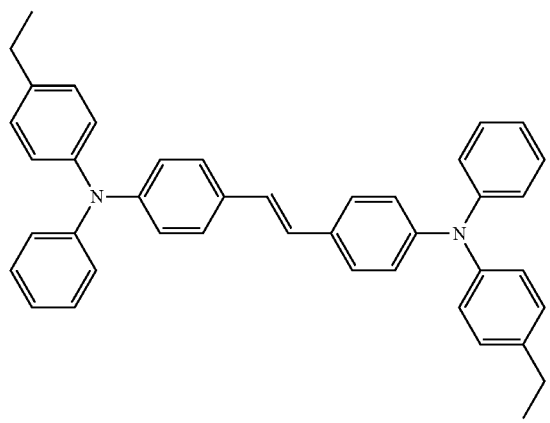
(d-1)

-continued
(d-2)
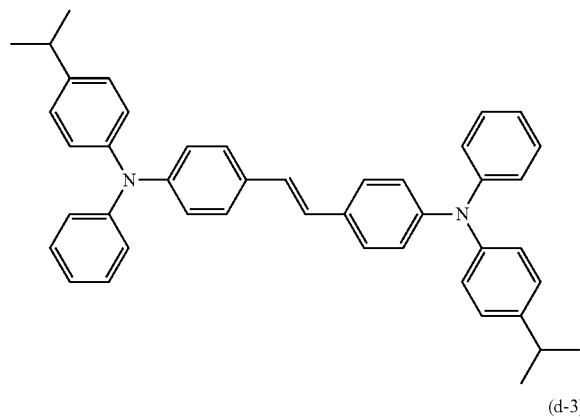
(d-3)
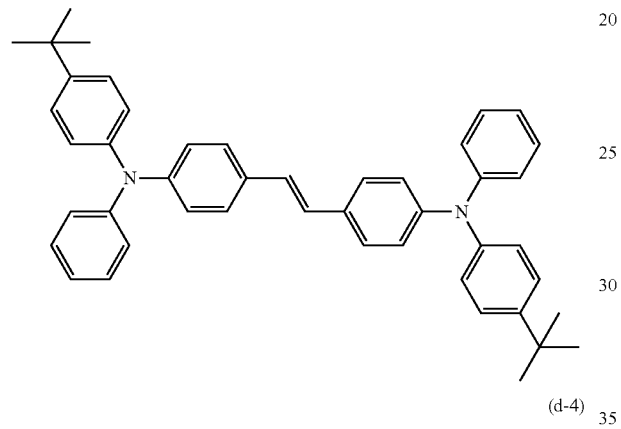
(d-4)
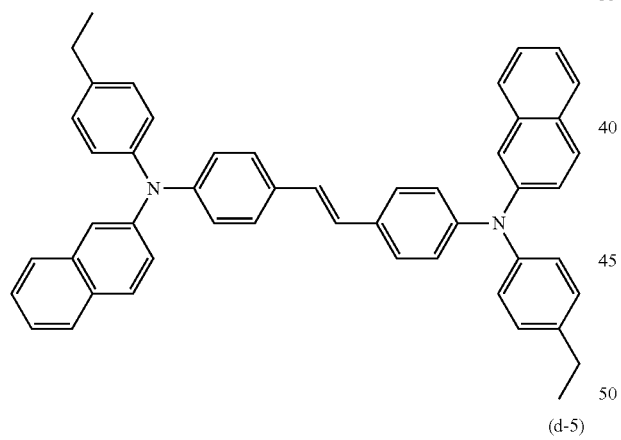
(d-5)
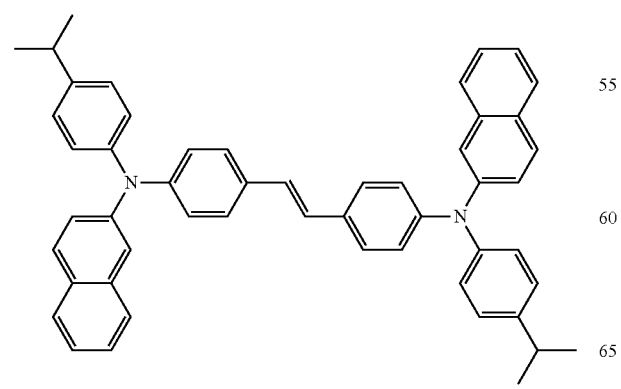
-continued
(d-6)
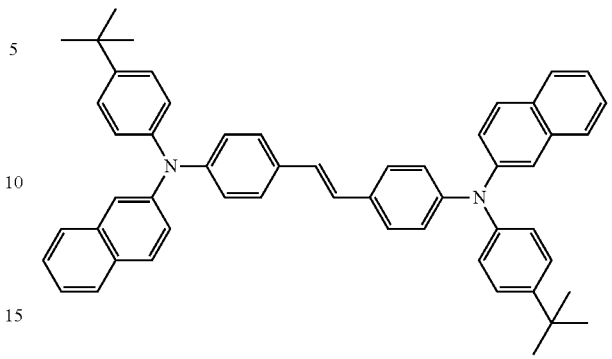
(d-7)
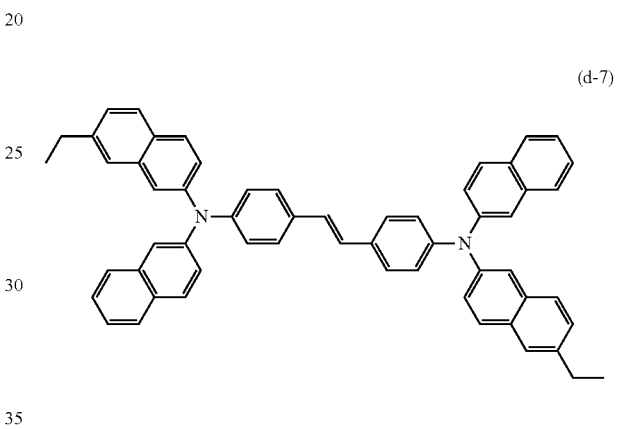
(d-8)
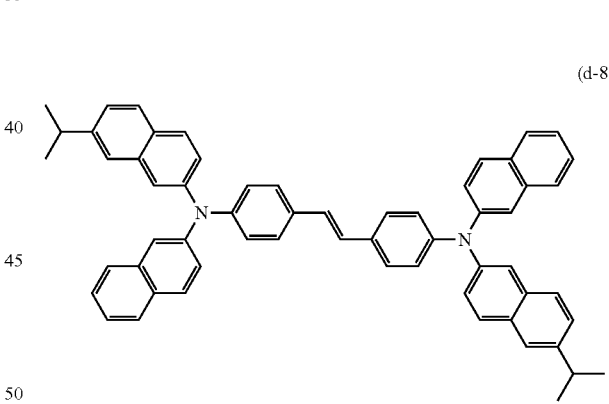
(d-9)
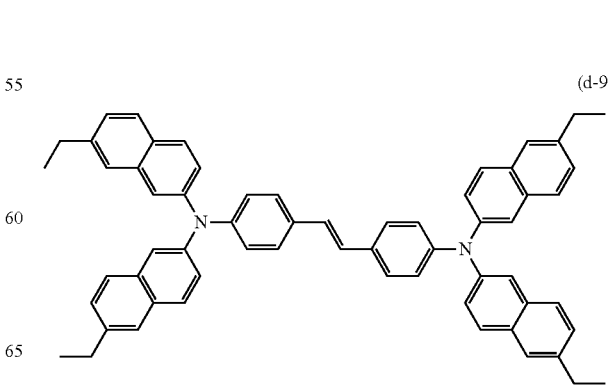

-continued (d-10)

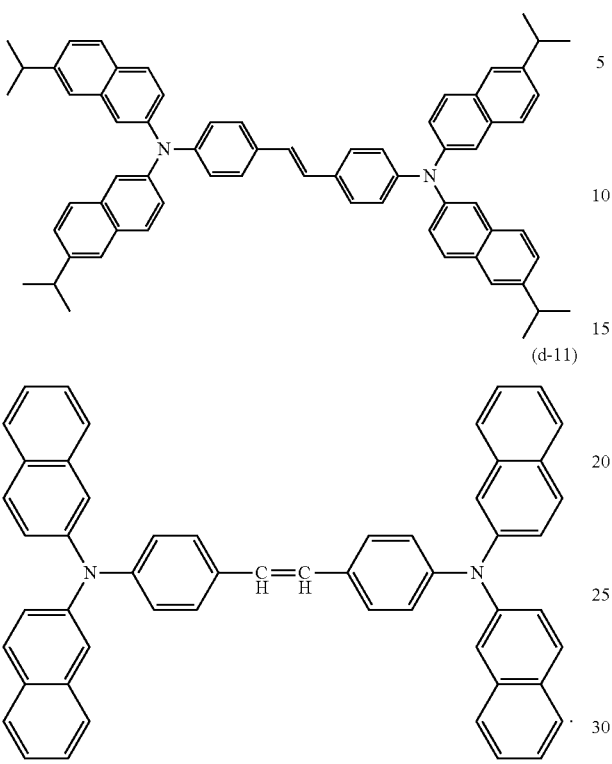

(d-11)

2. A method of forming organic electroluminescent thin film(s), comprising: using the organic electroluminescent material-containing solution according to claim 1; and forming thin film(s) of the organic electroluminescent material.

3. The method of forming organic electroluminescent thin film(s) according to claim 2, further comprising:
ejecting the organic electroluminescent material-containing solution by inkjet method; and
forming film(s) of the organic electroluminescent material by volatilizing the solvent from the ejected organic electroluminescent material-containing solution.

4. A method of manufacturing an organic electroluminescence display panel provided with a first pixel emitting light of a first color and a second pixel emitting light of a second color that is different from the first color, comprising:
preparing an organic electroluminescent material-containing solution for use as a first solution for forming an emitting layer of the first pixel; and
preparing an organic electroluminescent material-containing solution for use as a second solution for forming an emitting layer of the second pixel, wherein
the organic electroluminescent material-containing solution prepared as the first solution comprises the organic electroluminescent material-containing solution according to claim 1,
the organic electroluminescent material-containing solution prepared as the second solution comprises an organic electroluminescent material-containing solution, comprising:
an organic electroluminescent material;
a solvent, and
a viscosity control reagent, the viscosity control reagent is selected from the group consisting of propanediol, 1,2-butanediol and a mixture thereof;

wherein the organic electroluminescent material at least comprises a host and a dopant,
the host is a naphthacene derivative represented by a formula (5) as follows,

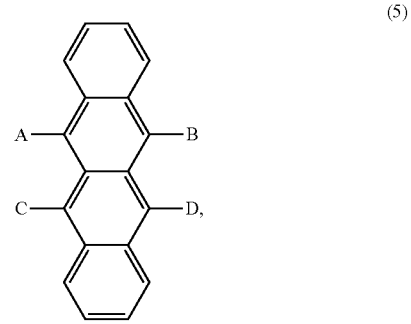

(5)

wherein A, B, C and D each represent a substituted or unsubstituted aromatic group having 6 to 20 carbon atoms or a substituted or unsubstituted fused aromatic group having 10 to 20 carbon atoms, A, B, C and D being allowed to be mutually the same or different,
the dopant is a styrylamine derivative represented by any one of formulae (d-1) to (d-11) below,
the solvent of the first solution and the solvent of the second solution are the same, and
wherein the formulae (d-1) to (d-11) are

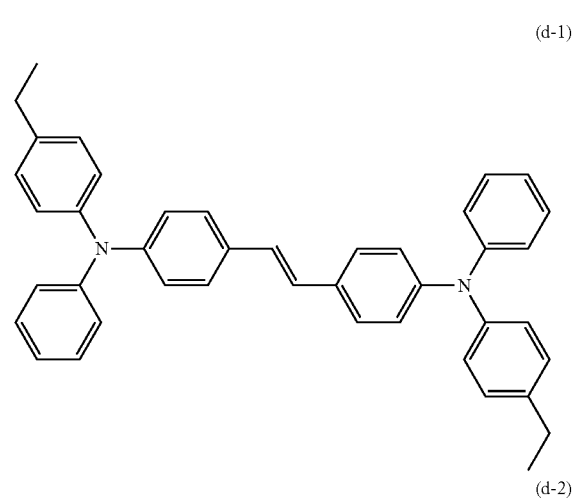

(d-1)

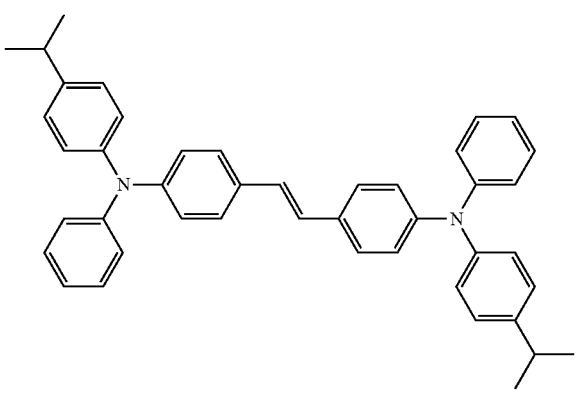

(d-2)

(d-3)
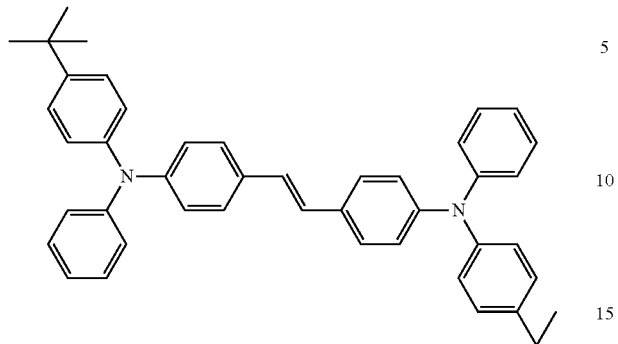
(d-4)
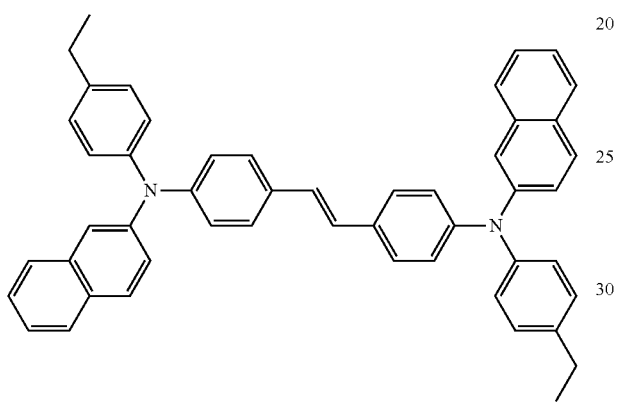
(d-5)
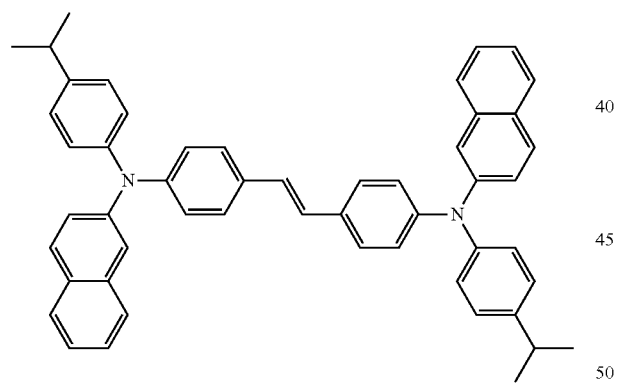
(d-6)
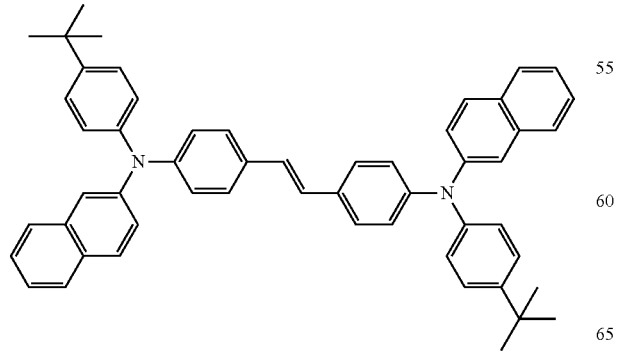
(d-7)
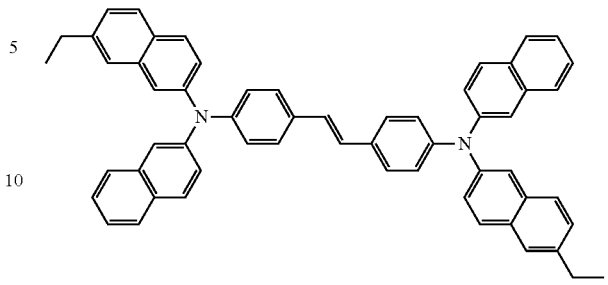
(d-8)
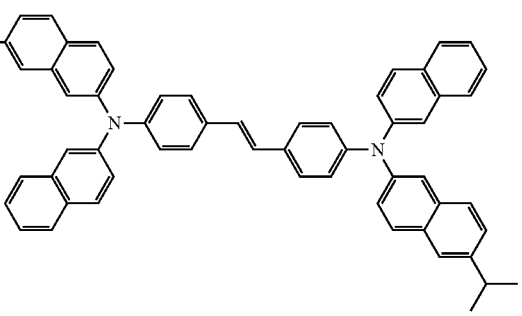
(d-9)
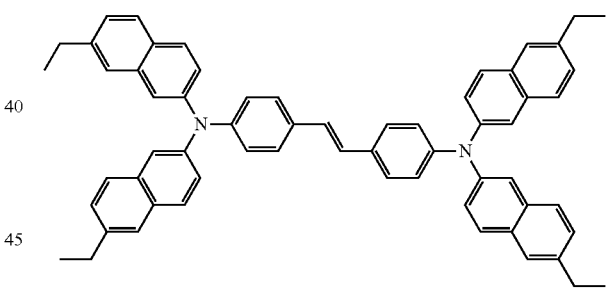
(d-10)
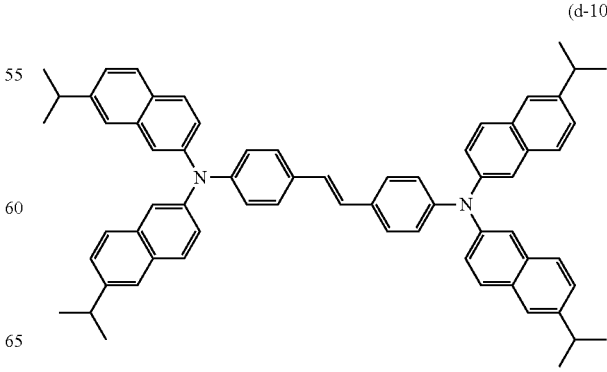

-continued (d-11)

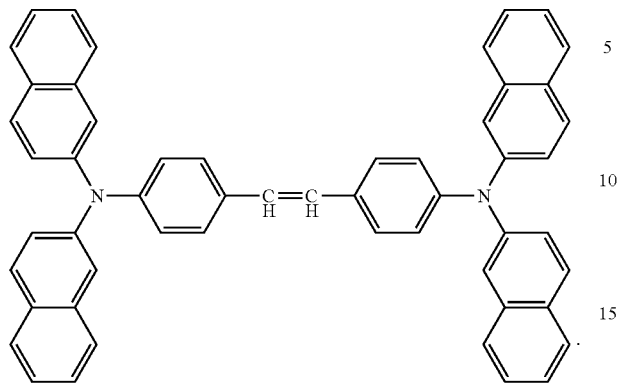

5. An organic electroluminescent material-containing solution, comprising:
an organic electroluminescent material;
a solvent, and
a viscosity control reagent, the viscosity control reagent is selected from the group consisting of propanediol, 1,2-butanediol and a mixture thereof;
wherein the organic electroluminescent material at least comprises a host and a dopant,
the host is an anthracene derivative having a molecular weight of 4000 or less, the anthracene derivative being represented by a formula (2) or a formula (4) as follows,
the dopant is an arylamine represented by a formula (8) as follows,

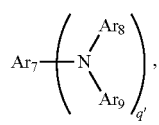
(8)

wherein $Ar_7$ to $Ar_9$ each represent a substituted or unsubstituted aryl group having 5 to 40 carbon atoms forming the aromatic ring; and
q' is an integer of 1 to 4, and
the solvent is a cyclic ketone compound represented by a formula (1) as follows, the host of 0.5 mass % or more being soluble in the solvent,

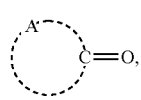
(1)

wherein A represents a substituted or unsubstituted cyclic hydrocarbon group having 5 to 10 members or a substituted or unsubstituted group for forming a nitrogen-containing heterocycle having 5 to 10 members, wherein formula (2) is

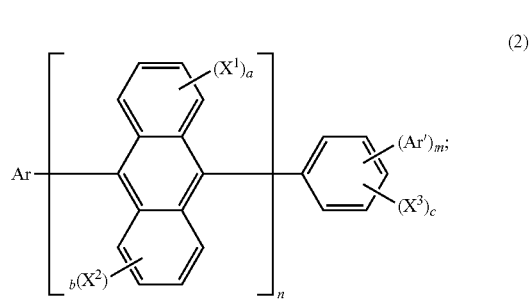
(2)

wherein Ar represents an unsubstituted fused aromatic group having 10 to 50 carbon atoms forming the aromatic ring;
Ar' represents an unsubstituted aromatic group having 6 to 50 carbon atoms forming the aromatic ring;
$X^3$ represents an unsubstituted aromatic group having 6 to 50 carbon atoms forming the aromatic ring, unsubstituted aromatic heterocyclic group having 5 to 50 carbon atoms forming the aromatic ring, an unsubstituted alkyl group having 1 to 50 carbon atoms, an unsubstituted alkoxy group having 1 to 50 carbon atoms, an unsubstituted aralkyl group having 6 to 50 carbon atoms, an unsubstituted aryloxy group having 5 to 50 carbon atoms, an unsubstituted arylthio group having 5 to 50 carbon atoms, an unsubstituted alkoxycarbonyl group having 1 to 50 carbon atoms, a carboxyl group, a halogen group, a cyano group, a nitro group or a hydroxyl group;
a and b are 0 and c is an integer of 0 to 4, a plurality of $X^3$ being allowed to be mutually the same or different when c is 2 or more;
n is an integer from 1 to 3; and
m is 0 or 1,
wherein formula (4) is

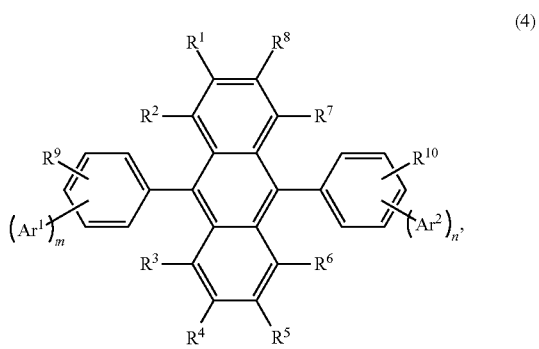
(4)

wherein $Ar^1$ and $Ar^2$ each independently represent an unsubstituted aromatic ring group having 6 to 50 carbon atoms forming the aromatic ring; m and n are each integers of 1 to 4, $Ar^1$ and $Ar^2$ are mutually different when: m and n are both equal to 1; and positions at which $Ar^1$ and $Ar^2$ are respectively bonded to benzene rings are symmetric, m and n being mutually different when m or n is an integer of 2 to 4;
$R^1$ to $R^8$ represent a hydrogen atom, and
$R^9$ and $R^{10}$ each independently represent a hydrogen atom, an unsubstituted aromatic group having 6 to 50 carbon atoms forming the aromatic ring, an unsubstituted aromatic heterocyclic group having 5 to 50 carbon atoms forming the aromatic ring, an unsubstituted alkyl group having 1 to 50 carbon atoms, an unsubstituted cycloalkyl group, an unsubstituted alkoxy group having 1 to 50 carbon atoms, an unsubstituted aralkyl group having 6 to 50 carbon atoms, an unsubstituted aryloxy group having 5 to 50 atoms forming the ring, an unsubstituted arylthio group having 5 to 50 atoms forming the ring, an unsubstituted alkoxycarbonyl group having 1 to 50 carbon atoms, an unsubstituted silyl group, a carboxyl group, a halogen group, a cyano group, a nitro group or a hydroxyl group.

6. The organic electroluminescent material-containing solution of claim 1, wherein the anthracene derivative is represented by formula (2).

7. The organic electroluminescent material-containing solution of claim 1, wherein the anthracene derivative is represented by formula (4).

8. The organic electroluminescent material-containing solution of claim 1, wherein the cyclic ketone compound represented by a formula (1) is a substituted or unsubstituted cyclic hydrocarbon group having 5 to 10 members selected from the group consisting of cyclohexanone, methyl cyclohexanone, dimethyl cyclohexanone, trimethyl cyclohexanone, ethyl cyclohexanone, n-propyl cyclohexanone, isopropyl cyclohexanone, n-butyl cyclohexanone, isobutyl cyclohexanone, cyclohexyl cyclohexanone, 2-acetyl cyclohexanone, 2-methyl cyclohexanone, 3-methyl cyclohexanone, 4-methyl cyclohexanone, 2-cyclohexyl cyclohexanone, 2-(1-cyclohexenyl)cyclohexanone, 2,5-dimethyl cyclohexanone, 3,4-dimethyl cyclohexanone, 3,5-dimethyl cyclohexanone, 4-ethyl cyclohexanone, pulegone, menthone, 4-pentyl cyclohexanone, 2-propyl cyclohexanone, 3,3,5-trimethyl cyclohexanone, and thujone.

9. The organic electroluminescent material-containing solution of claim 1, wherein the cyclic ketone compound represented by a formula (1) is a substituted or unsubstituted cyclic hydrocarbon group having 5 to 10 members selected from the group consisting of cyclopentanone, methyl cyclopentanone, dimethyl cyclopentanone, trimethyl cyclopentanone, ethyl cyclopentanone, n-propyl cyclopentanone, isopropyl cyclopentanone, n-butyl cyclopentanone, isobutyl cyclopentanone, and cyclohexyl cyclopentanone.

10. The organic electroluminescent material-containing solution of claim 1, wherein the cyclic ketone compound represented by a formula (1) is a substituted or unsubstituted cyclic hydrocarbon group having 5 to 10 members selected from the group consisting of cycloheptanone, methyl cycloheptanone, dimethyl cycloheptanone, trimethyl cycloheptanone, ethyl cycloheptanone, n-propyl cycloheptanone, isopropyl cycloheptanone, n-butyl cycloheptanone, isobutyl cycloheptanone, and cyclohexyl cycloheptanone.

11. The organic electroluminescent material-containing solution of claim 1, wherein the cyclic ketone compound represented by a formula (1) is a nitrogen-containing heterocycle having 5 to 10 members selected from the group consisting of caprolactam, N-methyl caprolactam, 1,3-dimethyl-2-imidazolidine, 2-pyrrolidone, 1-acetyl-2-pyrrolidone, 1-butyl-2-pyrrolidone, 2-piperidone, and 1,5-dimethyl-2-piperidone.

12. The organic electroluminescent material-containing solution of claim 1, wherein the cyclic ketone compound represented by a formula (1) is N-methyl pyrrolidone.

* * * * *